(12) United States Patent
Shibayama et al.

(10) Patent No.: US 9,477,405 B2
(45) Date of Patent: Oct. 25, 2016

(54) STORAGE SYSTEM

(71) Applicant: HITACHI, LTD., Chiyoda-ku, Tokyo (JP)

(72) Inventors: Tsukasa Shibayama, Kawasaki (JP); Akifumi Suzuki, Yokohama (JP); Nobuhiro Maki, Yokohama (JP); Junji Ogawa, Sagamihara (JP); Masayasu Asano, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/615,109

(22) Filed: Feb. 5, 2015

(65) Prior Publication Data

US 2015/0153957 A1    Jun. 4, 2015

Related U.S. Application Data

(63) Continuation of application No. 13/519,462, filed as application No. PCT/JP2011/079717 on Dec. 21, 2011, now Pat. No. 8,984,211.

(51) Int. Cl.
| | |
|---|---|
| *G06F 12/02* | (2006.01) |
| *G06F 3/06* | (2006.01) |
| *G11C 11/56* | (2006.01) |
| *G11C 29/00* | (2006.01) |

(52) U.S. Cl.
CPC ........... *G06F 3/0604* (2013.01); *G06F 3/0625* (2013.01); *G06F 3/0644* (2013.01); *G06F 3/0688* (2013.01); *G06F 3/0689* (2013.01); *G06F 12/0246* (2013.01); *G11C 11/5621* (2013.01); *G11C 29/82* (2013.01); *G06F 2212/7207* (2013.01)

(58) Field of Classification Search
CPC ............ G06F 12/0246; G06F 3/0688; G06F 3/0604; G06F 2212/7207; G06F 3/0689; G06F 3/0644
USPC ............................................. 711/103, 185.33
See application file for complete search history.

(56) References Cited

U.S. PATENT DOCUMENTS

| | | | |
|---|---|---|---|
| 7,768,828 B2 | 8/2010 | Lee | |
| 8,275,933 B2 * | 9/2012 | Flynn | ................... G06F 12/0246 711/103 |
| 2008/0077728 A1 | 3/2008 | Kim et al. | |
| 2008/0250220 A1 | 10/2008 | Ito | |
| 2008/0285370 A1 | 11/2008 | Okuyama | |
| 2010/0325345 A1 | 12/2010 | Ohno et al. | |

FOREIGN PATENT DOCUMENTS

| | | |
|---|---|---|
| JP | 2001-006374 A | 1/2001 |
| JP | 2008-9919 A | 1/2008 |
| JP | 2008-84316 A | 4/2008 |
| JP | 2008-210031 A | 9/2008 |
| JP | 2008-276733 A | 11/2008 |
| JP | 2009-289014 A | 12/2009 |

* cited by examiner

*Primary Examiner* — Jasmine Song
(74) *Attorney, Agent, or Firm* — Mattingly & Malur, PC

(57) ABSTRACT

A storage system, which comprises multiple memory cells and a storage controller, wherein the storage controller manages cell mode information, which either directly or indirectly denotes the number of bits to be stored in multiple memory cells. The cell mode information can be changed in accordance with a request from a management system.

16 Claims, 66 Drawing Sheets

4060

| PG -ID | Blockage information | RAID level | Number of SDEVs | Participating SDEV-ID |
|---|---|---|---|---|
| 1 | Normal | 1 | 2 | 1, 2 |
| 2 | Normal | 1 | 2 | 3, 4 |
| 3 | Normal | 0 | 1 | 6 |
| 4 | Blocked | 5 | 4 | .. |
| .. | .. |  | .. | .. |

| Pool-ID | SEG-ID | Allocated | I-LU-ID | MSB flag | Start-End addresses |
|---|---|---|---|---|---|
| 1 | 0 | Yes | 1 | No | 000000000-1FFFFFFFF |
| 1 | 1 | Yes | 1 | No | 200000000-3FFFFFFFF |
| 1 | 2 | Yes | 1 | Yes | 200000000-3FFFFFFFF |
| 1 | 3 | No | 2 | No | 000000000-1FFFFFFFF |
| ... | ... | Yes | ... | .... | .... |
| 2 | 0 | Yes | 3 | No | 000000000-1FFFFFFFF |
| 2 | 1 | No | ... | .... | .. |

| Virtual internal LU-ID | Capacity | Chunk-ID | Pool-ID | SEG-ID | MSB flag | Access history |
|---|---|---|---|---|---|---|
| 100 | 500GB | 0 | 1 | 1 | No | Rd=1234 Wr=0012 |
| 100 | 500GB | 1 | 1 | 2 | Yes | Rd=123 Wr=001 |
| 100 | 500GB | 2 | 1 | null | No | Rd=0 Wr=0 |
| 101 | 400GB | 0 | 2 | 3 | No | ... |
| 101 | 400GB | 1 | 2 | 4 | No | ... |
| ... | ... | ... | ... | ... | | ... |

| Pool-ID | SEG-ID | Number of cell rewrites | Cell mode value |
|---|---|---|---|
| 1 | 0 | - | HDD |
| 1 | 1 | 1000 | LSB only |
| 1 | 2 | 300 | LSB/MSB |
| ... | ... | 500 | LSB/MSB |
| 2 | 0 | - | HDD |
| 2 | 1 | - | HDD |

| WWN (I/O-Port) | LUN | Internal LU-ID |
|---|---|---|
| zz | 0 | 1 |
| zz | 1 | 2 |
| yy | 0 | 3 |
| yy | 1 | 4 |
| .. |  | .. |

| Storage-ID | Pool-ID | SEG-ID | Allocat-ed | I-LU-ID | MSB flag | Start-End addresses |
|---|---|---|---|---|---|---|
| STG-1 | 1 | 0 | Yes | 1 | No | 000000000-1FFFFFFFF |
| STG-1 | 1 | 1 | Yes | 1 | No | 200000000-3FFFFFFFF |
| STG-1 | 1 | 2 | No | 1 | Yes | 200000000-3FFFFFFFF |
| STG-1 | 1 | 3 | No | 2 | No | 000000000-1FFFFFFFF |
| STG-1 | ... | ... | Yes | ... | .... | .... |
| STG-1 | 2 | 0 | Yes | 3 | No | 000000000-1FFFFFFFF |
| STG-1 | 2 | 1 | No | ... | .... | .. |

| Storage-ID | Virtual internal LU-ID | Capacity | Chunk-ID | Pool-ID | SEG-ID | MSB flag | Access history |
|---|---|---|---|---|---|---|---|
| STG-1 | 100 | 500GB | 0 | 1 | 1 | No | Rd=1234 Wr=0012 |
| STG-1 | 100 | 500GB | 1 | 1 | 2 | Yes | Rd=123 Wr=001 |
| STG-1 | 100 | 500GB | 2 | 1 | null | No | Rd=0 Wr=0 |
| STG-1 | 101 | 400GB | 0 | 2 | 3 | No | |
| STG-1 | 101 | 400GB | 1 | 2 | 4 | No | ... |
| STG-1 | ... | 400GB | ... | ... | ... | | ... |

| Storage-ID | Pool-ID | SEG-ID | Number of cell rewrites | Cell mode value |
|---|---|---|---|---|
| STG-1 | 1 | 0 | - | HDD |
| STG-1 | 1 | 1 | 1000 | LSB only |
| STG-1 | 1 | 2 | 300 | LSB/MSB |
| STG-1 | ... | ... | 500 | LSB/MSB |
| STG-1 | 2 | 0 | - | HDD |
| STG-1 | 2 | 1 | - | HDD |

| Storage-ID | SDEV-ID | Blockage information | WWN | Model number | Provided capacity value |
|---|---|---|---|---|---|
| STG1 | 1 | Normal | AA.. | FMD | 200GB |
| STG1 | 2 | Normal | BB.. | FMD | 200GB |
| STG1 | 3 | Normal | CC.. | HDD | 200GB |
| STG1 | 4 | Normal | DD.. | HDD | 200GB |
| STG1 | 5 | Normal | EE.. | HDD | 200GB |
| STG1 | 6 | Normal | FF.. | FMD | 1000GB |
| STG2 | ... | | .. | .. | .. |

| Storage-ID | PG-ID | Blockage information | RAID level | Number of SDEVs | Participating SDEV-ID |
|---|---|---|---|---|---|
| STG1 | 1 | Normal | 1 | 2 | 1, 2 |
| STG1 | 2 | Normal | 1 | 2 | 3, 4 |
| STG1 | 3 | Normal | 0 | 1 | 6 |
| STG1 | 4 | Blocked | 5 | 4 | .. |
| STG2 | .. | .. |  | .. | .. |

| Storage-ID | Internal LU-ID | Blockage information | PG-ID | Start address | End address |
|---|---|---|---|---|---|
| STG1 | 1 | Normal | 1 | 0 | 19999999999 |
| STG1 | 2 | Normal | 2 | 0 | 9999999999 |
| STG1 | 3 | Normal | 2 | 10000000000 | 39999999999 |
| STG1 | 4 | Normal | 3 | 0 | 199999999999 |
| STG1 | 5 | Blocked | 4 | 0 | 19999999999 |
| STG2 | .. |  | .. | .. | .. |

| Storage-ID | WWN (I/O-Port) | LUN | Internal LU-ID |
|---|---|---|---|
| STG1 | zz | 0 | 1 |
| STG1 | zz | 1 | 2 |
| STG1 | yy | 0 | 3 |
| STG1 | yy | 1 | 4 |
| STG2 | .. | | .. |

| Storage-ID | Internal LU-ID/Virtual LU-ID | Host identifier | Application information | Performance requirement (IOPS) |
|---|---|---|---|---|
| STG1 | 1 | Host1 | AP1 | 1500 |
| STG1 | 2 | Host2 | AP2 | 500 |
| STG3 | ... | ... | ... | ... |
| ... | ... | ... | ... | ... |

| Storage-ID | Virtual internal LU-ID | Tier (or SDEV) | Time | New segment allocation amount | IOPS |
|---|---|---|---|---|---|
| STG1 | 1 | LSB Only | 10:00-11:00 | 20GB | 1300 |
| STG1 | 1 | LSB Only | 11:00-12:00 | 20GB | 1500 |
| STG1 | 1 | LSB Only | ... | ... | ... |
| STG1 | 1 | LSB/MSB | 10:00-11:00 | 3GB | 1300 |
| STG1 | 1 | LSB/MSB | 11:00-12:00 | 2GB | 1500 |
| STG1 | 1 | LSB/MSB | ... | ... | ... |
| STG1 | 2 | ... | ... | ... | 2000 |
| STG1 | 2 | ... | ... | ... | 2000 |

| Storage-ID | POOL-ID | TIER ID | TIER RANGE | SEG-ID | SDEV (or cell mode) |
|---|---|---|---|---|---|
| STG1 | 00 | 00 | 1000-5000 | 00 | SSD(LSB Only) |
| STG1 | 00 | 00 | 1000-5000 | 02 | SSD(LSB Only) |
| STG1 | 00 | 00 | 1000-5000 | ... | |
| STG1 | 00 | 01 | 500-999 | 04 | FC(LSB/MSB) |
| STG1 | 00 | 01 | 500-999 | ... | |
| STG1 | 00 | 02 | 0-499 | 10 | SATA(HDD) |
| STG1 | 00 | 02 | 0-499 | ... | ... |
| ... | ... | ... | ... | ... | ... |

| User | Usable capacity |
|------|-----------------|
| user1 | 10TB |
| user2 | - |
| user3 | 5TB |
| ... | ... |

Fig. 54

STORAGE SYSTEM

This application is a continuation of U.S. patent application Ser. No. 13/519,462, filed Jun. 27, 2012, which is a 371 of international application No. PCT/JP2011/079717, filed Dec. 21, 2011. The entire disclosures of these applications are incorporated herein by reference.

TECHNICAL FIELD

The present invention relates to a computer system which comprises a storage system comprising nonvolatile memory, and a management system for managing a storage system.

BACKGROUND ART

Flash memory is in the process of becoming a leading storage device due to the declining bit-cost of flash memory in recent years. The technology described in Patent Literature 1 discloses an alternative HDD (hard disk drive) device using flash memory, being one of a nonvolatile memory.

More specifically, the alternative device of Patent Literature 1 comprises a two-value flash memory, which comprises a memory cell capable of storing two bits in one memory cell, and a volatile memory. The volatile memory functions as a cache memory for the two-value flash memory. At power shutdown, the alternative device saves the storage contents of the volatile memory to the multilevel flash memory. By writing only one bit of data to one memory cell at this time, the alternative device reduces the amount of power consumed during the write.

CITATION LIST

Patent Literature

[PTL 1]
Japanese Patent Application Laid-open No. 2009-289014

SUMMARY OF INVENTION

Technical Problem

Although the alternative device of Patent Literature 1 is coupled to a storage system as an alternative to HDD, this alternative device cannot provide a flexible storage system, because there is no function to flexibly change the number of bits stored in a memory cell subsequent to storage system installation. Or, this alternative device is also unable to manage such a flexible storage system.

Solution to Problem

A storage system comprises multiple memory cells and a storage controller, and the storage controller manages cell mode information, which either directly or indirectly denotes the number of bits to be stored in multiple memory cells. The cell mode information can be changed in response to a request from a management system.

BRIEF DESCRIPTION OF DRAWINGS

FIG. 6 is a diagram showing an example of PG configuration information related to the first example.

FIG. 10 is a diagram showing an example of pool information related to the first example.

FIG. 11 is a diagram showing an example of VL conversion information related to the first example.

FIG. 12 is a diagram showing an example of cell mode information related to the first example.

FIG. 13 is a diagram showing an example of LU path information related to the first example.

FIG. 21 is a diagram showing an example of management side pool information related to the first example.

FIG. 22 is a diagram showing an example of management side VL conversion information related to the first example.

FIG. 23 is a diagram showing an example of management side cell mode information related to the first example.

FIG. 25 is a diagram showing an example of management side SDEV information related to the first example.

FIG. 26 is a diagram showing an example of management side PG configuration information related to the first example.

FIG. 27 is a diagram showing an example of management side internal LU configuration information related to the first example.

FIG. 28 is a diagram showing an example of management side LU path information related to the first example.

FIG. 51 is a diagram showing an example of AP performance condition information related to the first example.

FIG. 52 is a diagram showing an example of segment allocation trend information related to the first example.

FIG. 53 is a diagram showing an example of tier management information related to the first example.

FIG. 54 is a diagram showing an example of billing information related to the third example.

DESCRIPTION OF THE EMBODIMENTS

Figure 1:
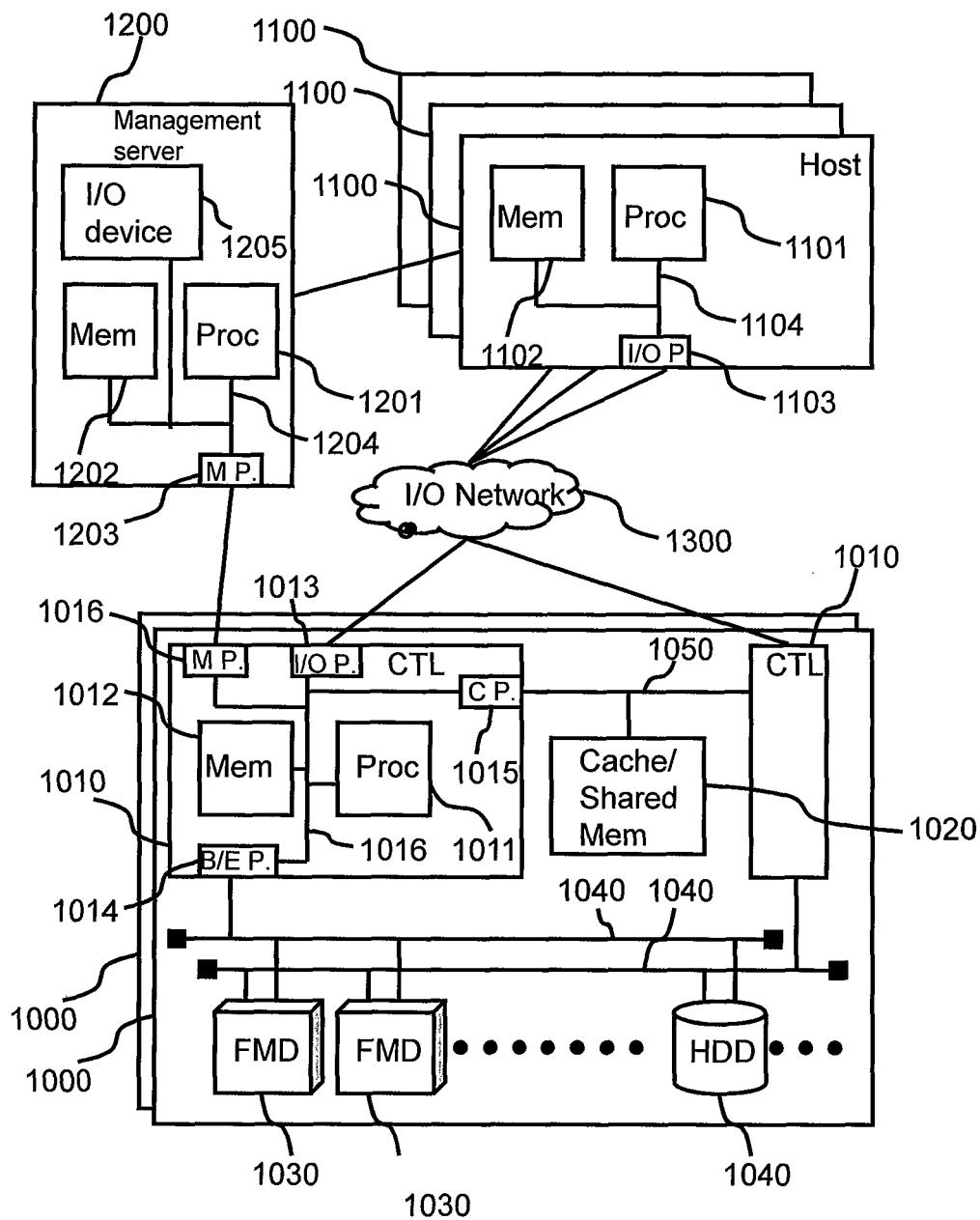
FIG. 1 is a diagram showing an example of the configuration of a computer system related to a first example.

A number of examples will be explained by referring to the drawings. The examples explained below do not limit the invention of the claims, and not all of the elements and combinations thereof explained using the examples are essential to the solution of the invention.

Furthermore, in the following explanation, information is explained using expressions such as "aaa table", "aaa list", "aaa DB", and "aaa queue", but the information may be expressed using a data structure other than a table, a list, a DB or a queue. Therefore, to show that the information is not dependent on the data structure, "aaa table", "aaa list", "aaa DB", and "aaa queue" may be called "aaa information". In addition, when explaining the content of each piece of information, the expressions "identification information", "identifier", "name", and "ID" are used, but these expressions are interchangeable. Also, the expression "information" is used to show data content, but another form of expression may be used.

Also, in the following explanation, there may be cases where an explanation is given using a "program" as the subject of the action, but since the stipulated processing is performed in accordance with a program being executed by a processor while using a memory and a communication port (an I/O port or the like), the explanation may also be given using the processor or a control device comprising a processor as the subject of the action. Processing disclosed as having a program or a control device as the subject of the action may be regarded as processing performed by a computer, such as a management server or a storage system, or an information processing apparatus. The control device may comprise dedicated hardware, which carries out either all or part of the processing either instead of or in addition to the processor. Various types of programs may be installed in a computer from either a program delivery server or a storage medium.

The "nonvolatile" of nonvolatile memory does not refer to storage content being held under all circumstances or to the ability to hold storage content permanently as is normally meant by the term, but rather signifies that storage content can be held for a reasonable period (for example, from one year to several years) even in a case where power is not being supplied. In the examples, flash memory will be given as an example of nonvolatile memory, but the nonvolatile memory may be another type of memory (for example, PRAM (Phase change Random Access Memory), MRAM (Magnetoresistive Random Access Memory) or the like), which comprise memory cells capable of storing multiple bits at time of manufacture.

The action by which a control device (and a computer comprising this control device) "displays" information may be an act in which the control device displays a screen component or the like on a display device of a computer comprising this control device, or an act in which the control device sends display information, such as the screen component being displayed on the display device, to the above-mentioned second computer, which comprises a display device. The second computer, upon receiving display information, can display a screen component or the like represented by this display information on a display device.

Example 1

A first example will be explained hereinbelow by referring to the drawings.
<1. Information System Configuration>
FIG. 1 is a diagram showing an example of the configuration of a computer system related to the first example.

The computer system, for example, comprises a storage system 1000 and a management server 1200. The storage system 1000 receives an I/O request (a write request or a read request) from a host computer (will be abbreviated as host hereinafter) 1100. There can be one or more hosts 1100 and management servers 1200, respectively. The storage system 1000 and the host 1100 are coupled via an I/O network 1300. The storage system 1000, the management server 1200 and the host 1100 are coupled via either a management network (not shown in the drawing) or the I/O network 1300.

The host 1100 comprises an internal host network 1104 (for example, a bus). A processor (abbreviated as Proc in the drawing) 1101, a memory (abbreviated as Mem in the drawing) 1102, and an I/O port (abbreviated as I/O P in the drawing) 1103 are coupled to the internal host network 1104.

The management server 1200 comprises an internal management server network 1204 (for example, a bus). A processor (abbreviated as Proc in the drawing) 1201, a storage resource 1210, a management port (abbreviated as M P in the drawing) 1203, and an input/output device 1205 (abbreviated as I/O device in the drawing) are coupled to the internal management server network 1204. The storage resource 1210 is considered to be either a semiconductor memory or a HDD, or a combination thereof, but may be another device that is capable of storing information and a program. The input/output device 1205, for example, may be a display, a keyboard, or a pointing device, or may be another such device. A serial interface or an Ethernet interface may be used as an input/output device instead of the input/output device 1205, a computer for display use comprising a display, a keyboard, or a pointer device may be coupled to the relevant interface, and by sending display information to the display computer and receiving input information from the display computer, the relevant interface may substitute for the input and display of an input/output device by carrying out a display on and receiving information from the display computer.

The management server 1200 can receive a management operation request from a user (for example, the management server 1200 operator, or simply the administrator), and can send the received management operation request to the storage system 1000. The management operation request is a request for a storage system 1000 operation, and, for example, may be a parity group creation request, an internal LU creation request, a path definition request, a pool definition request, a virtual internal LU creation request, a cell mode setup request, and a data migration request. The respective requests will be explained further below.

Hereinafter, an aggregate of one or more computers for managing a storage system and displaying display information in a computer system will be called a management system. In a case where the management server 1200 displays the display information, the management server 1200 is the management system. The management system may also be a combination of the management server 1200 and a display computer. Also, the same processing as that of the management computer may be realized using multiple computers to enhance the speed and increase the reliability of management processing, and in this case, the relevant multiple computers (to include a display computer in a case where the display computer carries out displays) is the management system.

A fibre channel connection is considered one example for the I/O network 1300, but this connection may also be FICON (FIbre CONnection: registered trademark), or a combination of Ethernet (registered trademark), TCP/IP and iSCSI, or a combination of Ethernet and a network file system such as NFS (Network File System) or CIFS (Common Internet File System). In addition, the I/O network 1300 may be any other communication network that is capable of transferring an I/O request. The I/O network 1300 and the management network may be the same network.

The storage system 1000 comprises a controller (written as CTL in the drawing) 1010, a cache memory (written as Cache/Shared Mem in the drawing) 1020, and multiple flash memory devices (Flash Memory Device: may abbreviated as FMD hereinafter) 1030. Furthermore, the storage system 1000 may also comprise multiple HDDs 1040. In the following explanation, the FMD 1030 and the HDD 1040 may be referred to generically as either a storage device or SDEV when no distinction is made between the two.

The preferred mode is considered to be such that the storage controller 1010 and the cache memory 1020 are each comprised of multiple components. This is so that even when a failure occurs in one component causing a blockage (refers to the fact that the component becomes unusable), the remaining component can be used to continue to receive I/O requests represented by reads and writes. However, at least one of the storage controller 1010 or cache memory 1020 need not be comprised of multiple components.

The storage controller 1010 is a device (for example, a circuit board) for controlling the operation of the storage system 1000. The storage controller 1010 comprises an internal network 1016. An I/O port 1013, a cache port (written as C P in the drawing) 1015, a management port (written as M P in the drawing) 1016, a backend port (written as B/E P in the drawing) 1014, a processor (for example, a CPU) 1011, and a memory 1012 are coupled to the internal network 1016. The storage controller 1010 and the cache memory 1020 are coupled together via an internal storage network 1050. The storage controller 1010, the respective FMDs 1030 and the respective HDDs 1040 are coupled together via multiple backend networks 1040. A connection medium and protocol introduced by the I/O network 1300 may be employed as the backend network 1040, but another medium and protocol, such as SAS, SATA, or PCI-Express, may be used.

The internal networks of the host 1100 and storage system 1000 may preferably be a wider bandwidth than the transfer bandwidth comprising the I/O port 1013, or may be replaced either partially or entirely by buses or switched networks. In FIG. 1, one I/O port 1013 exists in the storage controller 1010, but in actuality, multiple I/O ports 1013 may exist in the storage controller 1010.

According to the above-described hardware configuration, it is possible for the host 1100 to read and/or write either part or all of the data stored in the FMD 1030 or the HDD 1040 of the storage system 1000, and for the management server 1200 to manage the computer system.

Figure 2:
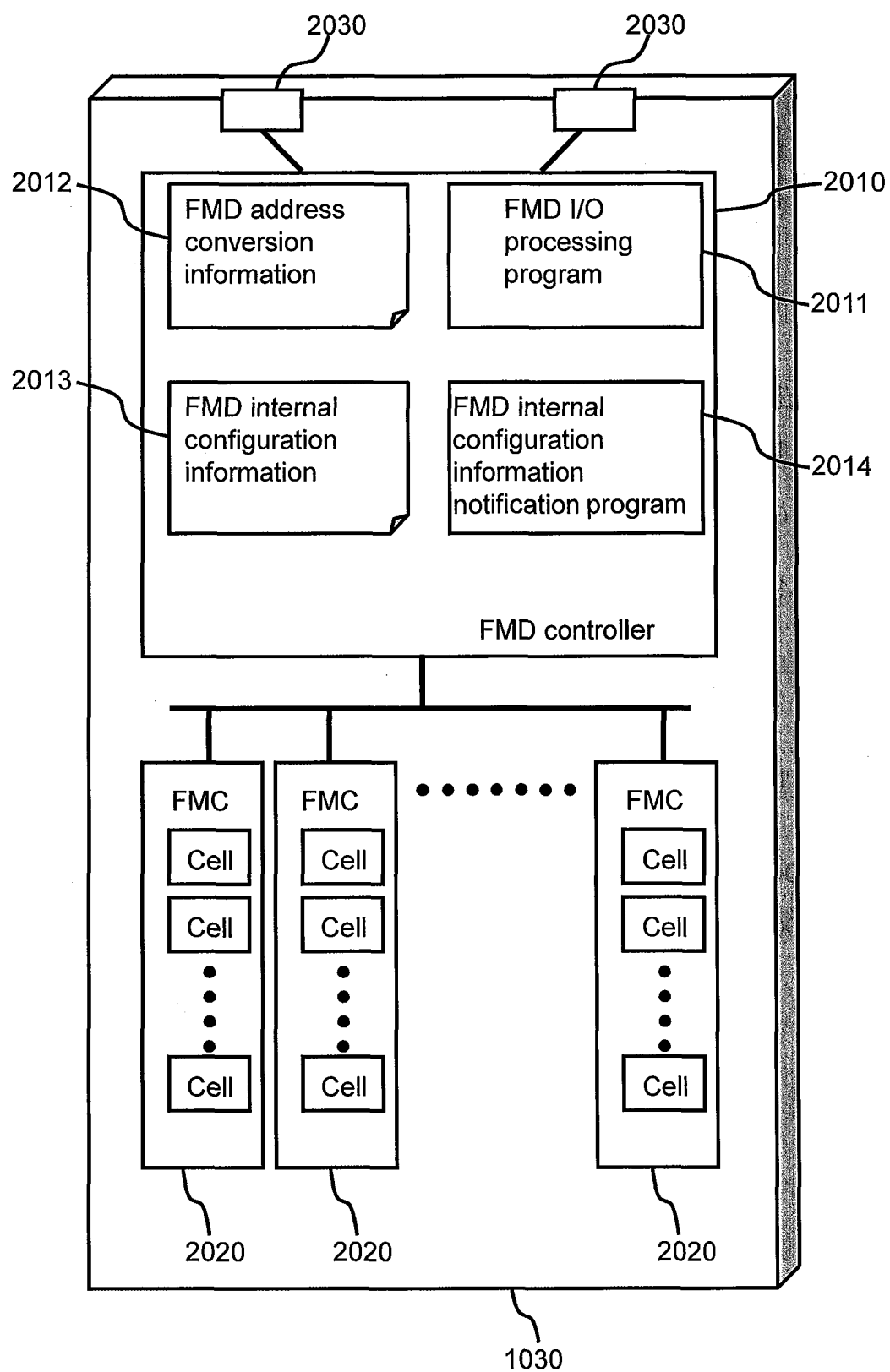
FIG. 2 is a diagram showing an example of the configuration of a FMD related to the first example.

FIG. 2 is a diagram showing an example of the configuration of an FMD related to the first example.

The FMD 1030 comprises an I/O port 2030, a FMD controller 2010, and multiple FMC (flash memory chips) 2020. The I/O port 2030 is coupled to the backend network 1040 and the FMD controller 2010. The FMD controller 2010 is coupled to multiple FMCs 2020. The FMC 2020 comprises multiple flash memory cells (FM cell: written as Cell in the drawing).

Preferably, the FMD 1030 comprises multiple I/O ports 2030. This is because the backend network 1040 is redundant, and as such, coupling each of the redundant backend networks 1040 and the FMD 1030 to independent ports is preferable for maintaining redundancy. However, the FMD 1030 may have one I/O port 2030.

<1.1. Overview of Flash Memory>.

The multiple FM cells comprising the FMC 2020 will be explained in this section.

<1.1.2. Explanation of FM Cell>.

Figure 55:
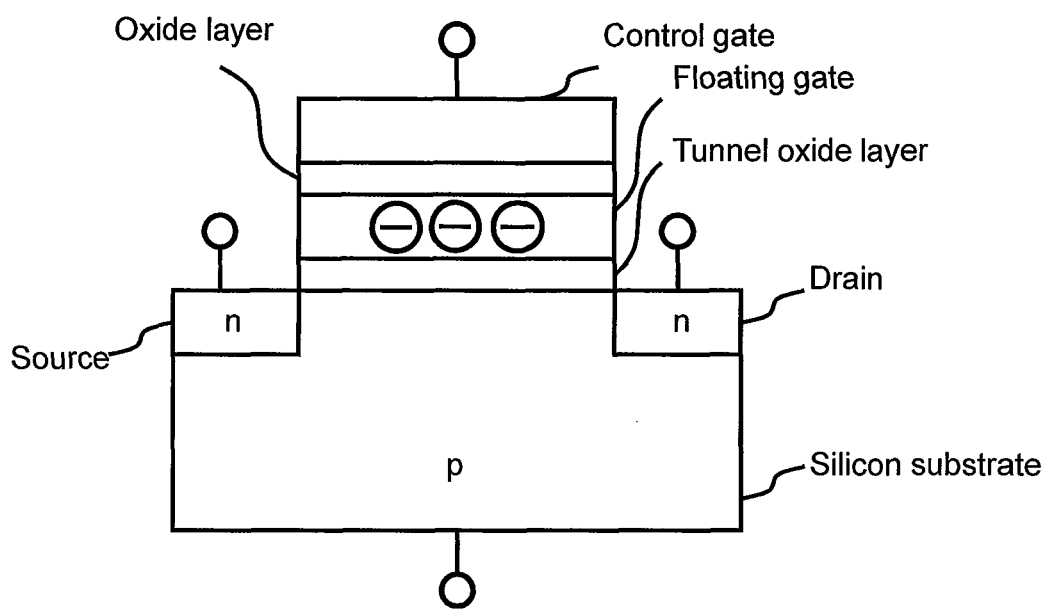
FIG. 55 is a diagram showing the cell structure of an FM cell related to the first example.

FIG. 55 is a diagram showing the cell structure of a FM cell related to the first example.

The FM cell comprises a silicon substrate 5501, which is a p-type semiconductor, an n-type semiconductor (source) 5502, another n-type semiconductor (drain) 5503, a tunnel oxide layer 5504, a floating gate 5505, an oxide layer 5506, and a control gate 5507. The floating gate 5505 is a structure, which is insulated by the tunnel oxide layer 5504 and the oxide layer 5506. The floating gate 5505 can accumulate electrons by producing a tunneling effect in accordance with a cell programming operation, which will be explained further below. The floating gate 5505 releases the accumulated electrons by producing a tunneling effect in accordance with a cell erase operation, which will be described further below. The electrons accumulated on the floating gate 5505 will leak out over time due to a decrease in insulating capabilities as the tunnel oxide layer 5504 deteriorates. One cause of this deterioration is repetitive cell programming and cell erases.

<1.1.3. Cell Erase Operation>.

Figure 56:
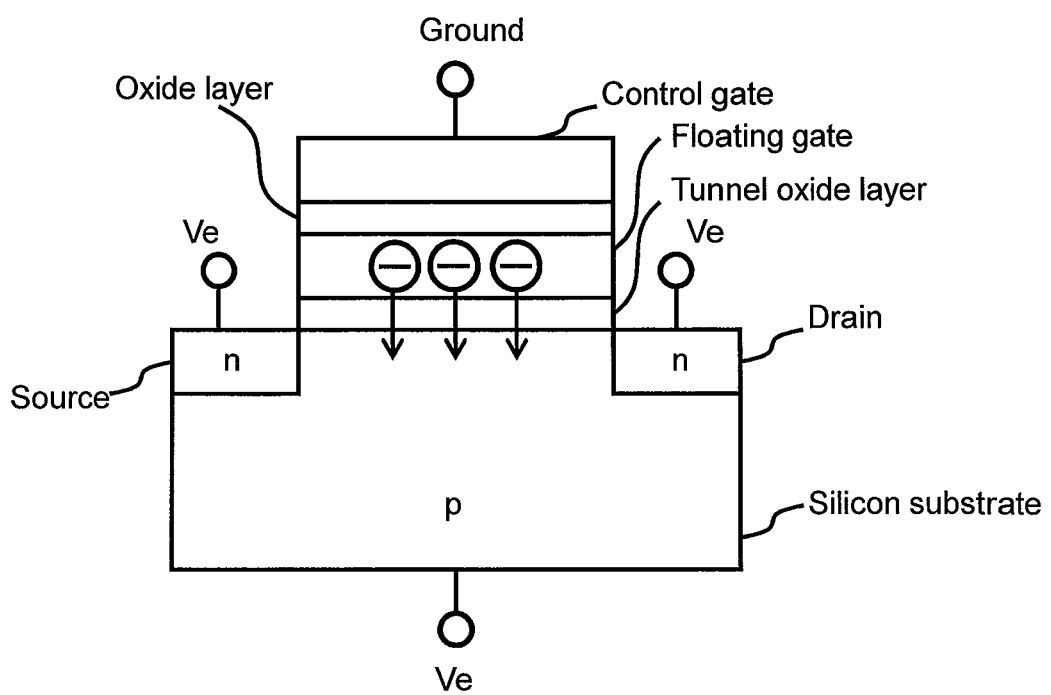
FIG. 56 is a diagram illustrating a cell erase of an FM cell related to the first example.

FIG. 56 is a diagram illustrating a cell erase of an FM cell related to the first example.

The cell erase operation releases electrons, which have accumulated on the floating gate 5505. This operation is realized by applying a ground voltage to the control gate 5507 and a prescribed voltage (Ve) to the drain 5503, the source 5502, and the silicon substrate 5501. The respective voltages Ve of the drain 5503, the source 5502, and the silicon substrate 5501 do not have to be the same from a micro perspective. The classic reason for the unit of the cell erase operation being larger than the unit of a cell programming operation or a cell read operation is to increase the packaging density by simplifying the structure of the FMC 2020.

<1.1.4. Cell Programming Operation>.

Figure 57:
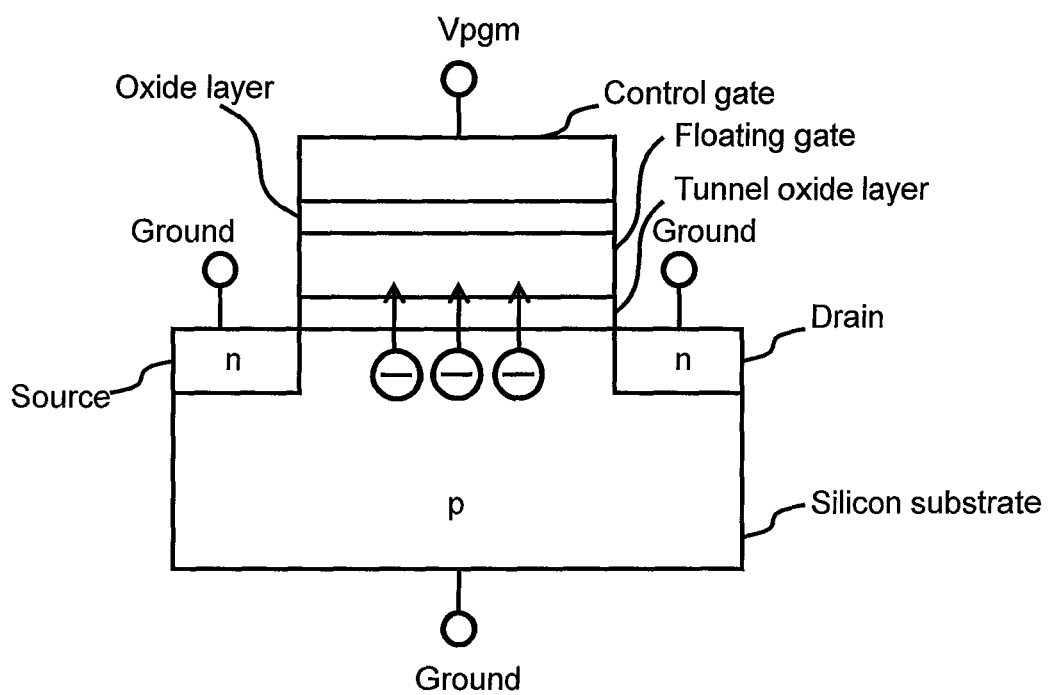
FIG. 57 is a diagram illustrating cell programming of an FM cell related to the first example.

FIG. 57 is a diagram illustrating cell programming of an FM cell related to the first example.

The cell programming operation is for accumulating electrons on the floating gate 5505. This operation is realized by applying a ground voltage to the drain 5503, the source 5502, and the silicon substrate 5501, and applying a prescribed voltage (Vpgm) to the control gate 5507. The ground voltage applied to the drain 5503, the source 5502, and the silicon substrate 5501 may differ minutely.

<1.1.5. Cell Read Operation>.

Figure 58:
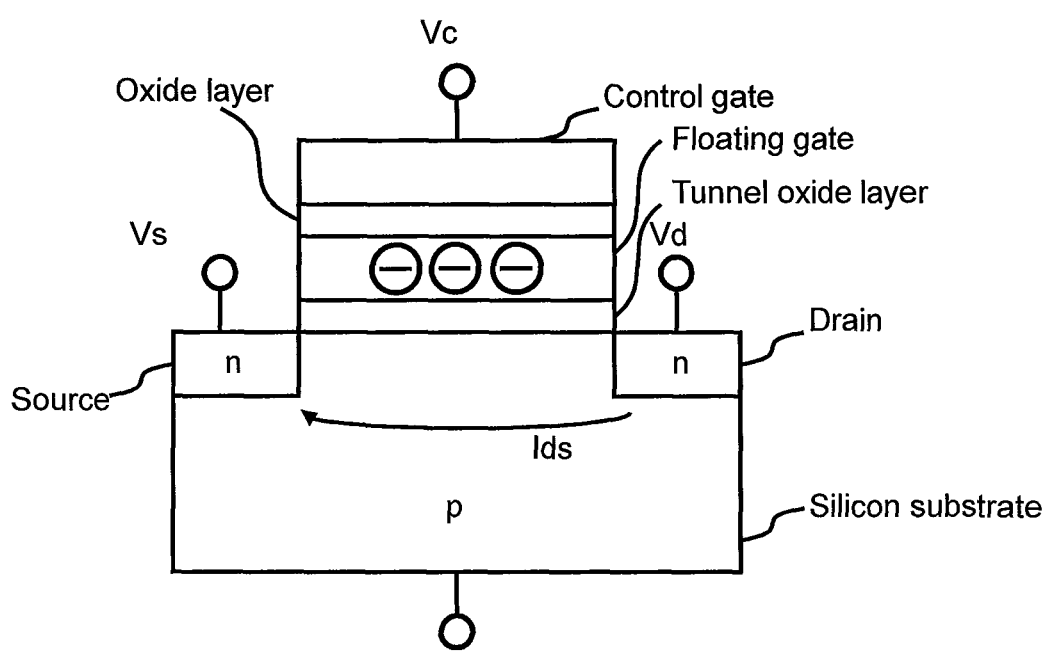
FIG. 58 is a diagram illustrating a cell read of an FM cell related to the first example.

FIG. 58 is a diagram illustrating a cell read of an FM cell related to the first example.

The cell read operation is for measuring (sensing) the presence or absence of electron accumulation (more precisely, the amount of accumulated electrons) accumulated on the floating gate 5505 in accordance with the presence or absence of an electric current Ids from the drain 5503 to the source 5502. This operation is realized by applying a prescribed voltage (Vread) to the control gate 5507, and measuring the electric current Ids flowing between the drain and the source (checking whether or not a prescribed amount of current is flowing).

<1.1.6. Threshold Voltage and the Respective Operations>.

A Vread, which changes a state in which an electric current is not flowing between the drain and the source to a state in which only a prescribed amount of electric current is flowing, will be called the threshold voltage (Vth) here. The threshold voltage is related to the amount of electrons, which have accumulated on the floating gate 5505, and the larger the amount of electrons accumulated on the floating gate 5505, the higher the threshold voltage. Just like the definition of the threshold voltage, the Ids will flow even though a voltage, which is higher than the threshold voltage, is used as the Vread.

However, since the tunneling effect, which constitutes the basis of cell programming and a cell erase, is a stochastically-generated phenomenon, and there is also individual variability in each FM cell, the amount of electrons either accumulated on or released from the floating gate 5505 cannot be easily controlled. For this reason, in an actual cell programming operation, the threshold voltage is repeatedly checked subsequent to applying the voltage Vpgm, and the size and pressure period of the Vpgm is adjusted such that the threshold voltage at the time of a cell read will be higher than a predetermined boundary voltage Vra.

The boundary voltage Vra must be higher than the threshold voltage of the FM cell that has undergone a cell erase. This is because, in a case where the threshold voltage of the post-cell erase FM cell is higher than the boundary voltage Vra, this FM cell is mistaken for a cell, which has undergone cell programming.

<1.1.7. Storing Multiple Bits in 1 FM Cell>.

In a case where two bits are to be stored in one FM cell, the amount of electrons accumulating on the floating gate 5505 are controlled in four states, including a state immediately after a cell erase. In addition, the Ids is measured by applying boundary voltages Vra, Vrb, Vrc as threshold voltages at the time of a cell read. For this reason, the FM cell can take a first state of immediately after an erase, in which the threshold voltage is less than the boundary voltage Vra, a second state, in which cell programming has been performed such that the threshold voltage becomes higher than the boundary voltage Vra and lower than the boundary voltage Vrb, a third state, in which cell programming has been performed such that the threshold voltage becomes higher than the boundary voltage Vrb and lower than the boundary voltage Vrc, and a fourth state, in which cell programming is performed such that the threshold voltage is higher than the boundary voltage Vrc. The two-bit value denoted by the first state immediately after an erase is "11", the bit value denoted by the second state is "10", the bit value denoted by the third state is "00", and the bit value denoted by the fourth state is "01" here. The bit value denoted by each cell state and the bit value of data, which a higher-level device (the storage controller 1010 and so forth) write to a cell, may be the same, or the value of each bit may be inverted or made the same as either value. That is, in a case where the data written by the higher-level device is "10", "10" may be written as-is to the cell, or in a case where the data written by the higher-level device is "10", "1" and "0" in the respective bits may be inverted and "01" may be written to the cell.

Figure 60:
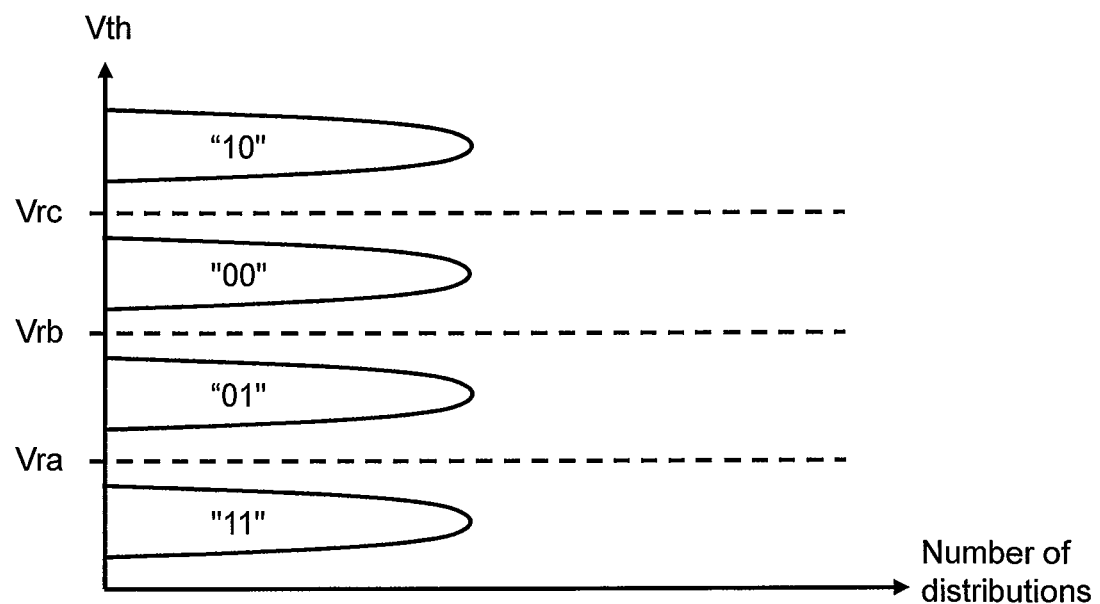
FIG. 60 is a diagram related to the first example showing the distribution of threshold voltages, when two bits are stored in an FM cell.

FIG. 60 is a diagram showing the distribution of threshold voltages in a case where two bits are stored in a FM cell related to the first example.

In a case where the lowest bit of the FM cell (LSB: Least significant bit) is set to "0" from the "11" state immediately after an erase, control is carried out in accordance with a cell programming operation such that the FM cell threshold voltage becomes higher than the Vra and lower than the Vrb. As a result of this, the FM cell constitutes a "10" state.

Cell programming of the highest bit (MSB: Most significant bit) of the FM cell is implemented after the LSB cell programming. In a case where the highest bit (MSB) is set to "0" from a state in which LSB state is "0" (that is "00"), control is carried out in accordance with cell programming such that the threshold voltage of the FM cell falls within the distribution of "00" (that is, higher than Vrb and lower than Vrc). Similarly, in a case where only the MSB is set to "0" from a LSB state of "1" (that is "01"), control is carried out in accordance with cell programming such that the threshold voltage of the FM cell falls within the distribution of "01" (that is, higher than Vrc). A cell erase operation is needed to set the LSB to "0" after having set the MSB to "0".

In a case where the MSB is read from an FM cell in this state, a check is performed to determine whether the MSB in a FM cell of either "11" or "10" is "1", or whether the MSB in a FM cell of either "01" or "00" is "0" by measuring the current Ids in a case where the voltage Vread applied to the control gate 5507 is Vrb. In a case where the LSB is read from an FM cell, the electrical current Ids is measured in a case where the voltage Vread applied to the control gate 5507 is the voltage Vrc and a case where the applied Vread is Vra, and a check is made in accordance with this measurement result. That is, when it is supposed that the electrical current Ids in a case where the voltage Vread applied to the control gate 5507 is Vrc is Idsc, and the electrical current Ids in a case where the voltage Vread is Vra is Idsa, first of all, when the voltage Vread is set to Vra and the electrical current Idsa flows, it is determined that the FM cell is "11", and the LSB is "1". In addition, in a case where Vread is set to Vrc and the Idsc does not flow, it is determined that the FM cell is "01", and the LSB is "1", and in a case where the Idsc does flow, it is determined that the FM cell is either "00" or "10", and the LSB is "0".

<1.1.8. FM Cell Deterioration>.

Figure 61:
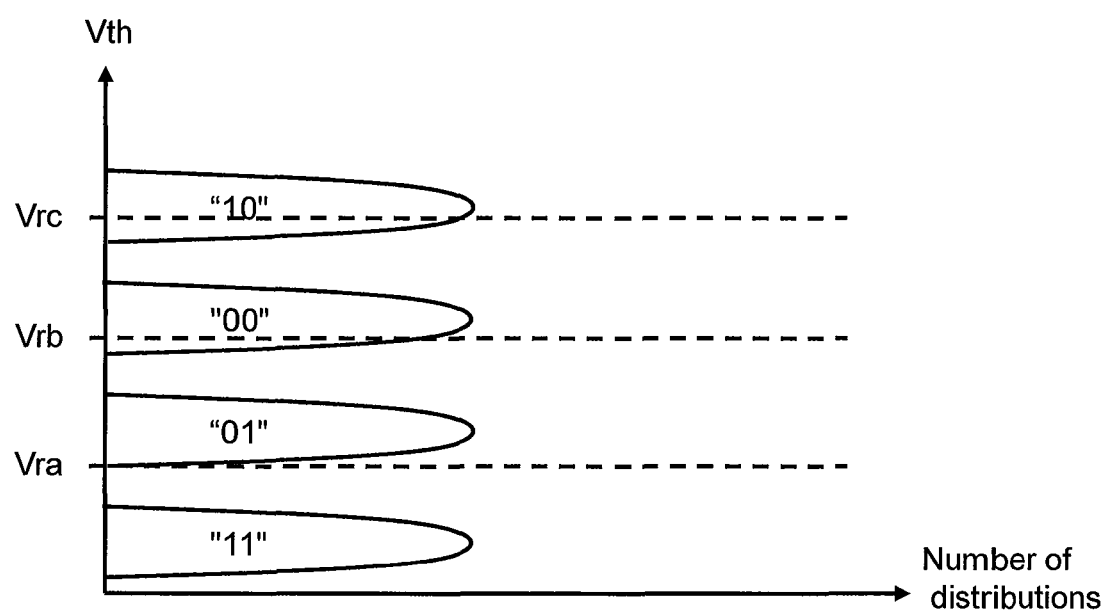
FIG. 61 is a diagram illustrating a drop over time in the threshold voltage due to excessive cell programming and cell erases in an FM cell related to the first example.

A voltage margin is needed between the threshold voltage distribution and the boundary voltages Vra, Vrb, Vrc in each state so as not to mistakenly detect a two-bit value stored in a FM cell. However, in a case where the FM cell has deteriorated, a portion of a threshold voltage distribution such as that shown in FIG. 60 at initial cell programming will fall below the boundary voltage over time as shown in FIG. 61 (for example, the Vrc). In a case where one bit is stored in one FM cell, the FM threshold voltage distribution resists FM cell deterioration because a larger voltage margin can be adopted as shown on FIG. 59. Alternatively, in a case where three or more bits are stored in one FM cell, the threshold voltage distribution is susceptible to FM cell deterioration because the distribution becomes denser, narrowing the voltage margin. When the voltage supplied to the FMC 2020 is increased, a large voltage margin can be adopted even in a case where multiple bits are stored in one FM cell, but in this case, care must be taken in the circuit design to deal with the power consumption and high voltages.

<1.1.9. When Storing Only the LSB>.

The drop in the threshold voltage in line with FM cell deterioration tends to be larger the higher the original threshold voltage. For this reason, even though two bits are able to be stored per FM cell, storing a bit in the LSB only may increase resistance to cell deterioration. Since the above-mentioned repetitive threshold voltage checking operations are required in a case where an MSB cell programming operation is performed, the cell programming time tends to be long. For this reason, storing a bit only in the LSB shortens cell programming time.

<1.1.10. Switching to One-Bit Storage>.

Figure 59:
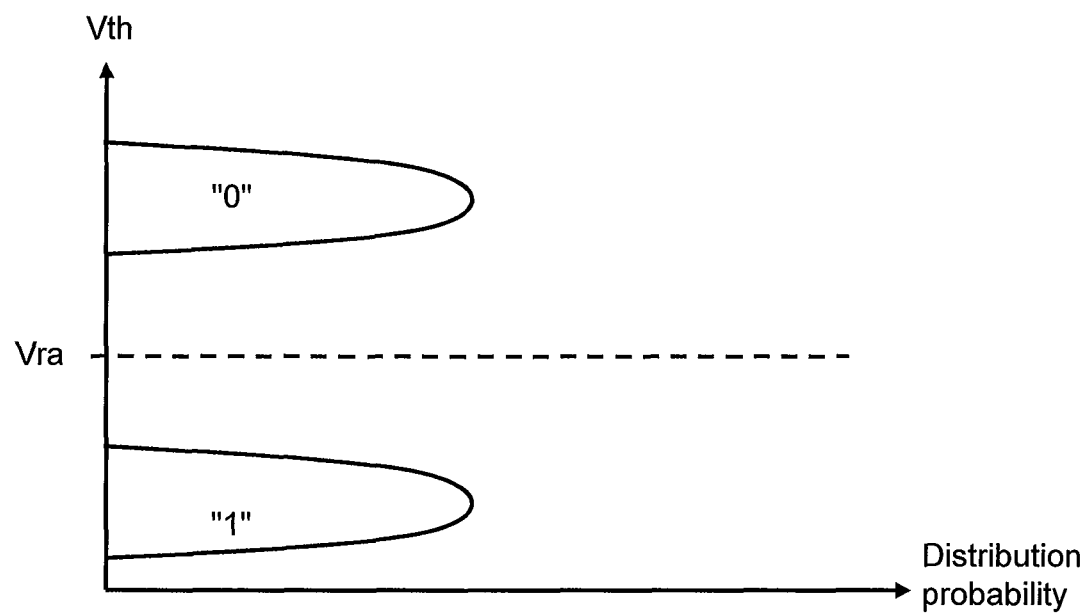
FIG. 59 is a diagram related to the first example showing the distribution of threshold voltages, when only one bit is stored in an FM cell.

As described hereinabove, in a case where one bit is stored in one FM cell, the FM cell threshold voltage distribution resists FM cell deterioration because a larger voltage margin can be adopted as shown on FIG. 59. Also, a cell programming operation tends to be completed in a shorter time than when two bits are stored in one FM cell. This is because even when the threshold distribution width of state "0" is made wider, the voltage margin is still better than when two bits are stored, and as such, the size and pressure period of the Vpgm may be coarser, and the number of threshold voltage checks may be reduced in a cell programming operation.

In a case where a FM cell is used to store N bits like this, a range defined by a minimum value and a maximum value of the threshold voltage is divided into sub-ranges of $2^N$, the FMD controller uses all the sub-ranges to store an N-bits state, and reads the stored N-bits information. The boundary voltage is equivalent to the boundary line of sub-ranges, but does not necessarily have to be situated between sub-ranges. Furthermore, the minimum value of the threshold voltage is a voltage that is the same or smaller than the post-cell erase boundary voltage, and the maximum value of the threshold voltage is considered to be the maximum value the FM cell threshold voltage is capable of taking. However, as long as at least one of these values is a preferred value for the FMD controller, the other value may be used as the minimum value and/or the maximum value.

Even though it was assumed at the manufacturing stage that N (two or more) bits would be stored in one cell, it has been shown that making the number of bits stored in one cell smaller than N changes the cell storage characteristics (for example, write speed, read speed, and reliability to include durability with respect to FM cell deterioration). Explaining reliability from the sub-range perspective, a case in which one bit is stored makes it possible to increase the sub-range of the threshold voltage targeted at the time of cell programming and to increase the sub-range at the time of a cell read, thereby heightening resistance to data loss.

In the following explanation, the term cell mode will be introduced as a state for stipulating the number of bits to be stored in a cell of a nonvolatile memory. In a case where two bits are able to be stored in one cell (a case in which N is 2), there are two cell modes (a one-bit storage mode and a two-bit storage mode). In a case where three bits can be stored in one cell (a case in which N is 3), there are three cell modes (a one-bit storage mode, a two-bit storage mode, and a three-bit storage mode), but a multiple number of storage bits may be supported by one cell mode (for example, a first cell mode is a one-bit storage mode, and a second cell mode is a two- or three-bit storage mode).

The preceding was explained using a flash memory, which is one type of nonvolatile memory, but PRAM and MRAM cells can also be changed using one operation or another, and are similar to FM in that a prescribed observation amount, which is capable of being stored thereafter, is divided into multiple sub-ranges.

<1.1.11. Unit for Each Operation in FMC>.

The FMC 2020 allows a cell read operation and a cell programming operation to be carried out together for multiple FM cells. The byte size for carrying out the cell read and the cell programming is called page size. For example, in a case where the page size is 4192 bytes (4096 bytes of data+96 bytes of redundancy code), and one byte is eight bits, 33536 FM cells will comprise one page. The cell read operation specifies a page address and either the LSB or the MSB as the read-target bit. The cell programming operation specifies a page address and either the LSB or the MSB as the programming-target bit, and thereafter, the FMC 2020 receives page-size data and stores the data in the FM cells comprising the specified page. As another example of realizing a cell programming operation, the FMC 2020 may receive a page address and page-size data. In accordance with this, in a case where programming is carried out only for the LSB, data, which will constitute the state "10", may be delivered, and in a case where programming is carried out only for the MSB, the stored LSB is determined in accordance with whether the current cell is "11" or "10", after that, data, which will constitute either "01" (in the case of "11") or "00" (in the case of "10"), may be delivered.

The FMC 2020 allows a cell erase operation that has a prescribed number of pages as a unit. The unit of this cell erase is called an erase block. The cell erase operation specifies an erase block address. For this reason, in the case of a write, the FMD controller 2010 carries out a cell programming operation, and, as needed, a cell erase operation.

<2. Overview of this Example>.

An overview of this example will be explained.

Figure 3:
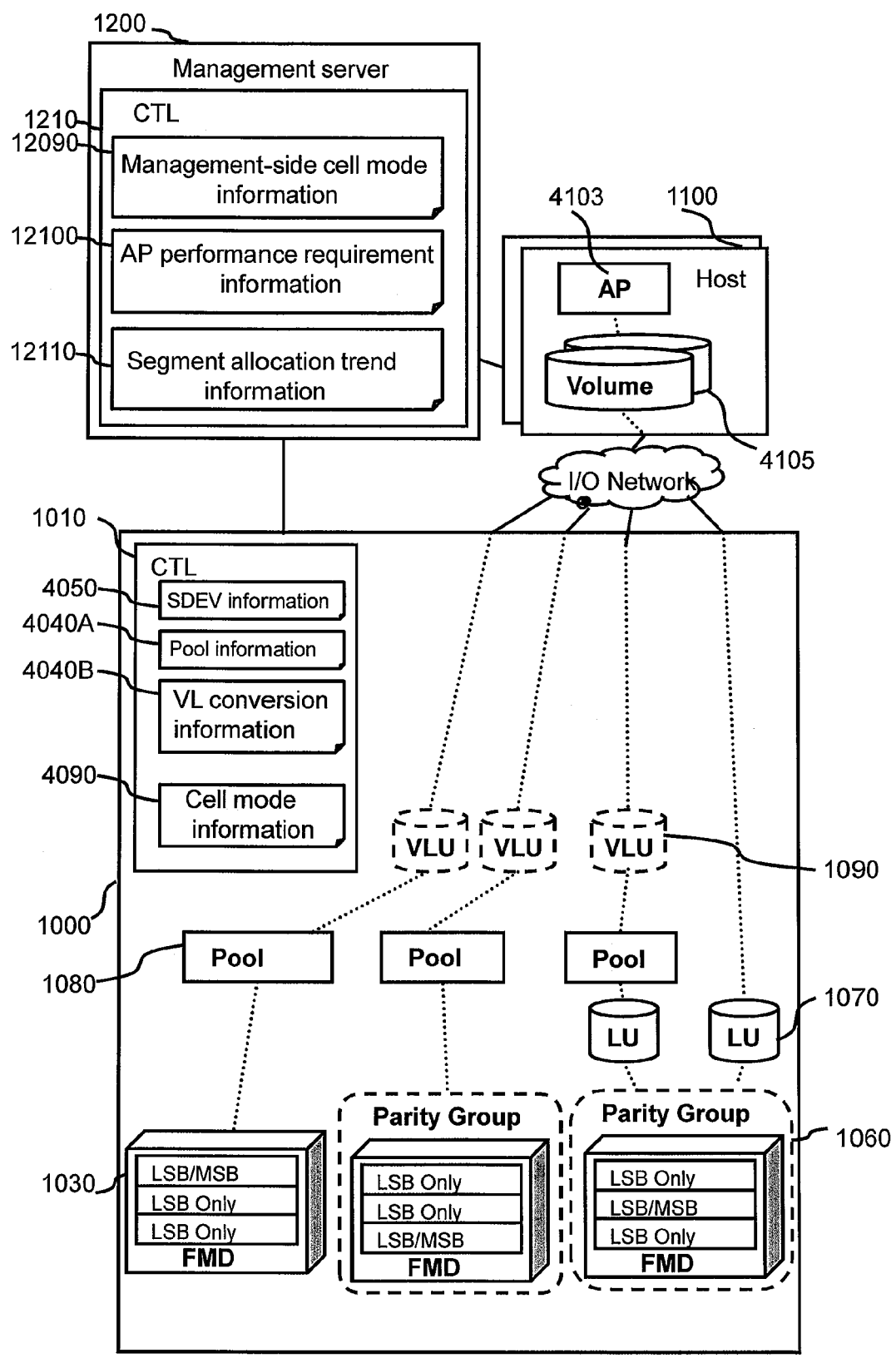
FIG. 3 is a diagram showing an example of an overview of the first example.

FIG. 3 is a diagram showing an overview of the first example. Since FIG. 3 is a diagram for use in an overview explanation, the specific explanations and descriptions of the examples to be explained further below will not necessarily match with those of FIG. 3. In the following explanation, to include this overview, as in FIG. 60, (1) a first mode, which makes only the LSB the read/write target, and (2) a second mode, which makes both LSB/MSB the read/write target, will be explained as the cell modes. However, it goes without saying that this example can also be applied to a cell mode for carrying out bit storage as in FIG. 59. The following explanation can also be applied to a case in which three or more bits are stored in one FM cell.

The storage system 1000 comprises a FMD 1030, and either records or references information using different cell modes (either LSB-only read/write execution, or both LSB/MSB read/write execution) with respect to the FMD 1030. In addition, the storage system 1000 stores this cell mode setup information (mode information) and storage characteristics-related information in cell mode information 4090, and uses this information in FMD 1030 management. The management server 1200 receives the cell mode information 4090 from the storage system 1000, stores management-side cell mode information 12090, displays a cell mode in accordance with a GUI or CLI, and uses the cell mode information to manage the storage system 1000 comprising the FMD 1030 by receiving a cell mode change request and sending the cell mode change request to the storage controller 1010. In so doing, the administrator can make flexible use of the storage system based on the capacity efficiency of the FMD 1030 and characteristics other than capacity (for example, as described above, write time and a data storage period pursuant to FM cell deterioration).

In addition, the management server 1200 determines the percentage of FM cells capable of using only the LSB and the percentage of FM cells capable of using both the LSB and MSB with respect to the FMD 1030, which is used as a real storage area of either a LU 1070 or a virtual LU 1090 in accordance with an application performance requirement and an access measurement value, and, in addition, configures a cell mode suitable for an application request and utilization state by identifying a FM cell that should be a cell mode change target, and issuing a cell mode change instruction to the storage controller 1010.

This enables the administrator to operate the storage system using a cell mode, which is suitable for the actual utilization mode of the storage system. Another way of putting it is that the administrator is able to specify a comprehensively suitable cell mode by also taking into account an SDEV other than a flash memory, such as a HDD. The FMD 1030 need not necessarily belong to a storage pool 1080 or a parity group 1060. Also, all data in a LU 1070 may be stored in the LSBs, the MSBs, or in both the LSBs and the MSBs of the FM cells. For example, it is supposed that the administrator initially used a parity group (more specifically, a FMD 1030 included in the parity group) in the cell mode for using only LSBs, and wanted to temporarily provide a high-speed LU 1070 from a HDD without purchasing an additional FMD 1030. In this case, the administrator can acquire a new storage area by changing the cell mode of the parity group, and can define a new LU 1070 in this newly acquired storage area. Typically, access to data stored in the MSB of the FMD 1030 is often faster than with HDD, and in the case of short-term use, the data storage period is not a problem. Needless to say, of course, the cell mode may be used in accordance with a different use case.

In the following explanation, the focus will be on a case in which IOPS (an example of access frequency) is used as an example of a performance requirement, however, in this example, an average response time per unit of time may also be treated as another example of a performance requirement. In accordance with this, the "IOPS" of each example may be read as "average response time". In this case, the storage controller measured value may be either an average or a maximum response time.

<3. Host and Storage System Programs and Information>.

The explanation will once again return to the computer system as a whole.

Figure 4:
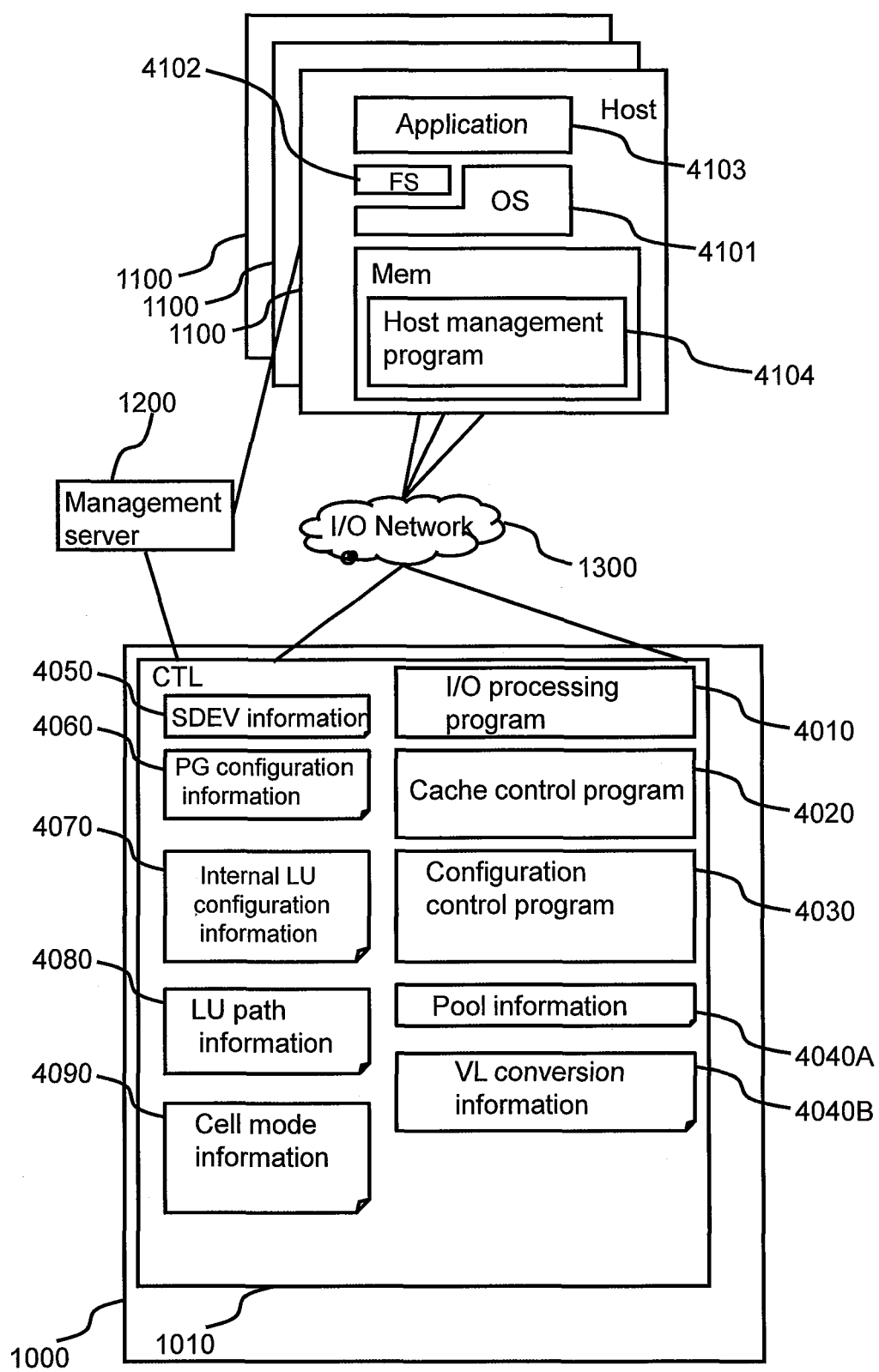
FIG. 4 is a diagram showing an example of the configurations of a host and a storage system related to the first example.

FIG. 4 is a diagram showing an example of the configuration of the storage system and the host related to the first example. Computer programs and various types of information included in the management server 1200 will be described further below.

The storage controller 1010 stores SDEV information 4050, PG configuration information 4060, internal LU configuration information 4070, LU path information 4080, cell mode information 4090, pool information 4040A, and VL conversion information (abbreviation for virtual-logical conversion information) 4040B in accordance with at least one of the processor 1011, the memory 1012, the I/O port 1013, the backend port 1014, and the cache port 1015, and, in addition, executes an I/O processing program 4010, a cache control program 4020, and a configuration control program 4030. Typically, these programs and information are stored in the memory 1012. However, either part or all of the information stored in the storage controller 1010 may be stored in a configuration external to the storage controller 1010 on the inside of the storage system 1000 (for example, in cache memory 1020, or in a portion of the FMD 1030).

The I/O processing program 4010 receives an I/O request (for example, either a read request or a write request) from the host 1100, and executes a process conforming to this I/O request. Specifically, for example, the I/O processing program 4010 transfers data stored in the cache memory 1020 (read-target data conforming to a read request) to the host 1100, or stores data received from the host 1100 (write-target data conforming to a write request) to the cache memory 1020. In a case where the I/O request from the host 1100 is a block access format, the I/O processing program 4010 can also carry out a process for providing a logical volume (for example, a logical unit (may be abbreviated as LU) in SCSI), which is the access target. In a case where the I/O request from the host 1100 is a file format, the I/O processing program 4010 can carry out a process for providing a file, which is the access target, and a directory. The I/O processing program 4010 may carry out a process required for providing access in accordance with another I/O request (for example, an I/O request of a database query or a CKD format).

The cache control program 4020 can copy (includes migration) data stored in a SDEV to the cache memory 1020, or copy data stored in the cache memory 1020 to the SDEV either together with or independent of the I/O processing program 4010. The cache control program 4020, as a process for enhancing reliability, may also create and/or update redundant data represented in a RAID (abbreviation of Redundant Array of Independent (or Inexpensive) Disks) based on the data stored in the cache memory 1020.

The configuration control program 4030, in response to a request for a configuration change and/or a configuration reference, can carry out a process for referencing and/or updating at least one of the SDEV information 4050, the PG configuration information 4060, the internal LU configuration information 4070, the LU path information 4080, the cell mode information 4090, the pool information 4040A, and the VL conversion information 4040B. The configuration change and/or configuration reference request(s), for example, is issued from at least one of the management server 1200, the host 1100, and another computer. The configuration control program 4030 receives another request from the management server 1200 and responds to the relevant request.

The SDEV information 4050 comprises information related to the SDEV. The PG configuration information 4060 comprises configuration information on a parity group (Parity Group: may be abbreviated as PG hereinafter). The internal LU configuration information 4070 comprises information for configuring either part or all of the areas of an SDEV included in a parity group as an internal logical unit (hereinafter abbreviated as "internal logical unit" or "internal LU"). In this example, the internal LU is mainly used when including a parity group storage area in the storage pool. However, as mentioned above, in a case where a storage area of the FMD 1030 is provided without going through a storage pool, a path may be defined to the internal LU. Of course, as mentioned above, the FMD 1030 and the parity group itself may be included in the storage pool.

In a case where a request to query either the capacity or the block size of the logical unit is received from either the host 1100 or the management server 1200, the storage controller 1010 may send either the capacity or the block size of the internal LU corresponding to the logical unit specified in the query request. In a case where the LU specified in the request here is a VLU (a virtual logical unit), the storage controller 1010 may be configured so as to send the capacity (virtual capacity) defined for the VLU. Similarly, in a case where a request querying the identifier of the logical unit has been received from either the host 1000 or the management server 1200, the storage controller 1010 may send a value based on a LUN allocated to the logical unit, or may send a value based on the identifier of the internal LU corresponding to the logical unit.

The cell mode information 4090 comprises the cell mode of a nonvolatile memory included in the FMD 1030. The pool information 4040A comprises configuration information on a storage pool (hereinafter, may be abbreviated simply as pool). The VL conversion information 4040B comprises virtual-logical conversion information of a virtual internal LU created from the storage pool, and information for accessing a segment allocated to the virtual internal LU.

Either one or more, or all of the SDEV information 4050, the PG configuration information 4060, the internal LU configuration information 4070, the LU path information 4080, the cell mode information 4090, the pool information 4040A, and the VL conversion information 4040B may be collectively called storage configuration information. Other information may also be included in the storage configuration information.

At least one of an OS 4101, a file system 4102, an application program (abbreviated hereinafter as either application or AP) 4103, and a host management program 4104 is executed on the host 1100 in accordance with at least one of a processor 1101, a memory 1102, and an I/O port 1103.

The application 4103 is a program (for example, a Web server program or a database management program) for carrying out a business process corresponding to a request from the user or another computer while reading/writing file and other such data by making a request to the OS 4101 or the file system 4102.

The OS 4101 sends an I/O request issued from the application 4103 or the file system 4102 to the I/O port 1013 of the storage system 1000, and receives data from the storage system 1000. The file system 4102 can convert a file-format I/O request from an application to a block-format I/O request or a network file system protocol-format I/O request, and can request that the OS 4101 transfer the I/O request. The OS 4101 and the file system 4102 may comprise processes other than these.

The host management program 4104 is for communicating information of the application 4103, the FS 4102 and the OS 4101 in the host 1100 to a system management program 12010 (refer to FIG. 24) of the management server 1200.

Other programs may be executed in the host 1100. The host 1100 may also send and receive a database query and CKD system request in addition to a block I/O request and a file I/O request. Either apart or all of the processing of the OS and file system programs executed by the host 1100 and the storage controller 1010 may be implemented using hardware.

Figure 24:
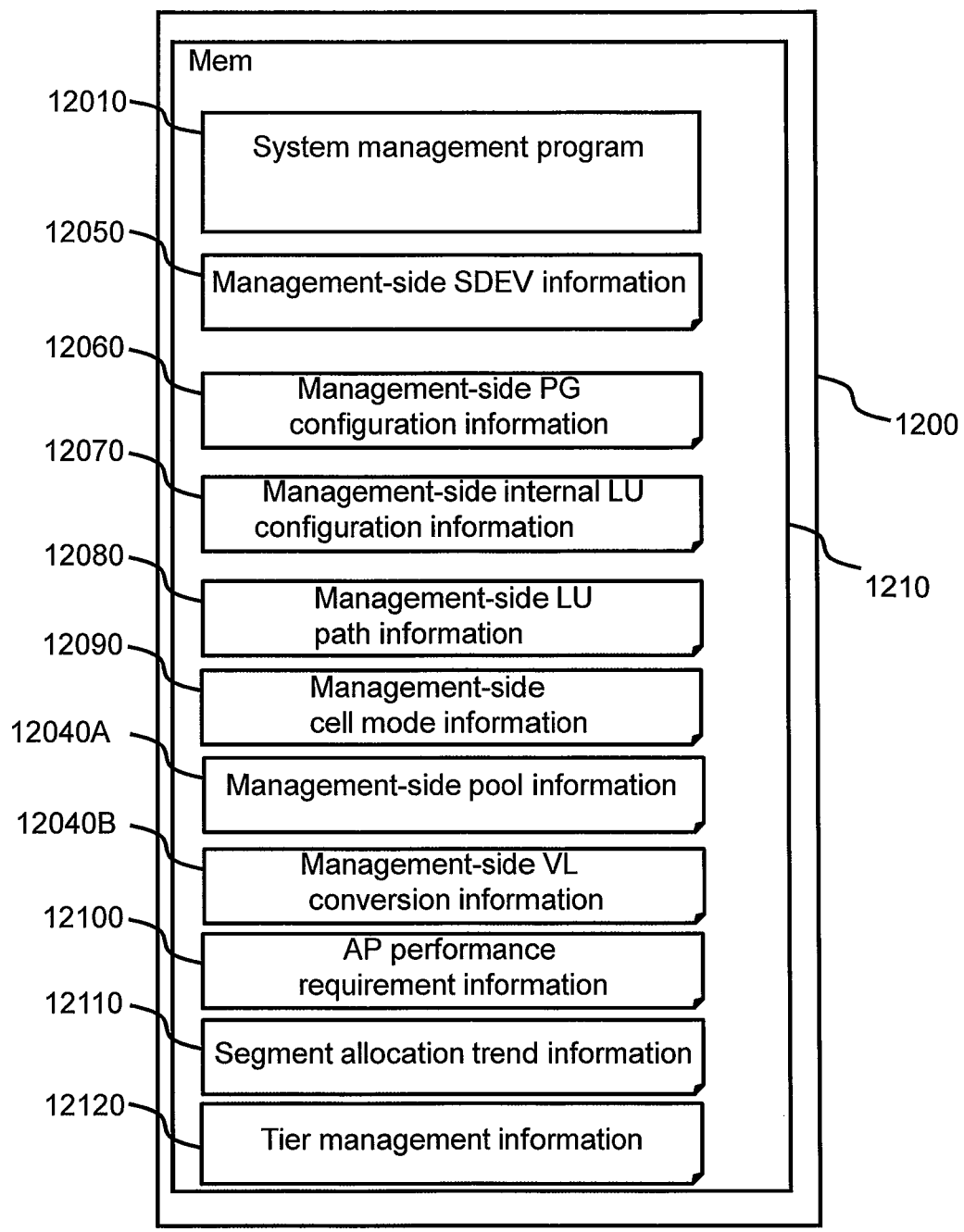
FIG. 24 is a diagram showing an example of the configuration of a management server related to the first example.

FIG. 24 is a diagram showing an example of the configuration of the management server related to the first example.

The storage resource 1210 of the management server 1200 stores the system management program 12010, management-side SDEV information 12050, management-side PG configuration information 12060, management-side internal LU configuration information 12070, management-side LU path information 12080, management-side cell mode information 12090, management-side pool information 12040A, management-side VL conversion information 12040B, AP performance requirement information 12100, segment allocation trend information 12110, and tier management information (Tier management information) 12120. Other data may also be stored in the storage resource 1210, and the storage of a portion of the above-cited information may be omitted.

The system management program 12010 is for managing either the storage system 1000 or the host 1100.

The management-side SDEV information 12050 stores information regarding a SDEV installed in the storage system 1000. The management-side PG configuration information 12060 stores information regarding a parity group defined in the storage system 1000. The management-side internal LU configuration information 12070 stores information regarding an internal LU defined in the storage system 1000. The management-side LU path information 12080 stores information regarding a logical unit defined in the storage system 1000.

The management-side cell mode information 12090 stores information regarding a cell mode defined in the storage system 1000. The management-side pool information 12040A stores information regarding a storage pool defined in the storage system 1000. The management-side VL conversion information 12040B stores information on the relationship between a virtual internal LU provided by the storage system and a storage pool, and an allocated segment. The AP performance requirement information 12100 stores either an internal LU or a virtual internal LU allocated to the host 1100, an application run on the LU, and a performance requirement (for example, an IOPS or a response time) being sought in the operation of this application. The segment allocation trend information 12110 stores an amount for each unit of time of a segment allocated to a virtual internal LU-ID, and an IOPS (or average response time) for each unit of time. The tier management information 12120 stores information for managing an aggregate (this aggregate may be called a tier (Tier)), which collects together storage resources having the same (or substantially the same) performance and reliability from among the storage resource belonging to a storage pool. Different types of SDEV may be included in a single tier.

The management server 1200 may store the system management program 12010 in the storage resource 1210 using a CD-ROM or other such medium. The management server 1200 may store the system management program 12010, which has been distributed from a distribution computer (not shown in the drawing) in the storage resource 1210, and may store the system management program 12010 in the storage resource 1210 by executing an installation program distributed from a distribution computer.

One or more, or all of the management-side SDEV information 12050, the management-side PG configuration information 12060, the management-side internal LU configuration information 12070, the management-side LU path information 12080, the management-side cell mode information 12090, the management-side pool information 12040A, the management-side VL conversion information 12040B, the AP performance requirement information 12100, the segment allocation trend information 12110, and the tier management information 12120 may be collectively called management-side storage configuration information. Other information may also be included in the management-side storage configuration information.

<4. Details>.
<4.0. Address Space Names and Relationships>.

Before beginning a more detailed explanation, the block size in the example will be explained using the drawings.

Figure 20:
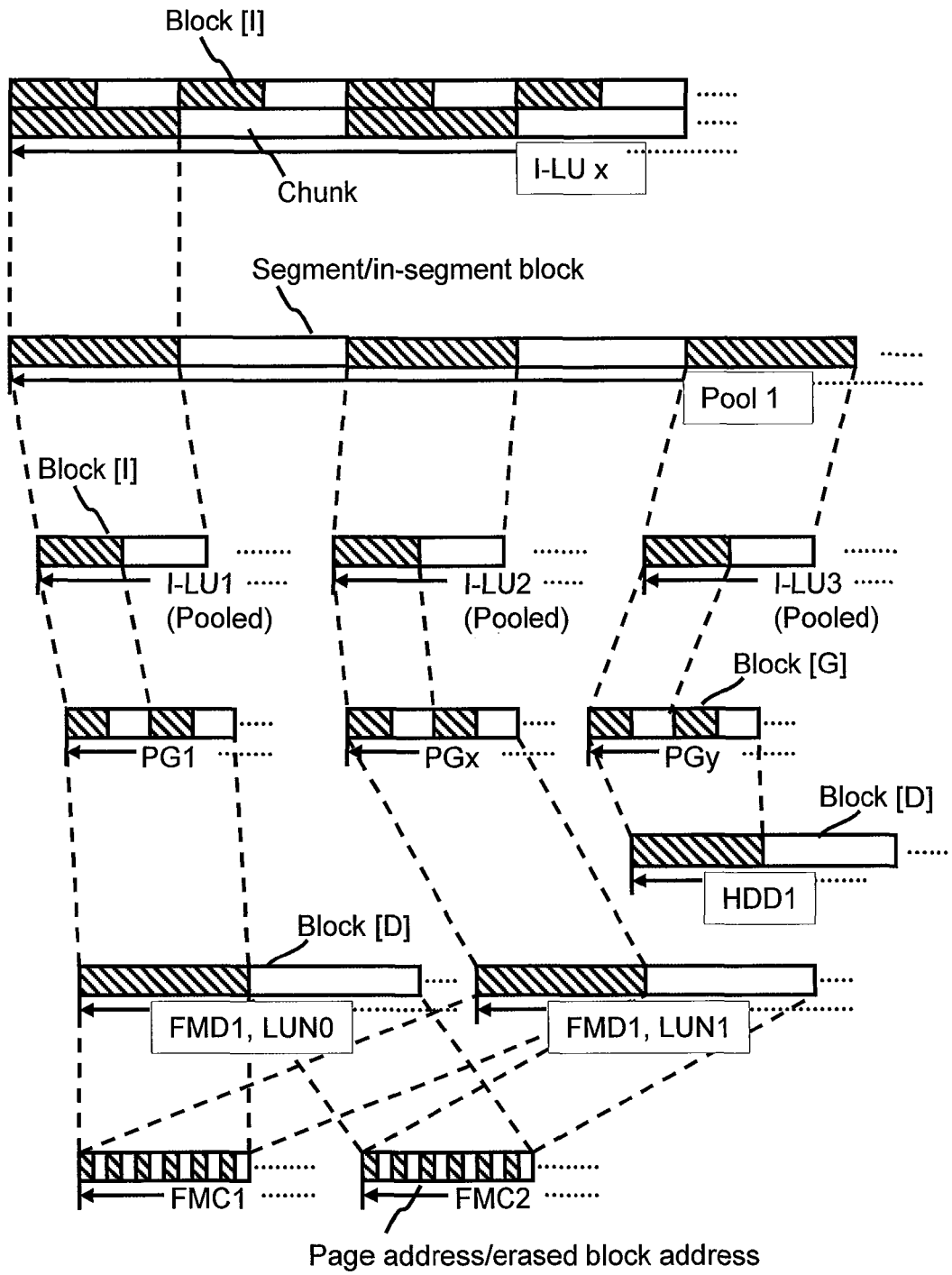
FIG. 20 is a diagram showing an example of the relationships of address spaces from an LU down to a FMC related to the first example.

FIG. 20 is a diagram showing an example of the relationships of address spaces from a LU down to a FMC related to the first example. Notations such as block [D] and block [G] are used for denoting the address space in each respective layer.

In the first example, the addressing shown below is carried out.

(Layer 1) In a case where the FMD controller 2010 carries out a cell programming operation and a cell read operation with respect to an FMC 2020, the FMD controller 2010 specifies the FMC 2020 identifiers (FMC1, FMC2, and so forth) and a page address, which specifies a page. Consequently, the unit of the data operation is page size. Only in the case of a cell erase operation does the FMD controller 2010 specify FMC 2020 identifiers and an erase block address, which specifies an erase block. Therefore, the unit for deleting data in a cell erase operation is erase block size.

(Layer 2) In a case where the storage controller 1010 either reads or writes to the FMD 1030, the storage controller 1010 specifies FMD 1030 identifiers (FMD1, FMD 2, and so forth), a LUN, and a block [D] address. Consequently, the unit of the read/write is block [D] size. In this example, in a case where "0" has been specified as the LUN, the block [D] comprises a FM cell LSB. Furthermore, in a case where "1" has been specified as the LUN, the block [D] comprises a FM cell MSB. In a case where the storage controller 1010 accesses the HDD 1040, the storage controller 1010 specifies a HDD 1040 identifier (HDD1 and so forth), and the block [D] address. The size of the FMD 1030 block [D] and the size of the HDD 1040 block [D] may differ or may be the same.

(Layer 3) In a case where the storage controller 1010 either reads or writes data from/to the cache memory 1020, the storage controller 1010 specifies parity group identifiers (PG1, PGx, PGy and so forth) and a block [G] address. Consequently, the unit of the data operation is a block [G] size unit.

(Layer 4) In a case where the storage controller 1010 either reads or writes from/to an internal LU included in a pool, the storage controller 1010 specifies internal LU identifiers (I-LU1, I-LU2, I-LU3 and so forth) and a block [I] address.

(Layer 5) The storage controller 1010 manages an allocation to an internal LU and a free area by using as a unit a prescribed size storage area, which is a storage area called a segment of the internal LU included in a pool. However, in the case of either a read or a write, the storage controller 1010 specifies a segment address and an in-segment block address. Typically, the size on an in-segment block is the same size as the block [I].

(Layer 6) In a case where the host either reads or writes from/to a virtual internal LU, the host 1100 specifies a virtual internal LU identifier and a block [V] address. The storage controller 1010 manages the allocation and corresponding relationship(s) of a segment as a chunk, which is a collection of block [V]s, and is the same size as a segment.

(Layer 7) Although omitted from the drawing, the storage controller 1010 can allocate one or more LUNs of the I/O port 1013 to an internal LU not included in a pool. The internal LU to which this LUN is allocated can be detected from the host side as a LU to which a LUN is allocated. An example of this is such that the storage capacity of the LU (internal LU, to include a virtual internal LU) is notified from the storage controller 1010 as an example of this detection. As a result of this, the host 1100 can perform either a read or a write from/to the LU by specifying the LUN and a LBA addressed to the I/O port 1013. Typically, the block size of the LBA is the same as that of block [I].

The preceding is the relationships of the address spaces in the example. However, the above address spaces are merely an example. Also, a parity group, the FMD 1030, or the HDD 1040 may be included in a pool instead of an internal LU. The storage controller need not use part of an address space. For example, there are cases in which an address conversion is carried out between layers 3 and 5 without using the address space (layer 4) related to the internal LU. In accordance with this, a parity group identifier and block [G] address may be used in place of the internal LU identifier and block [I] address. Naturally, a LUN may be allocated directly without including the internal LU in the pool. Furthermore, the size of each block, segment, chunk, page, and erase block may comprise the number of bytes for storing a redundancy code and control information besides the number of bytes for storing data from the host.

<4.1. FMD>.
<4.1.1. FMD Controller>.

The FMD controller 2010 will be explained once again using FIG. 2.

The FMD controller 2010, for example, comprises an FMD I/O processing program 2011, a FMD internal configuration information notification program 2014, FMD address conversion information 2012, and FMD internal configuration information 2013. The FMD 1030 can ensure a free area by reporting a storage capacity, which is smaller than the total storage capacity of multiple FMCs 2020, to the storage controller 1010 as the capacity provided.

The FMD address conversion information 2012 comprises a block [D] address specified in either a read request or a write request received by the FMD controller 2010, and the corresponding relationship between a FMC 2020 identifier and a page address. For example, the FMD address conversion information 2012 has information of types (B1) and (B2) (but B2 may be eliminated) shown below for each block [D]:

(B1) the FMC identifier and page address where block [D] data is actually stored; and (B2) the number of times that block [D] has been referenced.

The FMD internal configuration information 2013 is for managing a failure status of each FM cell, and preferably, stores information of the types (C1) through (C3) shown below in a unit derived by collecting one or more erase blocks inside each FMC 2020:

(C1) a failure status;
(C2) cell-erased information; and
(C3) either the number of cycles of cell programming and cell erase, or the number of cell erases.

The FMD internal configuration information 2013 stores information for managing the attributes (for example, block [D] size, and number of block [D]s) of a storage area provided to the storage controller 1010 as FMD 1030, and an empty erase block.

The FMD I/O processing program 2011 analyzes either a write request or a read request received by the FMD controller 2010 via the I/O port 2030. In the case of a write request, the FMD I/O processing program 2011 uses the FMD address conversion information 2012 to identify the FMC 2020 identifier and page address where the data of the block [D] specified in the request is actually stored. Then, the FMD I/O processing program 2011 stores the write data in a FM cell included in the identified page in accordance with a cell programming operation, and carries out a cell erase operation as needed. In the case of a read request, too, the FMD I/O processing program 2011 uses the FMD address conversion information 2012 to identify the FMC 2020 identifier and page address where the data of the block [D] specified in the request is actually stored. Then, the FMD I/O processing program 2011 carries out a cell read operation with respect to the FM cell comprising the identified page, reads the bit stored in the FM cell, and sends this bit to the storage controller 1010 as the read data.

<4.1.2. Relationship of FMD LUN, LSB and MSB>.

Figure 62:
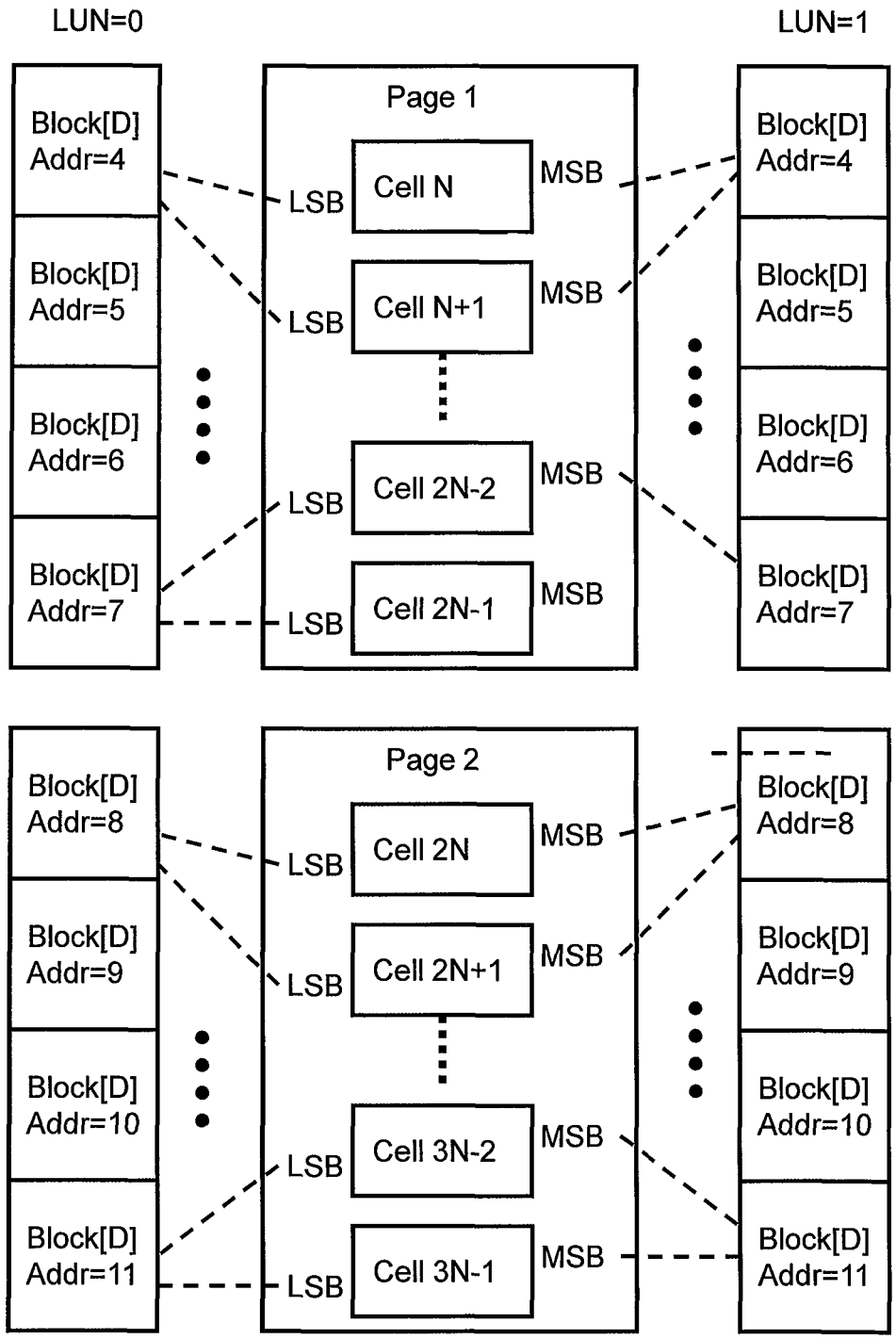
FIG. 62 is diagrams showing examples of the relationships among the block address spaces of respective FMD LUNS and the LSB and MSB of FM cells related to the first example.

FIG. 62 is diagrams showing examples of the relationships among the block [D] address spaces of respective FMD LUNs and the LSB and MSB of FM cells related to the first example. In the drawing, one page is the size of four block [D]s, and an FM cell for storing an in-page redundancy code is omitted to simplify the explanation.

As shown in the drawing, the LSBs of a prescribed page (for example, page 1) function as the actual storage areas of the block [D]s shown in the prescribed block addresses of LUN 0 (for example, addresses 4 through 7). The MSBs of a prescribed page (for example, page 1) function as the actual storage areas of the block [D]s shown in the prescribed block addresses of LUN 1 (for example, addresses 4 through 7). Therefore, the conversion from a block [D] address to a page address references common FMD address conversion information 2012 in a case where the LUN is 0 and a case where the LUN is 1. The method for providing the LSBs and MSBs of the page is not limited to this. For example, an even block [D] address may correspond to a LSB and an odd block [D] address may correspond to a MSB, and the block [D] addresses may alternately correspond to LSB and MSB by page size.

<4.1.2. FMD I/O Processing>.

A read process for processing a read request will be explained from among the processes of the FMD I/O processing program 2011.

Figure 63:
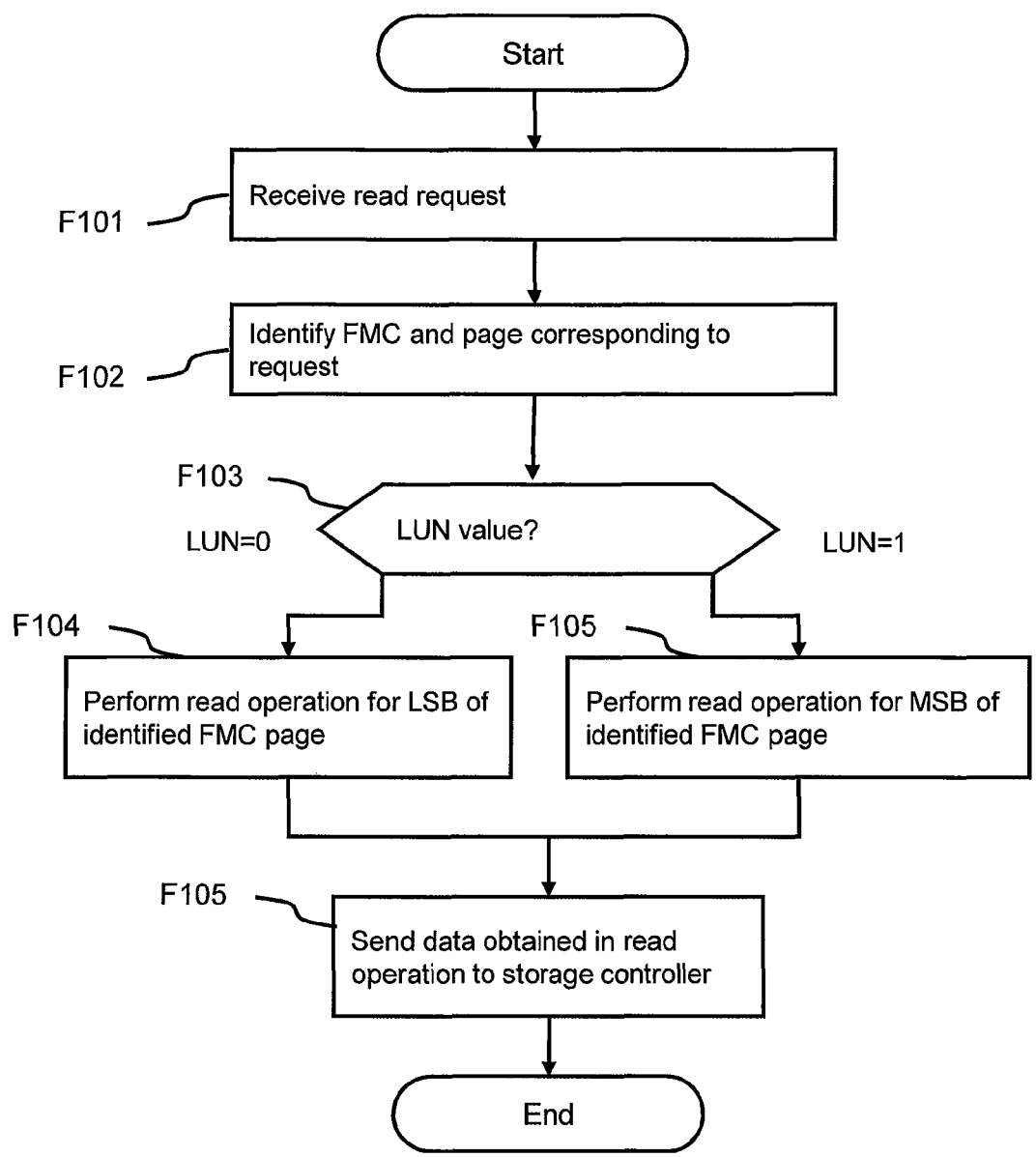
FIG. 63 is a flowchart of an example of a read process related to the first example.

FIG. 63 is a flowchart of an example of a read process related to the first example.

The FMD I/O processing program 2011 receives a read request specifying a block [D] start address, block [D] length, and a LUN (Step F101). Next, the FMD I/O processing program 2011 uses the FMD address conversion information 2012 to identify a FMC 2020 and page corresponding to the specified block [D] based on the block [D] start address and the block [D] length specified in the relevant read request (Step F102).

Next, the FMD I/O processing program 2011 determines the value of the LUN specified in the relevant read request (Step F103). In a case where the LUN is 0 (LUN=0 in Step F103), the FMD I/O processing program 2011 carries out a cell read operation for the identified page-specified LSB with respect to the FMC 2020 identified in Step F102, acquires the data stored in the page (more specifically, the data stored in the FM cell included in the page) (Step F104), and advances the processing to Step F106.

Alternatively, in a case where the LUN is 1 (LUN=1 in Step F103), the FMD I/O processing program 2011 carries out a cell read operation for the identified page-specified MSB with respect to the FMC 2020 identified in Step F102, acquires the data stored in the page (more specifically, the data stored in the FM cell included in the page) (Step F105), and advances the processing to Step F106.

In Step F106, the FMD I/O processing program 2011 sends the data acquired in either Step F104 or Step F105 to the storage controller 1010, and ends the processing.

A write process for processing a write request will be explained from among the processes of the FMD I/O processing program 2011.

Figure 64:
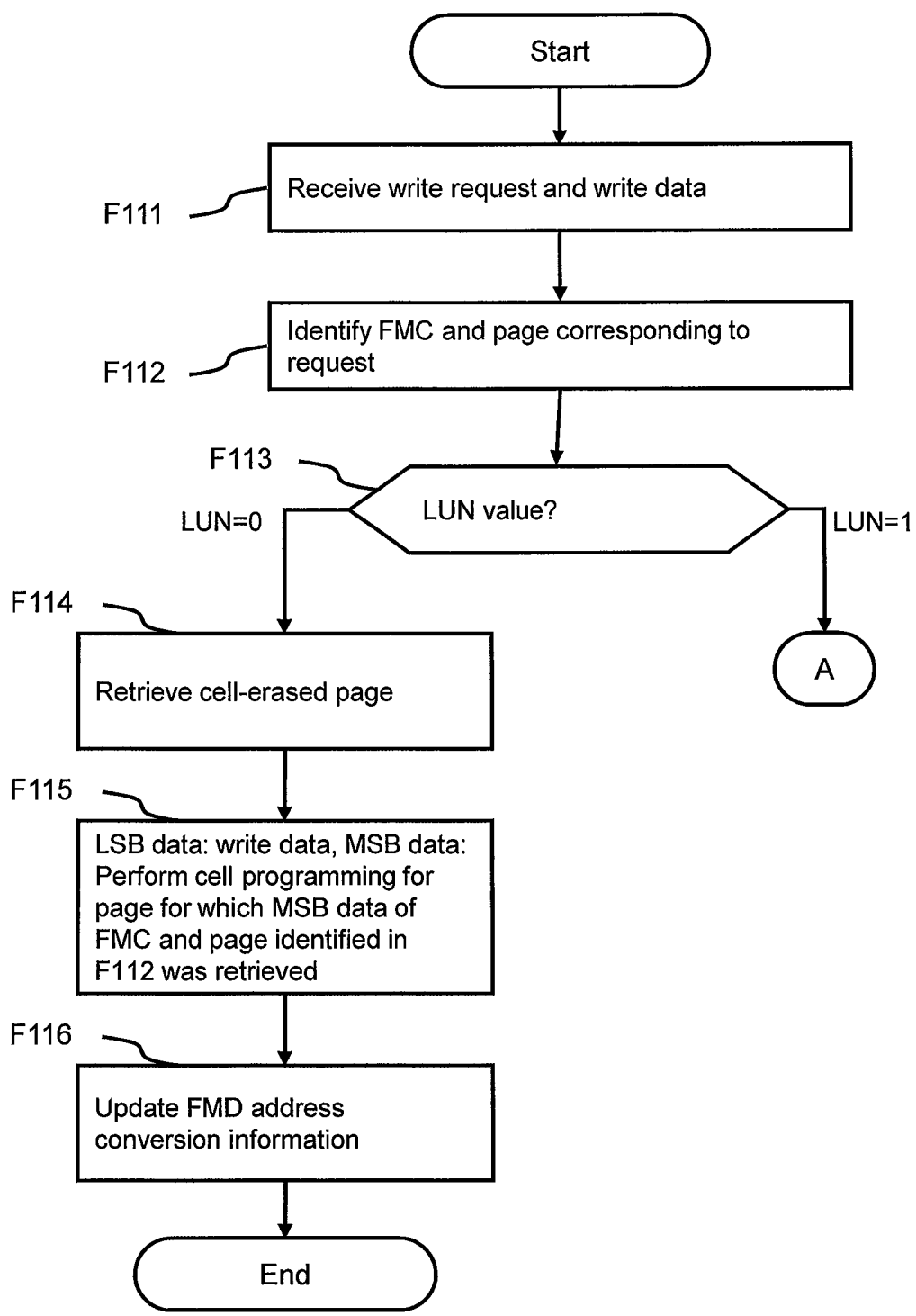
FIG. 64 is a first flowchart of an example of a write process related to the first example.
Figure 65:
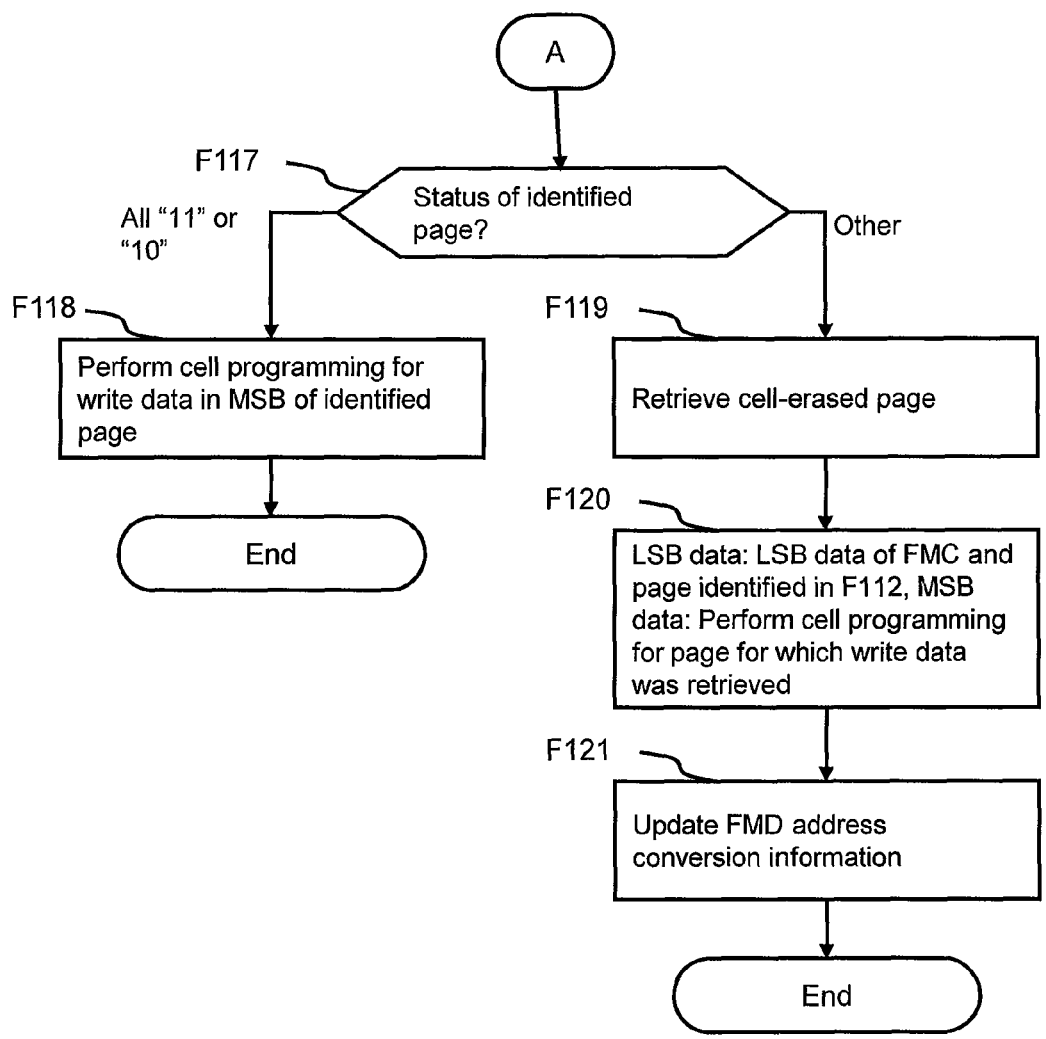
FIG. 65 is a second flowchart of an example of a write process related to the first example.

FIG. 64 is a first flowchart of an example of a write process related to the first example. FIG. 65 is a second flowchart of the example of the write process related to the first example.

The FMD I/O processing program 2011 receives a write request specifying a block [D] start address, a block [D] length, and a LUN, and write data (Step F111). Next, the FMD I/O processing program 2011 uses the FMD address conversion information 2012 to identify a FMC 2020 and a page corresponding to the specified block [D] based on the block [D] start address and the block [D] length specified in the relevant write request (Step F112).

Next, the FMD I/O processing program 2011 determines the value of the LUN specified in the relevant write request (Step F113). In a case where the LUN is 0 (LUN=0 in Step F113), the FMD I/O processing program 2011 retrieves a cell-erased page (more specifically, a page, which has not undergone cell programming starting from a cell-erased block) (Step F114).

Next, the FMD I/O processing program 2011 specifies both the LSB and the MSB of the retrieved page and carries out a cell programming operation (Step F115). At this time, the FMD I/O processing program 2011 stores write data in the LSB, and carries out a cell read of the data stored in the MSB of the page identified in Step F112 and stores the read data in the MSB. In a case where the cell mode corresponding to the relevant page is LSB Only, the state of the FM cell of the page identified in Step F112 is either "11" or "10", that is, the MSB has not undergone cell programming. For this reason, the result of the programming of this step remains either "11" or "10" as-is, and the cell programming of the MSB is omitted as a result.

Next, the FMD I/O processing program 2011 updates the FMD address conversion information 2012 so that the FMC identifier and page address corresponding to the specified block [D] becomes the FMC 2020 and page address identified in Step F112 (Step F116), and ends the processing.

Alternatively, in a case where the LUN is 1 in Step F113 (LUN=1 in Step F113), the FMD I/O processing program 2011 checks the state of the FM cell of the identified page (Step F117). When the result is that all the FM cells in the page are either "11" or "10" ("11" or "10 in Step F117), the FMD I/O processing program 2011 carries out a cell programming operation for the identified page-specified MSB with respect to the FMC 2020 identified in Step F112 (Step F118), and ends the processing. The data provided at this time is write data. More specifically, in a case where "0" is stored in the MSB and the state of the FM cell identified in Step F112 is "11", this state becomes "01" as a result of cell programming. In a case where the state of the FM cell is "10", this state becomes "00" as a result of cell programming. Incidentally, in a case where "1" is stored in the MSB, the result, or course, is that the state remains as-is at either "11" or "10".

Alternatively, in a case where none of the FM cells in the page are either "11" or "10" (Other in Step F117), the FMD I/O processing program 2011 retrieves a cell-erased page the same as in Step F114 (Step F119). Next, the FMD I/O processing program 2011 specifies both the LSB and the MSB of the retrieved page and carries out a cell programming operation (Step F120). At this time, the FMD I/O processing program 2011 reads data stored in the LSB of the page identified in Step F112 and stores the read data in the LSB, and stores the write data in the MSB. Next, the FMD I/O processing program 2011 updates the FMD address conversion information 2012 so that the FMC identifier and page address corresponding to the specified block [D] becomes the FMC 2020 and page identified in Step F119 (Step F121), and ends the processing.

In a case where a cell-erased page is retrieved at this point, a page, which meets all of the following conditions (D1) through (D3) may be retrieved:

(D1) A failure has not occurred in the page;

(D2) the state of the FM cell included in the page is "11" (in other words, the state immediately after a cell erase); and (D3) cell programming has not been carried out for either the LSB or the MSB of another page having a higher page address than the page in the erase block.

As the page searched for in Step F119, a page, which is configured such that its use is precluded for some reason other than the condition that a failure has not occurred, may be excluded. For example, a page in which either the number of cycles or the number of cell erases has exceeded the upper limit, or a page comprising data, which, although recoverable using the redundancy code, has been garbled due to the prescribed number of bits having been exceeded.

The FMD I/O processing program 2011 may carry out either any or all of the processing of the following (E1) and (E2) associated with a cell programming operation for a page.

(E1) The FMD I/O processing program 2011, prior to storing write data, computes a redundancy code, such as a LRC (Longitudinal Redundancy Check) or a CRC (Cyclic Redundancy Check), from the write data, and stores this redundancy code together with the write data. The relevant redundancy code is used to check for garbled data when a read request is received. In a case where garbled data has occurred, the FMD I/O processing program 2011 returns an error with respect to the relevant read request, and records the fact that a block failure has occurred in the FMD internal configuration information 2013.

(E2) After storing the write data, the FMD I/O processing program 2011 reads and compares the relevant block data from the FMC 2020. In a case where the comparison fails, the FMD I/O processing program 2011 records the fact that a failure has occurred in the block in the FMD internal configuration information 2013, and once again carries out a cell programming operation.

In follow-on processing to Step F116 and Step F121, the page, which had corresponded to the specified block [D] prior to updating, may be regarded as invalid.

The FMD I/O processing program 2011, as a separate process, may also carry out a cell erase of an erase block comprising a newly invalidated page. In so doing, the FMD I/O processing program 2011 reads the bit (data) of a valid page FM cell from the cell erase-target block, and carries out cell programming to a page of a different block. This processing can be carried out repeatedly either simultaneously with request processing or at an asynchronous timing. At this time, the FMD I/O processing program 2011 may record the number of cell erase operations for each erase block, and may strive to equalize the number of erase operation by selecting an erase block with a lower number of erase operations when selecting a cell erase-target erase block.

<4.1.3. FMD Internal Configuration Information Notification Program>.

The FMD internal configuration information notification program 2014 is for notifying the storage controller 1010 and so forth of FMD 1030 internal information. The following (G1) through (G6) are examples of the information provided by the FMD internal configuration information notification program 2014.

(G1) Size of the FMD 1030 block [D] (The storage controller 1010 will carry out access in units of the relevant block size.)

(G2) Number of block [D]s provided by the FMD 1030 (The storage controller 1010 may receive the provided storage capacity based on the size of the block [D] and the relevant number of blocks.)

(G3) Value of the free capacity inside the FMD 1030 (may also be expressed as number of blocks): The relevant free capacity value can be calculated in accordance with the following formula by finding the number of failed erase blocks (or number of blocks) in the FMD internal configuration information 2013. That is, the number of free blocks=(number of blocks in all flash memory chips)−(number of failed blocks)−(number of blocks described in (G2)) or the number of unused blocks (a case in which the number of block [D]s provided since the point in time at which the FMD began to be used is always allocated in proportion to the amount of capacity provided). In a case where a portion of the area of a flash memory chip is used for management or internal redundancy, the number of free blocks may be computed by taking into account (for example, subtracting) this number of blocks. Since the above-mentioned formula is based on the block size of the FMC 1030, when providing information, this information can be provided in terms of the block size of the FMD 1030. An example of a formula that uses number of blocks has been given, but it goes without saying that the free capacity value can be obtained by multiplying a prescribed value by the number of blocks.

(G4) Fact that either the voltage or the power being provided to the FMD 1030 is insufficient, and damage to the FMD 1030 internal bus or FMD controller 2010

(G5) Detection of garbled data in the data stored in the FMC 1030 by the FMD controller 2010

(G6) Either the number of cell programming and cell erase cycles, or the number of cell erases Hereinafter, this information may be collectively referred to as number of cell rewrites.

Any connection medium and communication protocol may be used between the FMD 1030 and the storage controller 1010. In addition, a write request to the FMD 1030 may be a request for updating data stored in the FMD 1030, and a retry request to the FMD 1030 may be a request for referencing the data stored in the FMD 1030. The detailed explanation of the FMD 1030 given above is merely an example. Another FMD 1030 may be used so long as the memory cell semiconductor characteristics enable multiple bits to be stored, and, in addition, it is possible to collaborate with the storage controller 1010 and to store the number of bits stipulated by the cell mode in the memory cell. For example, the controller of the FMD 1030 may store a cell mode specified by the storage controller 1010, and may utilize the FM cell as shown in FIGS. 59 and 60.

As will be explained further below, in this example, a different cell mode may be used with respect to the FMD 1030. For example, one part of the block [D] address space of the FMD 1030 may use a first cell mode, and the other part may use a second cell mode. As was explained hereinabove, since the association between the block [D] and the page is not always the same inside the FMD 1030 and a different page is used in accordance with a write request, it may seem at first glance that it will not be possible to use the two cell modes mentioned above. However, what is changed in accordance with the cell mode is the way bits are stored in the FM cell, not how FM cells, whose original semiconductor characteristics and quality differ greatly, are used. Therefore, even when the association between the block [D] and the page changes dynamically, the simultaneous use of multiple cell modes like this makes it possible for write data stored in a prescribed FMD 1030 in accordance with the first cell mode to possess the characteristics of the first cell mode, and for write data stored in the prescribed FMD 1030 in accordance with the second cell mode to possess the characteristics of the second cell mode.

<4.2. Information Managed by the Storage System>.

Figure 5:
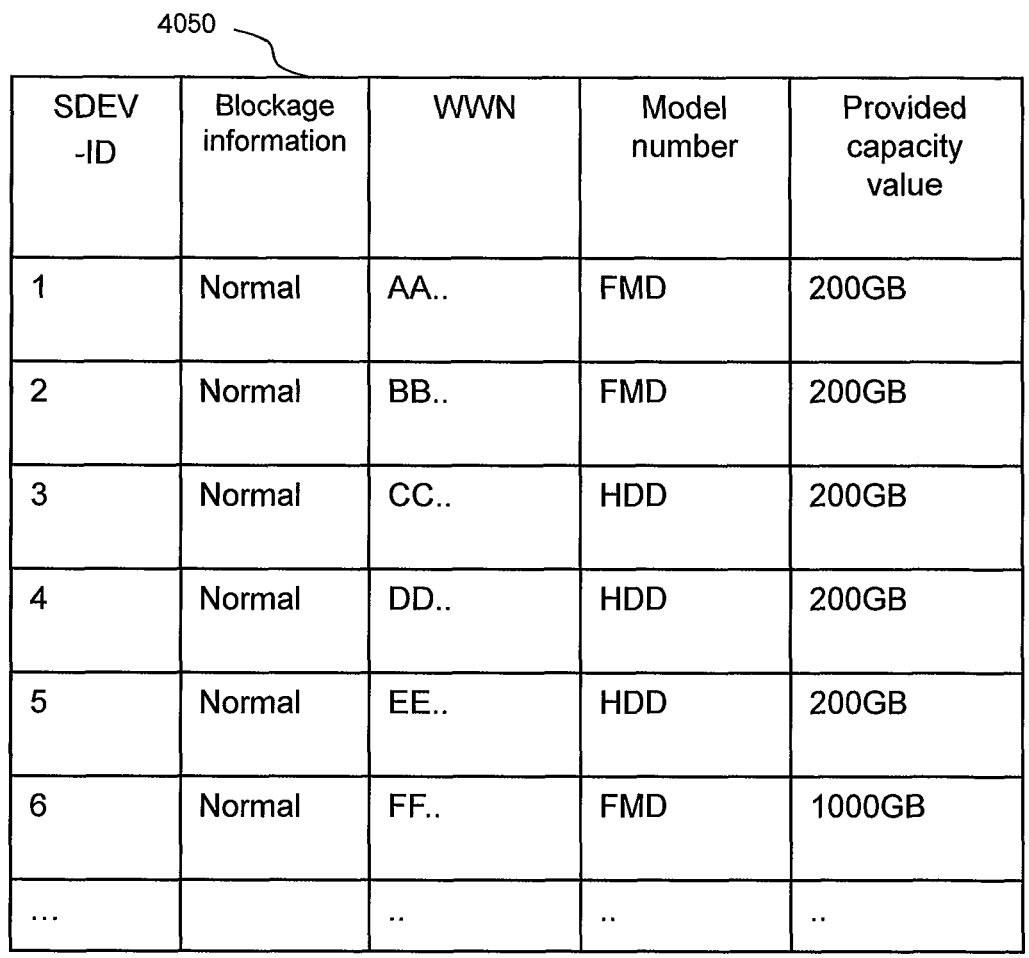
FIG. 5 is a diagram showing an example of SDEV information related to the first example.

FIG. 5 is a diagram showing an example of SDEV information related to the first example.

The SDEV information 4050 comprises the following (H1) through (H4) information for each SDEV identifier (SDEV-ID) corresponding to the respective SDEVs.

(H1) Blockage information: The blockage information is blocked status in a case where the relevant SDEV is in an unusable state, and when this is not the case, is normal status. Examples of unusable states include a hardware failure, a case in which the SDEV has been removed from the system, and a case in which the SDEV is the FMD 1030 and free area is either insufficient or depleted.

(H2) WWN (World Wide Name): This is the Fibre Channel communication identifier required for accessing a SDEV. In an actual Fibre Channel, a port number (may be called a port ID) is created based on the WWN, and since communications are carried out using this value, the port number may be registered. In addition to this, another identifier (for example, an IP address, a TCP/IP port number, an iSCSI Name, and so forth) may be substituted for communications between the storage controller 1010 and the SDEV.

(H3) SDEV model number: This information makes it possible to determine whether the SDEV is a HDD 1040, or a FMD 1030.

(H4) SDEV-provided capacity: The capacity is provided by the SDEVs.

In addition to the above-mentioned information, the SDEV information 4050 may also comprise information denoting the physical location of each FMD 1030 mounted in the storage system 1000.

FIG. 6 is a diagram showing an example of PG configuration information related to the first example.

The PG configuration information 4060 comprises the following (I1) through (I3) information for each identifier (PG-ID) of the respective parity groups (PG).

(I1) Blockage information: The blockage information is blocked status in a case where the PG is in an unusable state, and when this is not the case, is normal status. An unusable state is considered to be a case in which the events given as examples below occur multiple times.

(Event 1) Hardware failure (Event 2) SDEV removal (Event 3) Case where the storage controller 1010 receives a report that free areas are few or insufficient when the SDEV is a FMD 1030: Information that enables the above-mentioned events to be identified may be stored in place of the blockage information.

(I2) RAID level (I3) Number of SDEVs belonging to a parity group, and the SDEV identifiers As was explained hereinabove, the storage controller 1010 can allocate an address space to a parity group.

Figure 8:
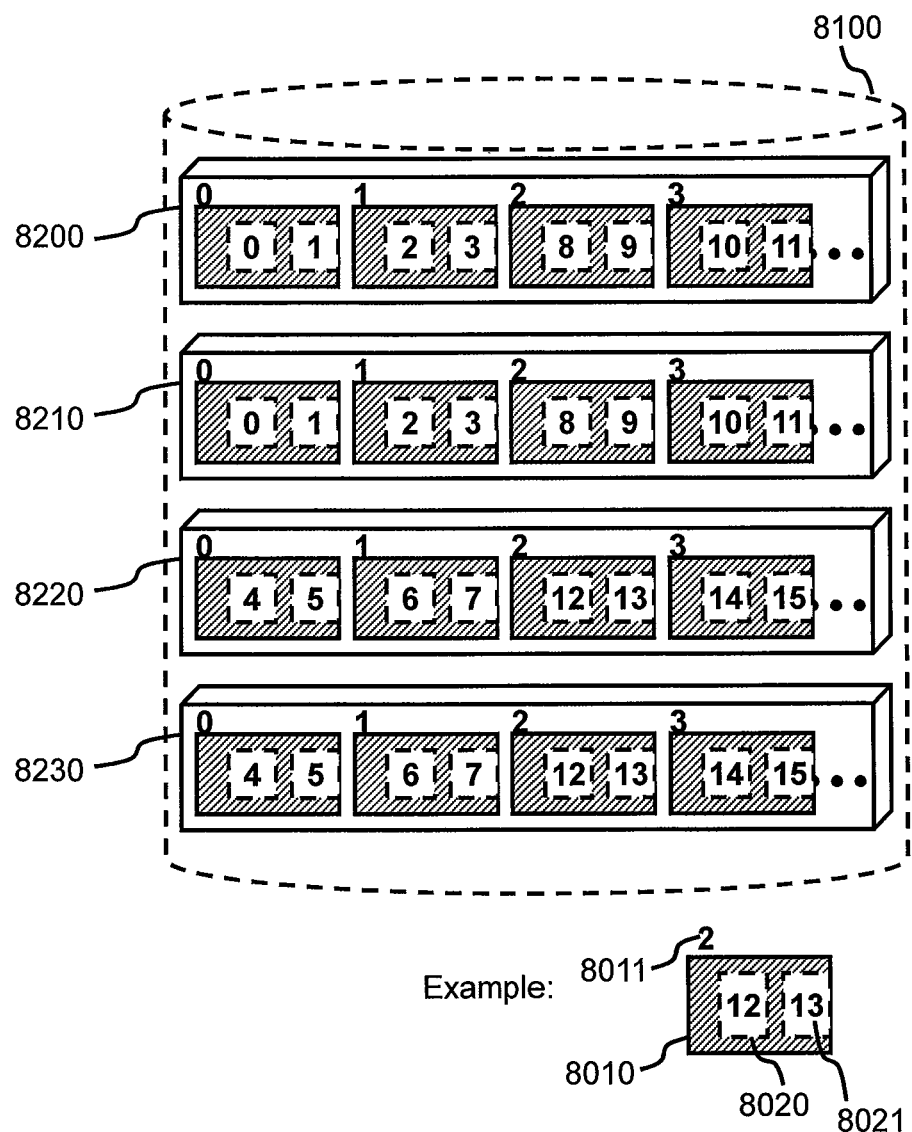
FIG. 8 is a first diagram showing an example of the relationship between an address space of an SDEV comprising a RAID and a FMD related to the first example.
Figure 9:
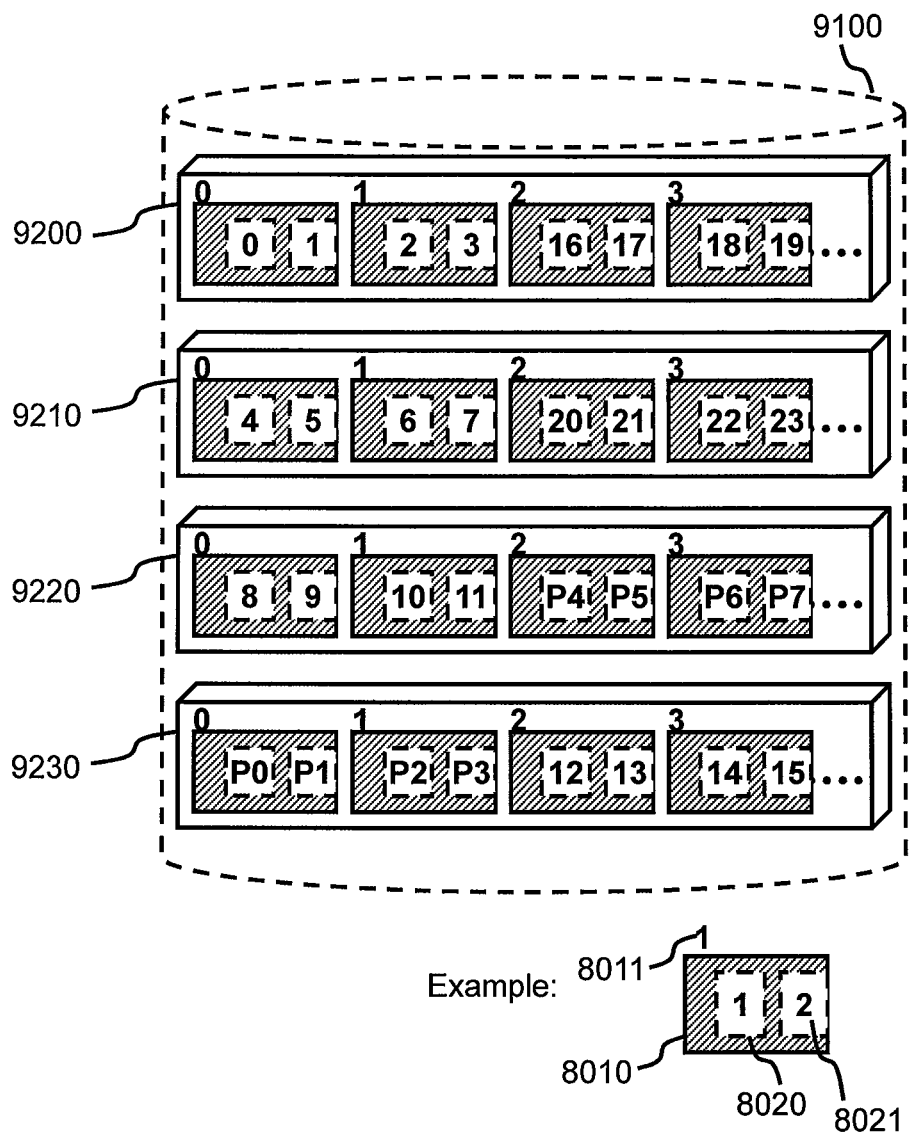
FIG. 9 is a second diagram showing an example of the relationship between the address space of the SDEV comprising a RAID and the FMD related to the first example.

FIG. 8 is a first drawing showing an example of the relationship of address spaces between an FMD related to the first example and SDEVs comprising a RAID. FIG. 9 is a second drawing showing an example of the relationship of address spaces between an FMD related to the first example and the SDEVs comprising the RAID. FIG. 8 shows an example of the relationship between a parity group address space [G] having a RAID 1+0 as an example, and a FMD 1030 address space [D]. FIG. 9 shows an example of the same relationship in a case where a RAID 5 is given as an example.

EXPLANATION OF THE EXAMPLES

FIG. 8 and FIG. 9 show examples in which a parity group 8100 is formed using four SDEVs 8200, 8210, 8222, and 8230. A hatched box 8010 shown in the example in the drawing denotes a block [D] of a SDEV, and reference sign 8011 denotes the address of this block [D]. A box 8020 having a dotted line as a framework inside the box 8010 denotes a block [G], which the storage controller 1010 has allocated to the parity group 8100, and reference sign 8021 denotes the address of the storage controller 1010-allocated block [G]. It can be supposed that the size of the block [G] of block 8020 is 512 bytes, the minimum block size capable of being provided under the SCSI standard, but another size may be used.

RAID 1+0:

In the case of RAID 1+0, as shown in FIG. 8, the storage controller 1010 allocates the same address space using two SDEVs for the purpose of mirroring (for example, SDEVs 8200 and 8210, and SDEVs 8220 and 8230), and carries out striping thereafter. In the case of striping, the storage controller 1010 switches the serial address space [G] to another SDEV for each stipulated number of blocks (hereinafter, will be called the number of contiguous blocks for striping) (for example, four in the block [G], and two in the block [D]). The stripe size (the size of an I/O carried out by reading/writing data from/to all the SDEVs inside the parity group) can be calculated using the following equation:

Stripe size=(number of contiguous block [G]s for striping)×(number of SDEVs/2)×(size of block [G]).

The explanation of RAID 1 will be omitted since RAID 1 is RAID 1+0 minus striping.

RAID 5:

In the case of RAID 5, as shown in FIG. 9, the storage controller 1010 also carries out a striping process using the number of contiguous blocks for striping as the unit, and allocates a parity storage area (in the example, the addresses from P0 to P3 is the area for storing the parity from address 0 through address 11). The stripe size in the case of RAID 5 can be calculated using the following formula:

Stripe size=(number of contiguous block [G]s for striping)×(number of SDEVs−1)×size of block [G]).

Figure 7:
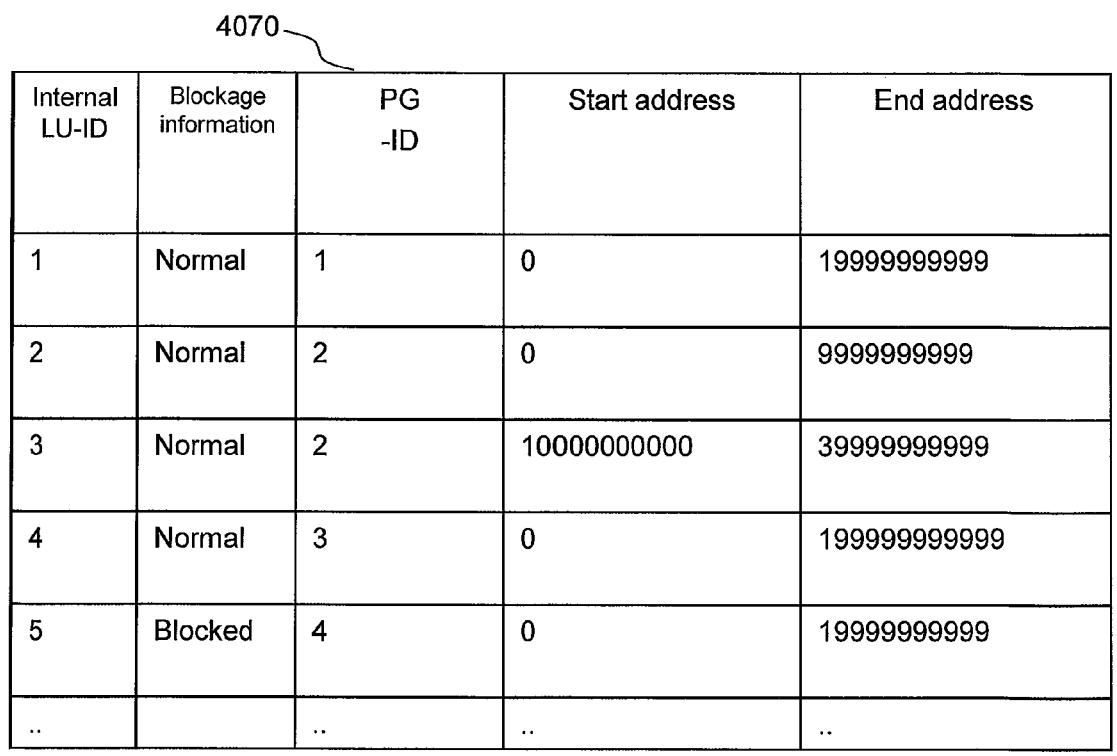
FIG. 7 is a diagram showing an example of internal LU configuration information related to the first example.

FIG. 7 is a diagram showing an example of internal LU configuration information related to the first example.

The internal LU configuration information 4070 comprises the following (J1) through (J4) information for each identifier (internal LU-ID) of the respective internal LU. A LU provided as a storage area to the host 1100 is provided externally in accordance with defining a path on the basis of this internal LU. "Externally" as used here may refer to another type of apparatus either instead of or in addition to the host 1100, for example a virtual switch or another storage system. In other words, another type of apparatus is able to issue an I/O request to the storage system either in place of or in addition to the host 1100.

(J1) Blockage information: The blockage information is blocked status in a case where the relevant internal LU is in an unusable state (for example, a case in which the parity group is blocked, or a case in which an area is not allocated to the relevant internal LU), and when this is not the case, is normal status.

(J2) PG identifier (PG-ID), start address [G], and end address [G]: This information denotes the identifier of the parity group used as the relevant internal LU storage area, a start block address [G] inside the parity group, and an end block address [G].

FIG. 13 is a diagram showing an example of LU path information related to the first example.

The LU path information 4080, for example, comprises the information of the following (K1) through (K3).

(K1) Identifier of virtual internal LU provided to the host 1100 (virtual internal LU-ID): The virtual internal LU will be explained further below.

(K2) WWN (or identifier of I/O port 1013): The WWN shows the port 1013 from which the virtual internal LU provided to the host 1100 is provided. A port number or other type of identifier may be used instead of the WWN. Hereinafter, either of these values will be used when describing a "port identifier".

(K3) LUN: The LUN denotes which LUN of the WWN (K2) will be provided as the virtual internal LU provided to the host.

Since only a limited number of LUN can be defined, there is no need to allocate a WWN and a LUN to all the virtual internal LU defined in the storage system 1000, and the LUN may be used efficiently by allocating a certain WWN and LUN to a certain virtual internal LU during a certain time period, and allocation the certain WWN and LUN to a different virtual internal LU during a different time period. In a case where an internal LU is provided directly to the host, the ID of the internal LU may be configured instead of the virtual internal LU-ID. This information comprises the virtual capacity (equivalent to the "capacity" column of FIG. 22) of the virtual internal LU, and a value representing the virtual capacity may be used when the storage controller informs the host of the virtual capacity.

FIG. 10 is a diagram showing an example of pool information related to the first example.

The pool information 4040A comprises the information of the following (a1) through (a3) for each pool ID (Pool-ID) and each segment ID (SEG-ID).

(a1) Allocation information denoting whether allocated or unallocated: This information is Yes in a case where the relevant segment virtual internal LU is allocated to a chunk, and is No when this is not the case.

(a2) Identifier of internal LU corresponding to a relevant segment, and start and end block [I] addresses (a3) MSB flag denoting the cell mode of the FMD 1030 in a case where the relevant segment is allocated from the FMD 1030

FIG. 11 is a diagram showing an example of VL conversion information related to the first example.

The VL conversion information 4040B comprises the information of the following (b1) through (b4) for each virtual internal LU-ID and each chunk ID inside a virtual internal LU.

(b1) Virtual capacity of relevant virtual internal LU (b2) ID of segment allocated to relevant chunk, and ID of pool comprising relevant segment (b3) Segment ID of segment allocated to relevant chunk: A NULL value is stored in a case where there has not been an allocation.

(b4) Access measurement value for the relevant chunk: The access measurement value, for example, may include the number of reads/writes, a read/write response time, the number of reads/writes per unit of time (IOPS), and either an average or a maximum response time.

In a case where segments are not simultaneously provided to one virtual internal LU from two pools, the ID of the storage pool corresponding to each virtual internal LU may be managed without the need to manage a pool ID for each chunk. Since the capacity is information related to a virtual internal LU, the capacity information may be stored as different information. For example, the capacity of each virtual internal LU may be stored as virtual internal LU configuration information. In accordance with this, needless to say, processing related to various types of capacities will reference and create the relevant information. The access measurement value may be stored in the information shown in FIG. 10 as content corresponding to a segment rather than a chunk. This is the same for management-side information, which will be explained further below.

FIG. 12 is a diagram showing an example of cell mode information related to the first example.

The cell mode information comprises a cell mode value for each pool ID (Pool-ID) and each segment ID (SEG-ID), and the number of cell rewrites. There are cases in which a pool comprises a segment comprising an HDD-provided block [D], and an invalid value (described as HDD in the drawing) is configured as the cell mode value for this segment. Other possible cell mode values are as follows.

LSB only: This value denotes the fact that the relevant segment uses a storage area, which uses only the LSB of the FM cell of the FMD 1030, to store block [D] data of a substantial address X.

LSB/MSB: This value denotes the fact that the relevant segment uses a storage area, which uses either the LSB or the MSB of the FM cell of the FMD 1030, to store block [D] data of a substantial address X.

At the finest granularity, the cell mode can be configured having one FM cell as the unit, and one cell mode value may be allocated to one FM cell. However, realistically speaking, the cell mode value may be managed using one page, one erase block, one FMD 1030, one parity group, one internal LU, or one virtual internal LU as the unit.

The number of cell rewrites is either the number of cell programming and cell erase cycles or the number of cell erases of the FMD internal configuration information 2013.
<4.3. Parity Group Definition>.

Figure 14:
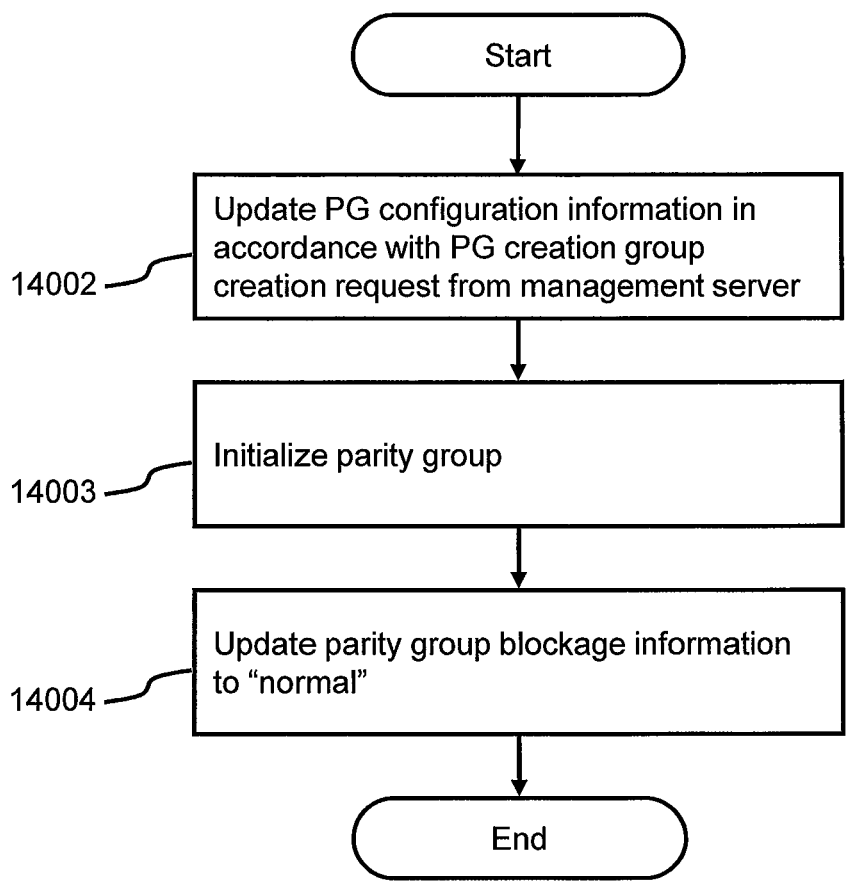
FIG. 14 is a flowchart of an example of a PG creation process related to the first example.

FIG. 14 is a flowchart of an example of a PG creation process related to the first example. The PG creation process is executed by the configuration control program 4030.

The configuration control program 4030 receives a parity group definition request comprising the identifiers of multiple SDEVs (the identifier can be replaced by the mounting location in the physical storage system 1000 or logical identification information) and a RAID level from the management server 1200, and based on information associated with this request (each FMD identifier and RAID level), creates and/or updates the PG configuration information 4060 (Step 14002). The configuration control program 4030 configures the blockage information of the parity group corresponding to the PG configuration information 4060 to blocked.

Next, the configuration control program 4030 initializes the parity group (to include the creation of mirror data and parity data) (Step 14003).

Next, the configuration control program 4030 changes the parity group blockage information corresponding to the PG configuration information 4060 from blocked to normal, indicates that the parity group is usable, and returns a complete message to the management server 1200 (Step 14004).
<4.4. Internal LU Definition>.

Figure 15:
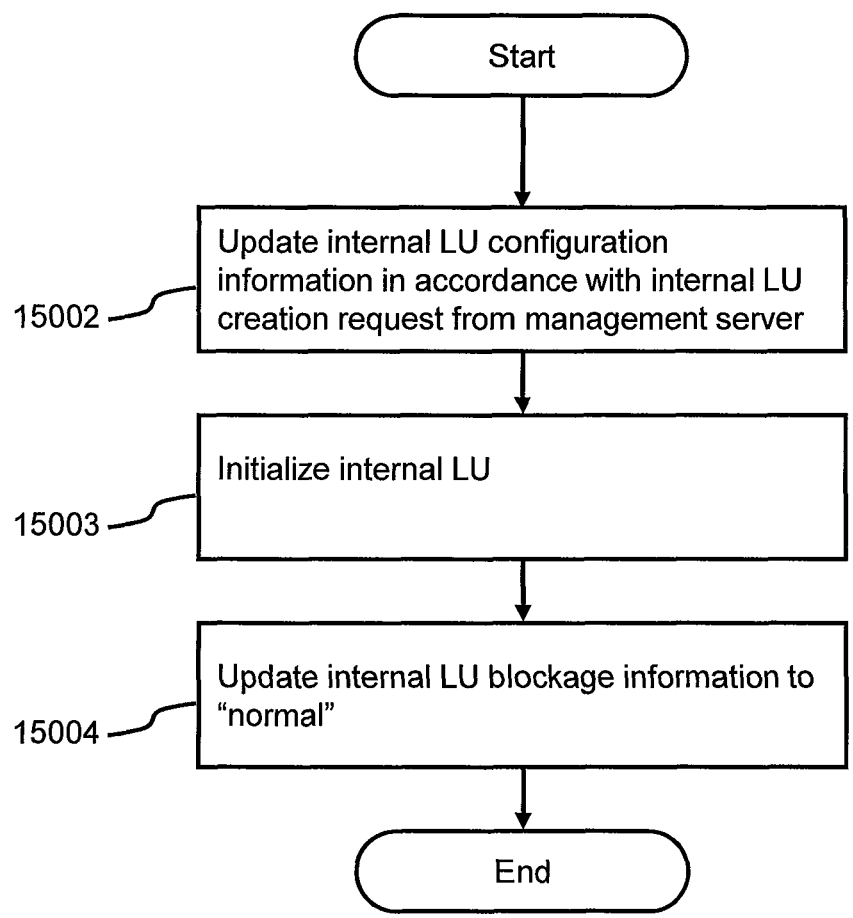
FIG. 15 is a flowchart of an example of an internal LU creation process related to the first example.

FIG. 15 is a flowchart of an example of an internal LU creation process related to the first example. The internal LU creation process is executed by the configuration control program 4030.

The configuration control program 4030, upon receiving from the management server 1200 an internal LU definition request comprising either part or all of the information of (Parameter 1) through (Parameter 3) given as examples below, creates and/or updates the internal LU configuration information 4070 based on the information associated with the relevant request (Step 15002). The configuration control program 4030 configures the blockage information of the internal LU corresponding to the internal LU configuration information 4070 to blocked.

(Parameter 1) Parity group identifier (Parameter 2) Parity group [G] start address (Parameter 3) Either internal LU storage area or parity group [G] end address With regard to (Parameter 3), the end address is an integral multiple of the striping size of the relevant parity group, and the configuration control program 4030 may carry out a check to avoid one piece of parity data being shared by multiple internal LU. (Parameter 2) and (Parameter 3) have been specified using the block size of the parity group, but the configuration control program 4030 may accept a relevant parameter value having the striping size as the unit. Similarly, in a case where the parity group [G] start address and [G] end address are to be conclusively determined, the configuration control program 4030 may accept a parameter in accordance with a different format.

Next, the configuration control program 4030 carries out initialization processing for the internal LU as needed (Step 15003). For example, the configuration control program 4030 may create an internal LU management area as part of the initialization process.

Next, the configuration control program 4030 shows that the internal LU is usable by changing the blockage information of the internal LU corresponding to the internal LU configuration information 4070 from blocked to normal, and returns a complete message to the management server 1200 (Step 15004).
<4.5 LU Path Definition>.

Figure 16:
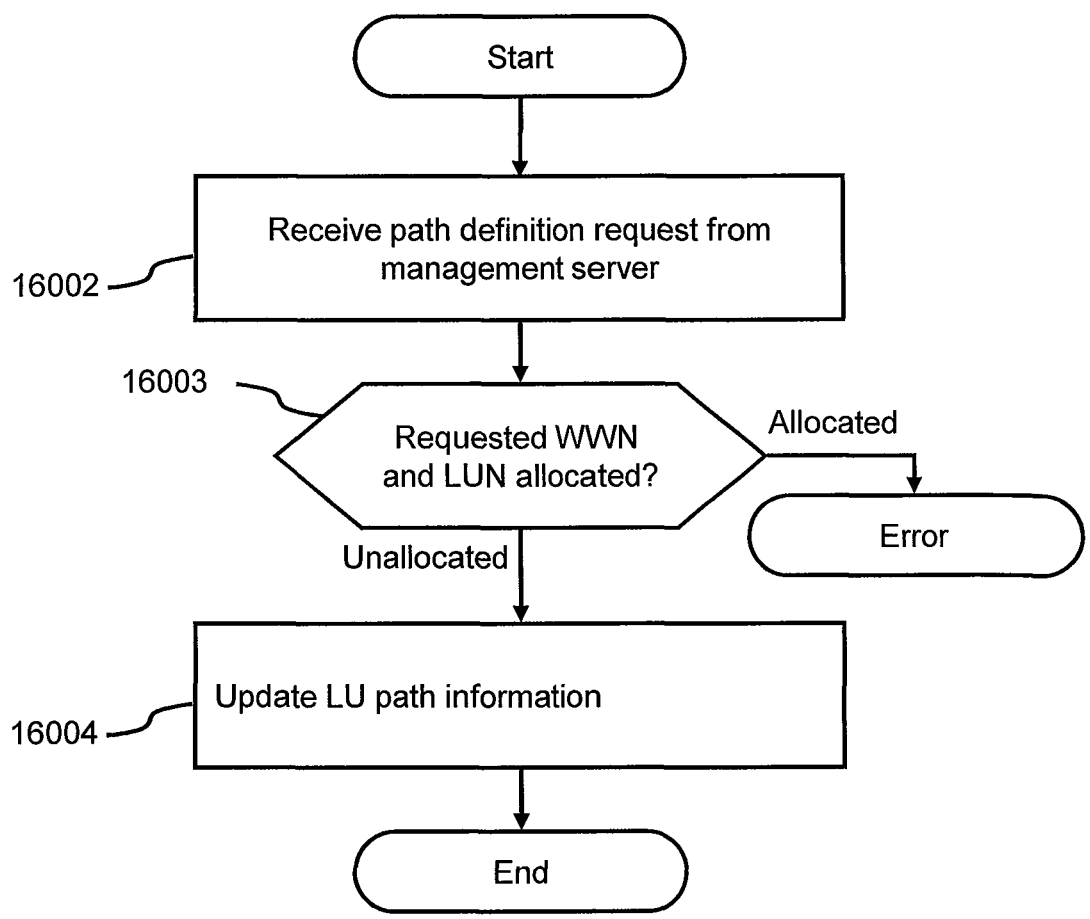
FIG. 16 is a flowchart of an example of a path definition process related to the first example.

FIG. 16 is a flowchart of an example of a path definition process related to the first example. The path definition process is executed by the configuration control program 4030.

The configuration control program 4030 receives from the management server 1200 a path definition request comprising the identifier of a virtual internal LU, port information (in the case of identification information, which is ultimately capable of being converted to either the identifier or the WWN of the I/O port 1013, the port information may be information other than this), and a LUN (Step 16002).

Next, the configuration control program 4030 checks whether the WWN and LUN specified in the request have yet to be allocated (Step 16003), and in a case where allocation is complete, responds with an error and ends the processing.

Alternatively, in a case where allocation has not been completed, the configuration control program 4030 creates and/or updates the LU path information 4080 based on the information associated with the request, and returns a complete message to the management server 1200 (Step 16004).

The configuration control program 4030 may also define multiple paths for the virtual internal LU in order to multiplex the access paths from the host 1100. In the case of a delete process for a defined path, the configuration control program 4030 may use the virtual internal LU identifier or a combination of the WWN and the LUN from the management server 1200 to find an entry corresponding to the LU path information and delete the path setting by deleting the relevant entry. Instead of specifying a WWN and a LUN in the LU path definition request, the configuration control program 4030 may retrieve and allocate a free WWN and LUN.

<4.6. Storage Pool Definition>.

Figure 29:
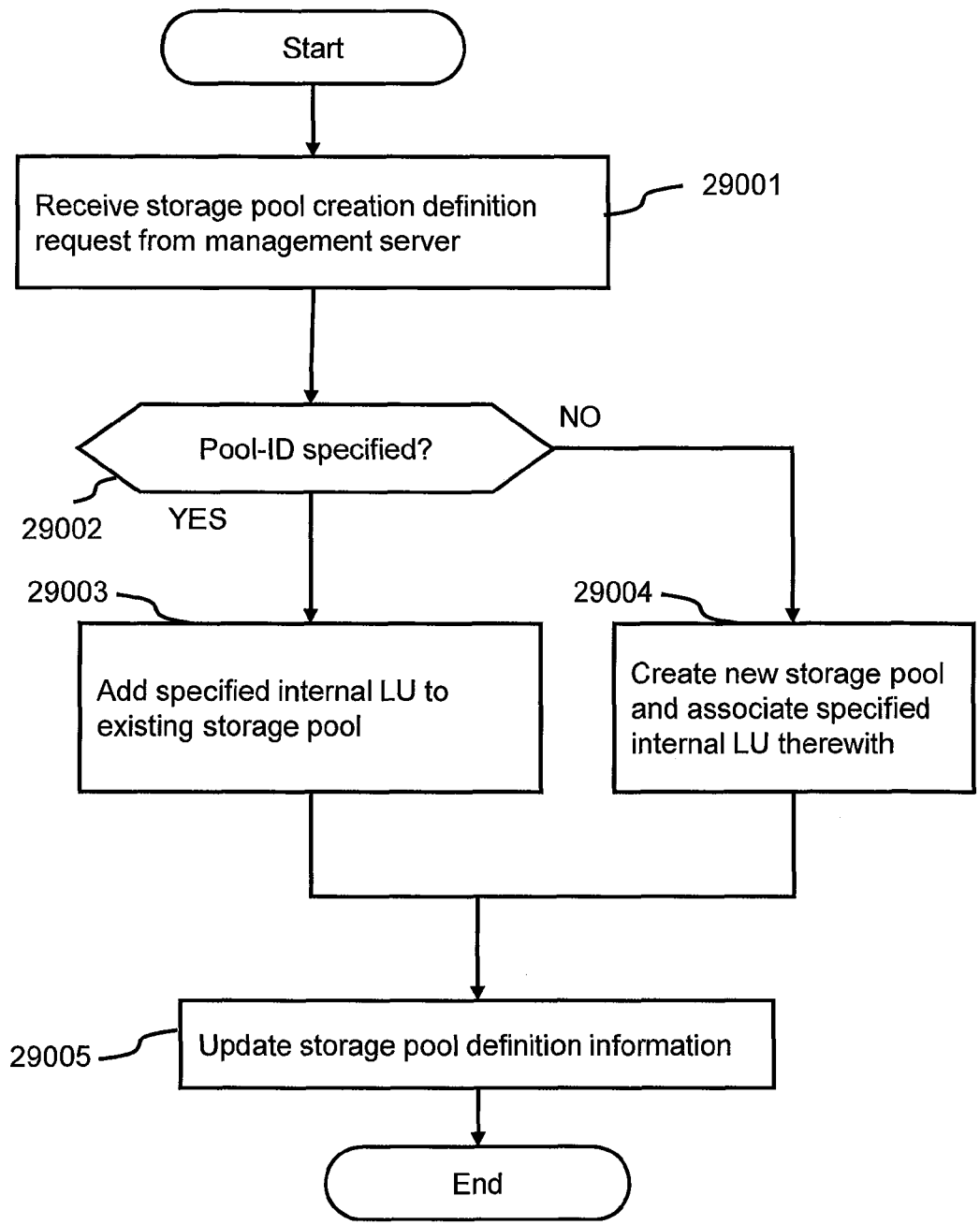
FIG. 29 is a flowchart of an example of a storage pool creation/updating process related to the first example.

FIG. 29 is a flowchart of an example of a storage pool creation/updating process related to the first example. The storage pool creation/updating process is executed by the configuration control program 4030.

The configuration control program 4030 receives from the management server 1200 a storage pool definition request comprising either a part or all of the information of a (Parameter 1) and a (Parameter 2) given as examples below (Step 29001).

(Parameter 1) Storage pool identifier (Pool-ID)
(Parameter 2) LUID of internal LU (one or more are specified)

Next, the configuration control program 4030 checks whether a storage Pool-ID is specified in the storage pool definition request (Step 29002). When the result is that a Pool-ID is specified (YES in Step 29002), the configuration control program 4030 associates the specified internal LU with the storage pool corresponding to the specified Pool-ID in the pool information 4040A (Step 29003), and advances the processing to Step 29005.

Alternatively, in a case where a Pool-ID is not specified (NO in Step 29002), the configuration control program 4030 picks a new storage pool number, creates a corresponding entry in the pool information 4040A, associates this entry with the specified internal LU (Step 29004), and advances the processing to Step 29005.

In Step 29005, the configuration control program 4030 allocates a SEG-ID to a segment of the added internal LU, and updates the pool information 4040A. In the initial state, the configuration control program 4030 configures the allocation column to No and configures the MLB flag to No.

<4.6a. Virtual Internal LU Definition>.

Figure 30:
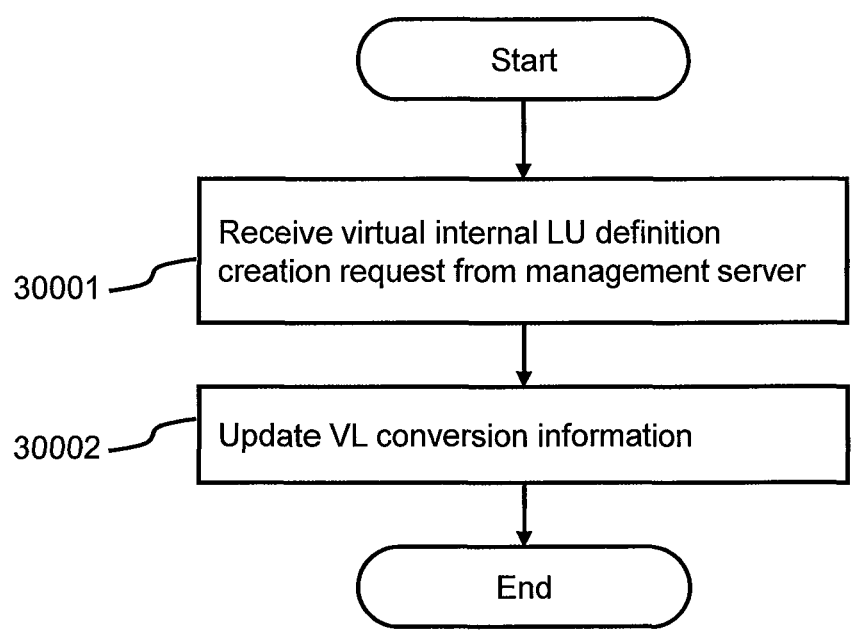
FIG. 30 is a flowchart of an example of a virtual internal LU creation process related to the first example.

FIG. 30 is a flowchart of an example of a virtual internal LU creation process related to the first example. The virtual internal LU creation process is executed by the configuration control program 4030.

The configuration control program 4030 receives from the management server 1200 a virtual internal LU definition request comprising either part or all of the information of a (Parameter 1) and a (Parameter 2) given as examples below (Step 30001).

(Parameter 1) Storage pool identifier
(Parameter 2) Virtual capacity of virtual internal LU Next, the configuration control program 4030 configures a newly created virtual internal LU-ID, a virtual capacity, a specified Pool-ID, and a chunk ID for the amount of capacity in the VL conversion information 4040B based on the information associated with the received request (Step 30002). In the initial state, null is configured in the SEG-ID. The SEG-ID of the VL conversion information 4040B is updated when a write occurs and a new page is allocated. The virtual capacity, as has been explained hereinabove, may be configured in information other than the VL conversion information.

<4.6b. Cell Mode Setup/Change>.
<4.6b.1. Cell Mode Information Update Using Write Process>

Figure 31:
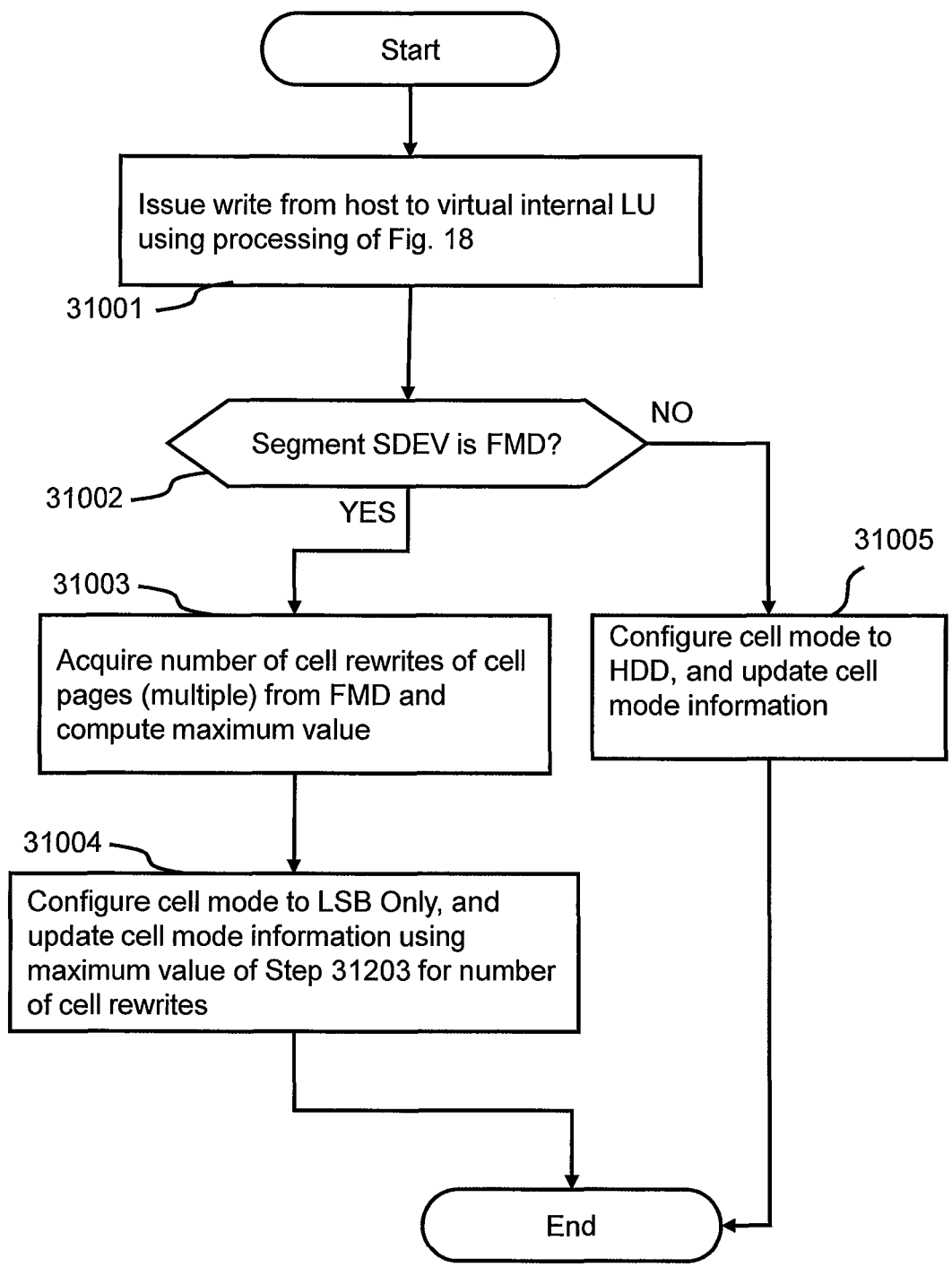
FIG. 31 is a flowchart of an example of a cell mode information updating process during a write related to the first example.

FIG. 31 is a flowchart of an example of a cell mode information updating process during a write related to the first example.

When a write is generated from the host 1100 to an internal LU (Step 31001), the configuration control program 4030 references the pool information 4040A, the internal LU information 4070, and the SDEV information 4050, checks the SDEV information of the write-target segment, and checks whether or not the SDEV is the FMD 1030 (Step 31002).

When the result is that the SDEV is the FMD 1030 (YES in Step 31002), the configuration control program 4030 acquires from the FMD internal configuration information notification program 2014 the number of cell rewrites for all the pages corresponding to the relevant segment, and computes a maximum value (or an average value, a minimum value, or another statistical value) of these (Step 31003). Next, the configuration control program 4030 configures the cell mode to LSB Only, uses the number of cell programming/cell erase cycles as the maximum value computed in Step 31003, configures this information in the cell mode information 4090 (Step 31004), and ends the processing.

Alternatively, in a case where the SDEV is not the FMD 1030 (YES in Step 31002), the configuration control program 4030 configures the cell mode to HDD, leaves the number of cell rewrites blank, configures this information in the cell mode information 4090 (Step 31005), and ends the processing.

This processing does not necessarily have to be carried out in units of one write. This processing may also be carried out at a different time from a write process. As described hereinabove, since the association between the block [D] of the FMD 1030 and a page changes dynamically, the corresponding relationship between a segment and a page is not always fixed. For this reason, the number of cell rewrites is acquired from the FMD 1030 as the number of rewrites of the FMD 1030, and this value may be used in Step 31003. The number of cell rewrites of the FMD 1030 is considered the maximum value of the number of rewrites of all the pages (spare pages may be excluded) included in the FMD 1030, but in addition, an average value, a total value, or another statistical value may be employed instead of the maximum value.

As described hereinabove, the segment size is larger than the page size, and as such, even when the page(s) corresponding to a segment change over the course of several writes, it is assumed that the affect of this will be slight compared to the total number of pages related to the segment. In accordance with this, as described above, prescribing the block [D] related to a segment to the FMD 1030 makes it possible to expect that the correct value will be correspondingly acquired in a case where a statistical value of the number of rewrites of the corresponding pages has been acquired.

These numbers of cell rewrites may be computed by the FMD controller 2010 and sent to the storage controller, but the storage controller may also compute the number of rewrites directly. The number of rewrites may also be obtained using a different method.

<4.6b.2 Cell Mode Change>.

Figure 32:
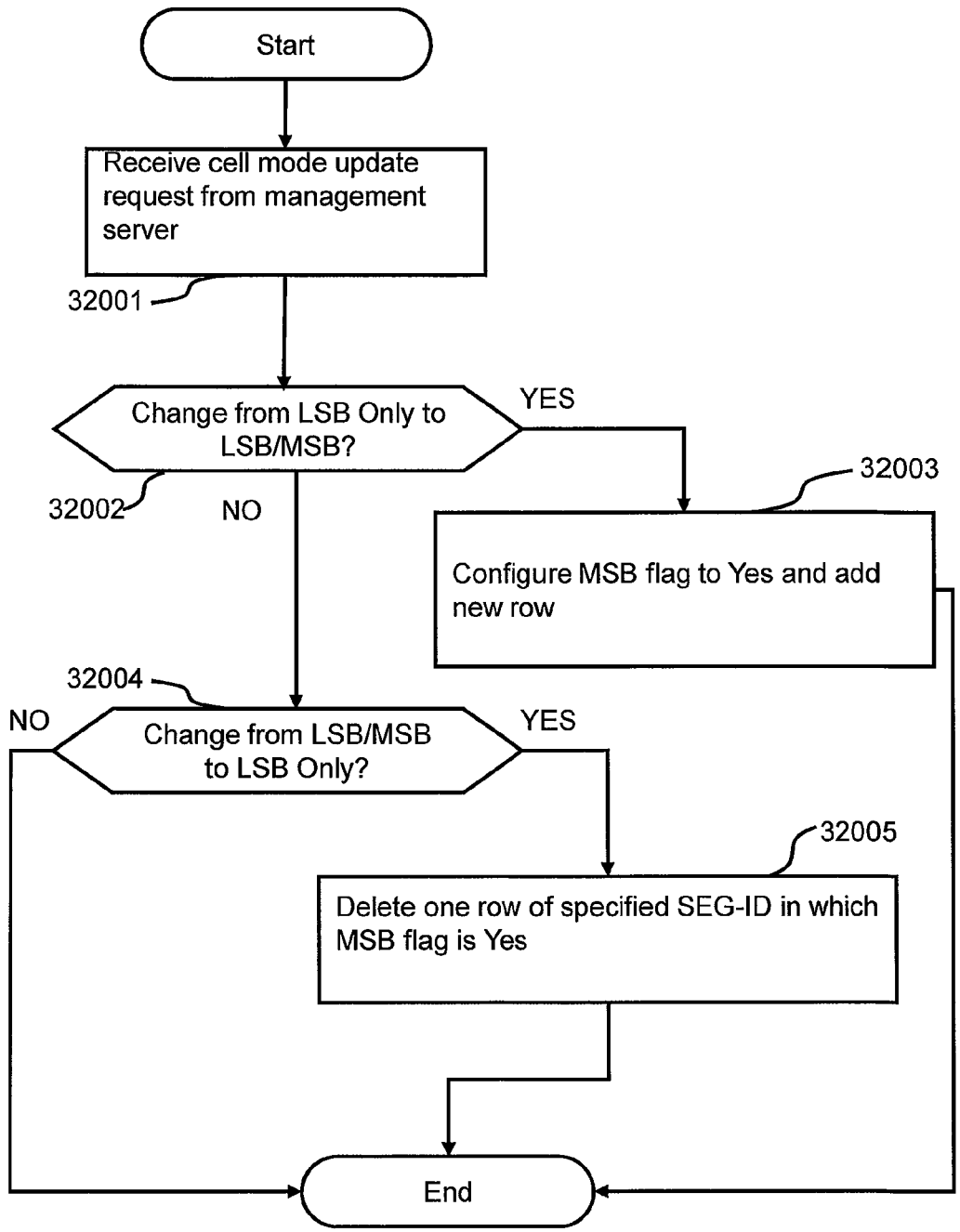
FIG. 32 is a flowchart of an example of a cell mode information changing process upon receipt of a cell mode change process related to the first example.

FIG. 32 is a flowchart of an example of a cell mode information changing process upon receipt of a cell mode change process related to the first example.

The configuration control program 4030, upon receiving from the management server 1200 a cell mode information update request comprising either part or all of the information of (Parameter 1) through (Parameter 2) given as examples below, updates the cell mode information 4090 based on the information associated with the relevant request (Step 32001).

(Parameter 1) Storage pool identifier (Pool-ID)
(Parameter 2) Segment identifier (SEG-ID)
(Parameter 3) Cell mode value Next, the configuration control program 4030 checks Parameter 3, and checks whether or not the cell mode value has changed from LSB Only to LSB/MSB (Step 32002). In a case where the cell mode value has changed from LSB Only to LSB/MSB (YES in Step 32002), the configuration control program 4030 searches the pool information 4040A for a row having the Pool-ID specified in Parameter 1, and the SEG-ID specified in Parameter 2, as well as the internal LU-ID and the start-end addresses. Next, the configuration control program 4030 adds one row to the pool information 4040A having the Parameter 1 value in the Pool-ID column, a new segment number in the SEG-ID column, No in the allocation column, the value of the retrieved internal LU-ID in the internal LU-ID column, Yes in the MSB flag column, and the retrieved values in the start-end addresses column (Step 32003), and ends the processing.

Alternatively, in a case where the cell mode value has not changed from LSB Only to LSB/MSB (NO in Step 32002), the configuration control program 4030 checks Parameter 3, and checks whether or not the cell mode value has changed from LSB/MSB to LSB Only (Step 32004). When the result is that the cell mode value has not changed from LSB/MSB to LSB Only (NO in Step 32004), the configuration control program 4030 ends the processing.

Alternatively, in a case where the cell mode value has changed from LSB/MSB to LSB Only (YES in Step 32004), the configuration control program 4030 deletes the one row from the pool information 4040A in which the MSB flag is YES with respect to the specified SEG-ID (Step 32005).

In this example, the changing of the cell mode is executed on the basis of the segment identifier, but the present invention is not necessarily limited to this. For example, in a case where the cell mode of an internal LU changes in units of internal LUs, the configuration control program 4030 may specify the start-end addresses [I] of the internal LU or the identifier of the internal LU. In a case where the cell mode changes in units of parity groups, the configuration control program 4030 may specify the start-end addresses [G] of the parity group or the identifier of the parity group. In a case where the cell mode changes in units of FMDs, the configuration control program 4030 may specify the start-end addresses [D] of the FMD or the identifier of the FMD. Furthermore, in a case where the cell mode changes in units of FM cells, the configuration control program 4030 may specify the identifier of the FM cell.

<4.7 Write Process>.

Figure 17:
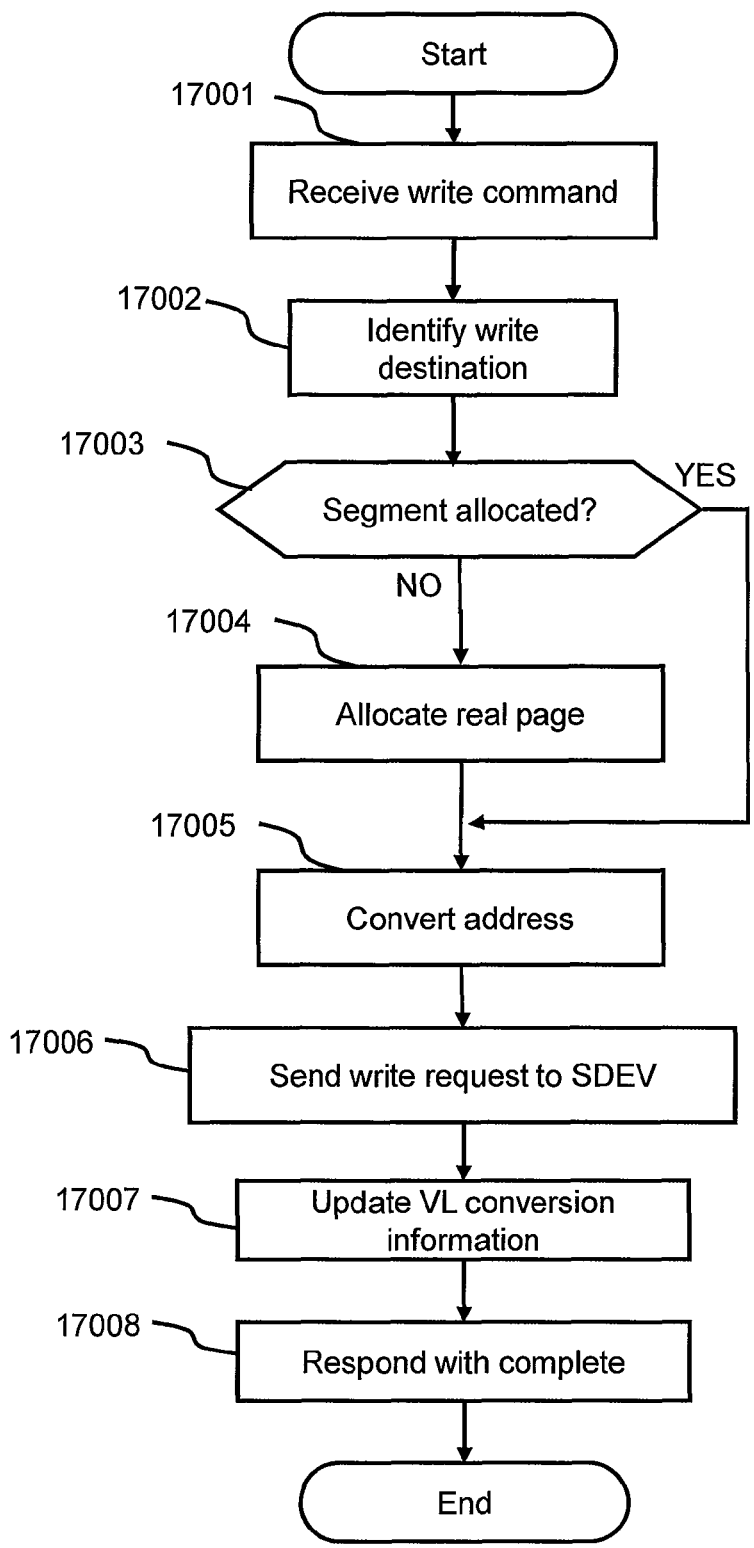
FIG. 17 is a flowchart of an example of a write process related to the first example.

FIG. 17 is a flowchart of an example of a write process related to the first example.

The I/O processing program 4010, upon receiving a write request (a write command and write data) from the host 1100 (Step 17001), uses I/O information in the received write request to identify the ID of the write-destination virtual internal LU and a chunk ID (Step 17002).

Next, the I/O processing program 4010 uses the VL conversion information 4040B to check whether or not a segment is allocated to the identified write-destination chunk (Step 17003).

When the result is that a segment is allocated (YES in Step 17003), the I/O processing program 4010 advances the processing to Step 17005. Alternatively, in a case where a segment is not allocated (NO in Step 17003), the I/O processing program 4010 checks the pool information 4040A and allocates an unallocated segment to the chunk. Thereafter, the I/O processing program 4010 changes the pool information 4040A allocation column corresponding to the allocated segment to Yes. The I/O processing program 4010 also respectively configures the SEG-ID and the MSB flag of the currently allocated segment in the SEG-ID column and the MSB flag column of the VL conversion information 4040B (Step 17004), and advances the processing to Step 17005.

In Step 17005, the I/O processing program 4010 converts the address [I] of the write-target segment from the pool information 4040A to the SDEV identifier and the SDEV block address [D] in accordance with computing the striping and converting the block size.

Next, the I/O processing program 4010 sends a write request comprising the converted block address [D] and the MSB flag of the write-target segment to the converted SDEV (Step 17006). In a case where the MSB flag is Yes here, the I/O processing program 4010 configures the LUN of the write request to the SDEV to 1, and in a case where the MSB flag is No, configures the LUN of the write request to the SDEV to 0. Prior to writing the write data to the SDEV, the I/O processing program 4010 may store the write data temporarily in the cache memory.

Next, the I/O processing program 4010 receives write-complete information from the SDEV, and updates the access measurement information of the VL conversion information 4040B with respect to the segment corresponding to the block address [D] for which the write was executed (Step 17007). The I/O processing program 4010 executes the cell mode information update process (FIG. 31), and updates the cell mode information 4090. Then the I/O processing program 4010 responds to the host 1100 with complete (Step 17008).

The preceding is the write process. In a case where the write data is temporarily stored in the cache memory, the processing is carried out asynchronously to the write request from Step 17005 onward. In addition, in a case where the cache memory is used, the process for searching for a segment in Step 17004 may be carried out after temporarily storing the write data in the cache memory. Information as to whether the temporarily stored write data should be written to the LSB or written to the MSB may be included in the cache memory area management information.

<4.8 Read Process>.

Figure 18:
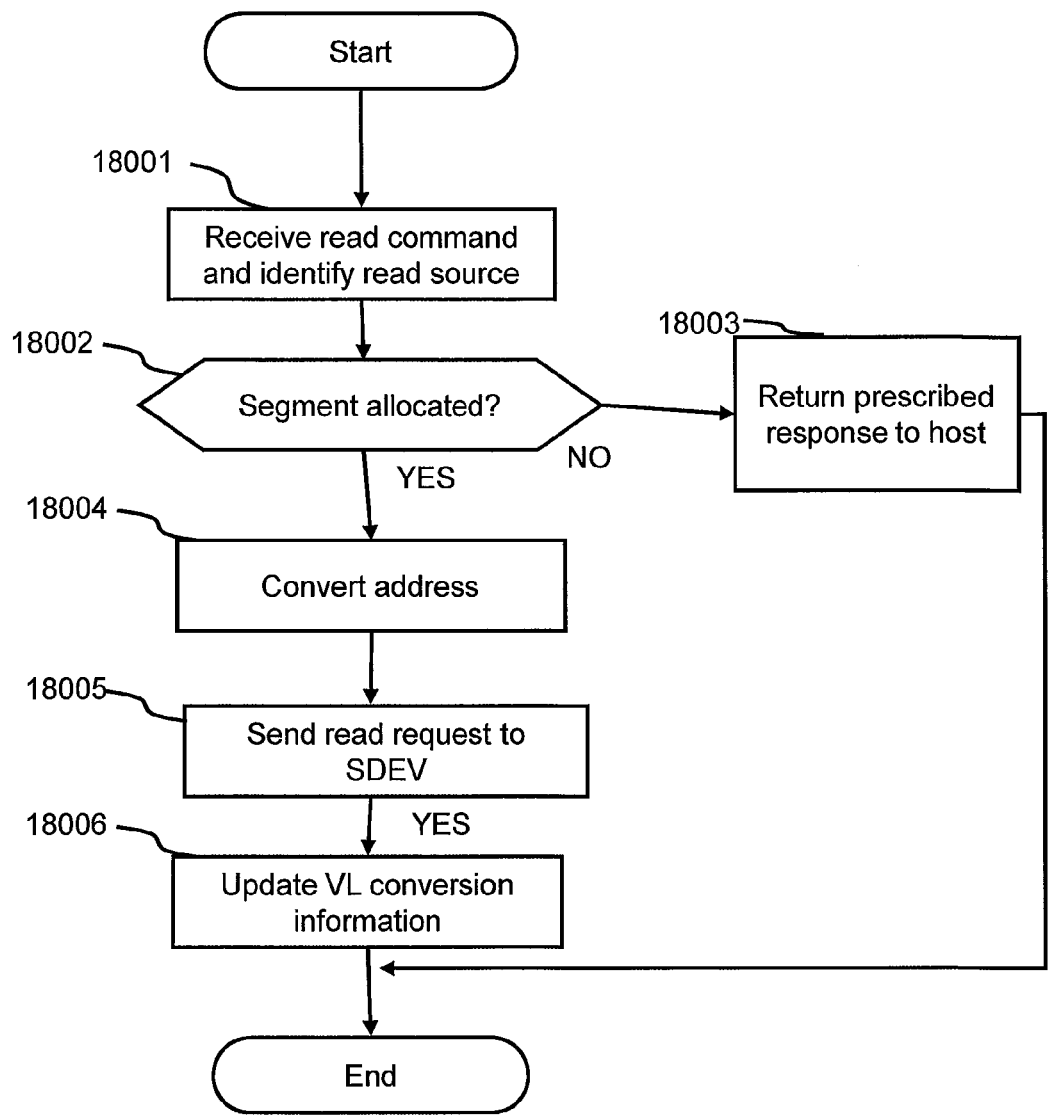
FIG. 18 is a flowchart of an example of a read process related to the first example.

FIG. 18 is a flowchart of an example of a read process related to the first example.

The I/O processing program 4010, upon receiving a read request (a read command) from the host 1100 (Step 18001), identifies the ID of the read-source virtual internal LU and a chunk ID from the I/O destination information of the received read command. In a case where the target chunk ID data exists in the cache memory 1020, the I/O processing program 4010 responds to the host 1100 with this read-target data and ends the corresponding flow of processing.

The I/O processing program 4010 checks whether a segment is allocated to the specified chunk ID based on the VL conversion information 4040B (Step 18002). When the result is that a segment is not allocated (NO in Step 18002), the I/O processing program 4010 responds to the host 1100 with a prescribed response (for example, data expressing zeros) (Step 18003), and ends the processing.

Alternatively, in a case where a segment is allocated (YES in Step 18002), the I/O processing program 4010 checks the SEG-ID and the MSB flag of the segment corresponding to the specified chunk ID based on the VL conversion information 4040B, and, in addition, based on the start address and the end address of the pool information 4040A, converts the read-target segment address [I] to a SDEV identifier and a SDEV block address [D] in accordance with computing the striping and converting the block size (Step 18004).

Next, the I/O processing program 4010 sends a read request comprising the converted block address [D] and the read-target segment MSB flag to the converted SDEV (Step 18005). In a case where the MSB flag is Yes here, the I/O processing program 4010 configures the LUN of the read request to the SDEV to 1, and in a case where the MSB flag is No, configures the LUN of the read request to the SDEV to 0.

Next, the I/O processing program 4010 receives read-complete information from the SDEV, updates the access measurement information of the VL conversion information 4040B with respect to the segment corresponding to the block address [D] for which the read was executed (Step 18006), and ends the processing.

<4.9. Data Migration>.

Figure 19:
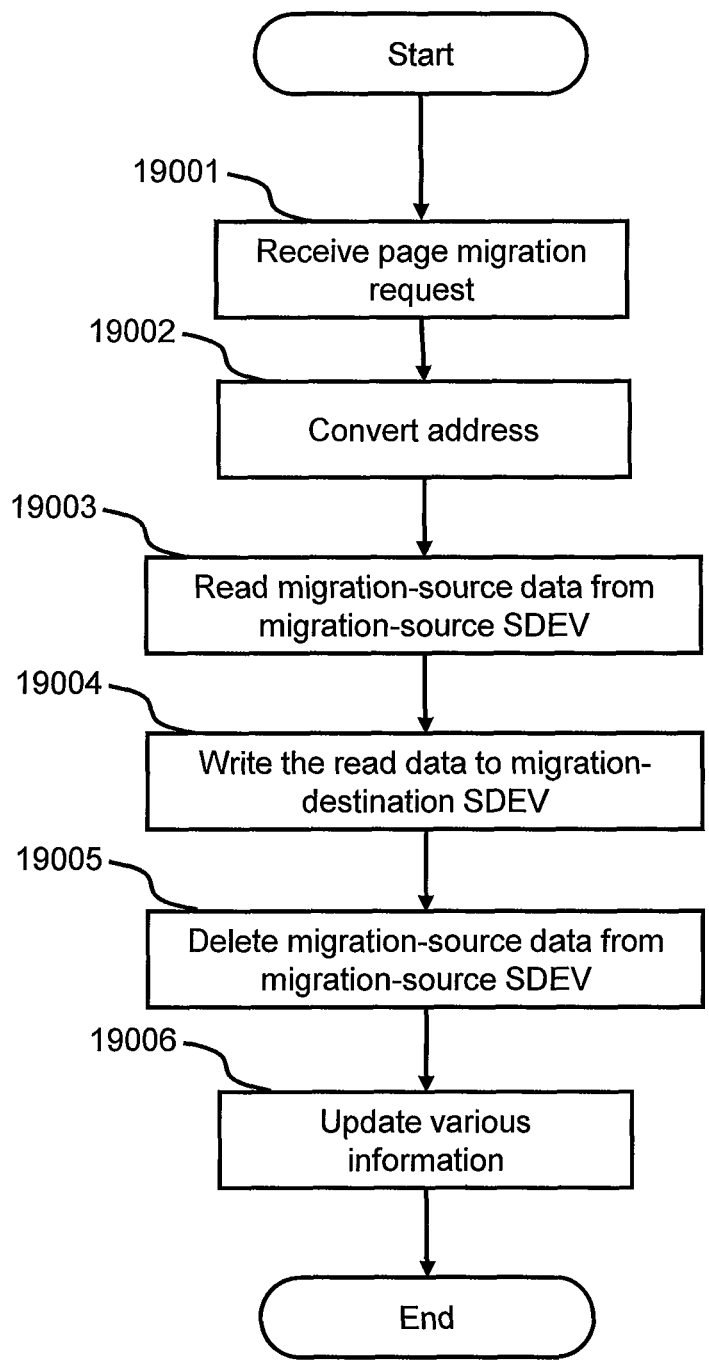
FIG. 19 is a flowchart of an example of a data migration process related to the first example.

FIG. 19 is a flowchart of an example of a data migration process related to the first example.

The configuration control program 4030 receives from the management server 1200 a data migration request comprising either part or all of the information of (Parameter 1) through (Parameter 10) given as examples hereinbelow (Step 19001).

(Parameter 1) Identifier of migration-source storage
(Parameter 2) Identifier of migration-source storage pool
(Parameter 3) Identifier of migration-source segment
(Parameter 4) MSB flag of migration-source segment
(Parameter 5) Start-end addresses [I] of migration-source segment
(Parameter 6) Identifier of migration-destination storage
(Parameter 7) Identifier of migration-destination storage pool
(Parameter 8) Identifier of migration-destination segment
(Parameter 9) MSB flag of migration-destination segment
(Parameter 10) Start-end addresses [I] of migration-destination segment In a case where the configuration control program 4030 can identify the parameters included in the relevant request as the chunk and the new segment corresponding to the chunk, i.e., the so-called data migration-destination segment, parameters other than the above-mentioned parameters may be used. For example, the IDs of the chunk and the segment are examples of parameters, and the chunk being specified by the block [I] address is another example of a parameter. In accordance with this, the migration-source segment may be identified from the VL conversion information as the segment allocated to the specified chunk. As another example, the migration-source segment ID and the migration-destination segment ID may be specified.

The configuration control program 4030 respectively converts the addresses [I] of the specified migration-source segment and migration-destination segment to a SDEV identifier and a SDEV block address [D] in accordance with computing the striping and converting the block size (Step 19002).

The configuration control program 4030 sends a read request comprising the converted block address [D] and the MSB flag of the read-target segment to the converted migration-source SDEV, and reads the corresponding data (Step 19003). In a case where the MSB flag is Yes here, the configuration control program 4030 configures the LUN of the read request to the SDEV to 1, and in a case where the MSB flag is No, configures the LUN of the read request to the SDEV to 0.

Next, the configuration control program 4030 sends a write request comprising the converted block address [D], the MSB flag, and the data read in Step 19003 to the converted migration-destination SDEV (Step 19004). In a case where the MSB flag is Yes here, the configuration control program 4030 configures the LUN of the write request to the SDEV to 1, and in a case where the MSB flag is No, configures the LUN of the write request to the SDEV to 0. The configuration control program 4030 may store the write data temporarily in the cache memory 1020 prior to writing the write data to the SDEV.

The configuration control program 4030 sends a write request comprising the converted block address [D], the MSB flag, and zero data to the converted migration-source SDEV (Step 19005). The migration-source SDEV data is deleted in accordance with this operation. The processing of Step 19005 may be carried out asynchronously in a case where it comes after the processing of Step 19004. That is, the zero data write need not be executed immediately after the data write to the migration-destination SDEV, and, for example, may be executed when a new write request has come for the migration-source segment. This data does not have to be deleted.

The configuration control program 4030, upon receiving a read-, write-, and delete (zero data write)-complete from the SDEV, updates the values of the pool information 4040A allocation column, the VL conversion information 4040B SEG-ID and access measurement value columns, and the cell mode information 4090 number of cell rewrites column (Step 19006) and ends the processing.

<5. Detailed Explanation of Management Server>.

Next, the management server 1200 will be explained.

<5.1 Detailed Explanation of Management Server Information>.

FIG. 25 is a diagram showing an example of management-side SDEV information related to the first example.

The management-side SDEV information 12050 comprises the following information related to the SDEVs (1030, 1040, and so forth) installed in each storage system 1000.

(MA 1) Storage system 1000 identifier
(MA 2) SDEV identifier
(MA 3) SDEV blockage information
(MA 4) SDEV WWN (World Wide Name): This is the Fibre Channel communication identifier required to access the SDEV.
(MA 5) SDEV model number: This makes it possible to determine whether the SDEV is a HDD 1040 or a FMD 1030.
(MA 6) SDEV-provided capacity: The capacity is provided by the SDEVs.

The respective meanings of the above-mentioned (MA 2) through (MA 6) are the same as the SDEV information 4050 explained using FIG. 5. However, the management-side SDEV information 12050 and the SDEV information 4050 need not have the same data structure. Similarly, the management-side SDEV information 12050 and the SDEV information 4050 do not have to be stored using the same data expression format even when the information comprised therein have the same meanings.

FIG. 26 is a diagram showing an example of management-side PG configuration information related to the first example.

The management-side PG configuration information 12060 comprises the following information related to a parity group defined in each storage system 1000.

(MB 1) Storage system 1000 identifier
(MB 2) Parity group identifier
(MB 3) Parity group blockage information
(MB 4) Parity group RAID level
(MB 5) Number of SDEVs belonging to the parity group and the
SDEV identifiers The respective meanings of the above-mentioned (MB 2) through (MB 5) are the same as the PG configuration information 4060 explained using FIG. 6. However, the management-side PG configuration information 12060 and the PG configuration information 4060 need not have the same data structure. Similarly, the management-side PG configuration information 12060 and the PG configuration information 4060 do not have to be stored using the same data expression format even when the information comprised therein have the same meanings.

FIG. 27 is a diagram showing an example of management-side internal LU configuration information related to the first example.

The management-side internal LU configuration information 12070 comprises the following information related to an internal LU defined in each storage system 1000.

(MC 1) Storage system 1000 identifier
(MC 2) Internal LU identifier
(MC 3) Internal LU blockage information
(MC 4) PG identifier, start address [G], and end address [G]: This information denotes the parity group used as a storage area of the relevant internal LU, and the start address [G] and end address [G] inside the parity group.

The respective meanings of the above-mentioned (MC 2) through (MC 4) are the same as the internal LU configuration information 4070 explained using FIG. 7. However, the management-side internal LU configuration information 12070 and the internal LU configuration information 4070 need not have the same data structure. Similarly, the management-side internal LU configuration information 12070 and the internal LU configuration information 4070 do not have to be stored using the same data expression format even when the information comprised therein have the same meanings.

FIG. 28 is a diagram showing an example of management-side LU path information related to the first example.

The management-side LU path information 12080 comprises the following information related to a logical unit defined in each storage system 1000.

(MD 1) Storage system 1000 identifier
(MD 2) Identifier of virtual internal LU provided to host 1100
(MD 3) WWN (or I/O port 1013 identifier): The WWN shows the port 1013 from which an internal LU provided to the host 1100 is provided. Another identifier, such as a port number, may be used in place of the WWN. The contents of this information may differ from the information corresponding to the LU path information 4080 (For example, the storage system 1000 manages LU path information using a WWN, and the management server 1200 manages LU path information using a port number.).
(MD 4) LUN The respective meanings of the above-mentioned (MD 2) through (MD 4) are the same as the LU path information 4080 explained using FIG. 13. However, the management-side LU path information 12080 and the LU path information 4080 need not have the same data structure. Similarly, the management-side LU path information 12080 and the LU path information 4080 do not have to be stored using the same data expression format even when the information comprised therein have the same meanings. As was explained using FIG. 13, the internal LU identifier may be registered in the MD 2 of the relevant information. The virtual capacity of the virtual internal LU may also be registered in this information.

FIG. 21 is a diagram showing an example of management-side pool information related to the first example.

The management-side pool information 12040A comprises the following information related to a storage pool defined in each storage system 1000.

(ME 1) Storage system 1000 identifier
(ME 2) Storage pool identifier
(ME 3) Identifier of segment allocated to storage pool
(ME 4) Allocation information denoting whether or not segment identifier is allocated to the virtual internal LU: The allocation information is Yes in a case where the relevant segment is allocated to a virtual internal LU chunk, which is one of the internal LUs, which will be explained further below, and is No when this is not the case.
(ME 5) Identifier of internal LU, and start and end block [I] addresses corresponding to relevant segment
(ME 6) MSB flag denoting cell mode of FMD 1030 when the segment is allocated from the FMD 1030

The respective meanings of the above-mentioned (ME 4) through (ME 6) are the same as the pool information 4040A explained using FIG. 10. However, the management-side pool information 12040A and the pool information 4040A need not have the same data structure. Similarly, the management-side pool information 12040A and the pool information 4040A do not have to be stored using the same data expression format even when the information comprised therein have the same meanings.

FIG. 22 is a diagram showing an example of management-side VL conversion information related to the first example.

The management-side VL conversion information 12040B comprises the following information related to a virtual internal LU defined in each storage system 1000.

(MF 1) Storage system 1000 identifier
(MF 2) Virtual capacity of relevant virtual internal LU
(MF 3) ID of segment allocated to relevant chunk and ID of pool comprising relevant segment
(MF 4) Segment ID of segment allocated to relevant chunk: A NULL value is stored in this information in a case where a segment is not allocated.
(MF 5) Access measurement value for relevant chunk: The access measurement value, for example, may be the number of reads or writes, read or write time, or the number of reads/writes per unit of time.

The respective meanings of the above-mentioned (MF 2) through (MF 5) are the same as the VL conversion information 4040B explained using FIG. 11. However, the management-side VL conversion information 12040B and the VL conversion information 4040B need not have the same data structure. Similarly, the management-side VL conversion information 12040B and the VL conversion information 4040B do not have to be stored using the same data expression format even when the information comprised therein have the same meanings.

FIG. 23 is a diagram showing an example of management-side cell mode information related to the first example.

The management-side cell mode information 12090 comprises the following information related to the cell mode for each segment.

(MG 1) Storage system 1000 identifier
(MG 2) Storage pool identifier
(MG 3) Identifier of segment allocated to storage pool
(MG 4) Number of cell rewrites denoting either number of cell programming and cell erase cycles, or number of cell erases
(MG 5) Cell mode information: At the finest granularity, the cell mode can be configured having one FM cell as the unit, and one cell mode value may be allocated to one FM cell. However, realistically speaking, the cell mode value may be managed using one page, one erase block, one FMD 1030, one parity group, one internal LU, or one virtual internal LU as the unit.

The respective meanings of the above-mentioned (MG 3) and (MG 4) are the same as the cell mode information 4090 explained using FIG. 12. However, the management-side cell mode information 12090 and the cell mode information 4090 need not have the same data structure. Similarly, the management-side cell mode information 12090 and the cell mode information 4090 do not have to be stored using the same data expression format even when the information comprised therein have the same meanings.

FIG. 51 is a diagram showing an example of AP performance requirement information related to the first example.

The AP performance requirement information 12100 stores information regarding either an internal LU or a virtual internal LU allocated to the host 1100, an application (hereinafter, may be abbreviated as AP) run on the LU, and the performance condition (for example, IOPS or a response time) being sought in accordance with running the application. The AP performance requirement information 12100, for example, comprises the following information.

(MH 1) Storage ID for identifying a storage system 1000
(MH 2) Identifier for identifying a virtual internal LU: The identifier of the internal LU may be included in the relevant location in a case where the host is using the internal LU.
(MH 3) Host identifier for identifying the host using the LU
(MH 4) Application information for identifying the application running on the LU
(MH 5) IOPS denoting the performance condition being sought by running the application FIG. 52 is a diagram showing an example of segment allocation trend information related to the first example.

The segment allocation trend information 12110 stores information denoting a trend (an increase inclination) with respect to the amount of segments allocated to a virtual internal LU per unit of time, or IOPS. The segment allocation trend information 12110, for example, comprises the following information.

(MI 1) Storage system 1000 identifier
(MI 2) Virtual internal LU identifier
(MI 3) Either type or cell mode of SDEV allocated to virtual internal LU
(MI 4) Unit of time for checking segment allocation amount trend: In this drawing, information is configured in units of one hour, but the unit of time is not particularly limited to this time period.
(MI 5) Increased segment allocation amount per unit of time
(MI 6) Average IOPS of virtual internal LU during unit of time FIG. 53 is a diagram showing an example of tier management information related to the first example.

The tier management information 12120 stores information with respect to a Tier, which is an aggregate of storage areas having identical or similar performance and reliability from among the storage areas belonging to a storage pool. The tier management information 12120, for example, comprises the following information.

(MJ 1) Storage system 1000 identifier
(MJ 2) Storage pool identifier
(MJ 3) Tier identifier
(MJ 4) Range of performance required by segment included in relevant tier: The IOPS per unit of time or the number of cumulative IOs is configured as this performance range. This information may be called the tier range hereinafter.
(MJ 5) Identifier of segment included in relevant tier of relevant storage pool
(MJ 6) Type or cell mode of SDEV comprising relevant segment: The SDEV type is configured in the case of a data migration process, which is not conscious of the cell mode. The cell mode is configured in the case of a cell mode-conscious data migration process. This will be explained in detail further below.

<5.2. Receipt of Management Information from Storage System>.

The storage management program 12010 receives storage system 1000 information in accordance with carrying out the following processing.

The system management program 12010 receives storage system management information from the storage system 1000 (Step 1). Next, the system management program 12010 either creates or updates the following information on the basis of the above-mentioned storage system management information (Step 2).

(*) Management-side SDEV information 12050
(*) Management-side PG configuration information 12060
(*) Management-side internal LU configuration information 12070
(*) Management-side LU path information 12080
(*) Management-side cell mode information 12090
(*) Management-side pool information 12040A
(*) Management-side VL conversion information 12040B
(*) Segment allocation trend information 12110

The storage system management information sent by the storage system 1000 is created based on the following information of the storage system 1000.

(*) SDEV information 4050
(*) PG configuration information 4060
(*) Internal LU configuration information 4070
(*) LU path information 4080
(*) Cell mode information 4090
(*) Pool information 4040A
(*) VL conversion information 4040B

The storage system management information may comprise either part or all of the above-mentioned information, or the difference(s) with respect to previously sent information, but this information need not be included in the storage management information using the same data structure or data expression format.

The above-mentioned processing may be carried out in accordance with an instruction from the administrator to the management server 1200, and part of the information may be based on information inputted to the management server 1200 by the administrator without going through the host 1100. The above-mentioned processing may be carried out repeatedly.

The segment allocation trend information 12110 is per-unit-of-time information, and as such, the value of the segment allocation trend information 12110 is configured in accordance with the system management program 12010 repeatedly receiving the storage system management information from the storage system 1000 for each unit of time.

As for the AP performance requirement information 12100, the system management program 12010 acquires the application information from the host management program 4014 of the host 1100. The storage management information is created based on the following information of the storage system 1000.

(*) SDEV information 4050
(*) Internal LU configuration information 4070
(*) LU path information 4080

The user (administrator) configures a performance requirement value beforehand using a GUI or the like. Or, the application configures a default value.

<5.3 Tier Definition Steps>.

The method for configuring the tier management information 12120 of the management server 1200 will be explained.

The tier management information 12120 is created at storage pool creation time. The system management program 12010 may dynamically decide the tier identifier and tier range of the tier management information 12120, or the user may configure this information when the storage pool is created.

Figure 33:
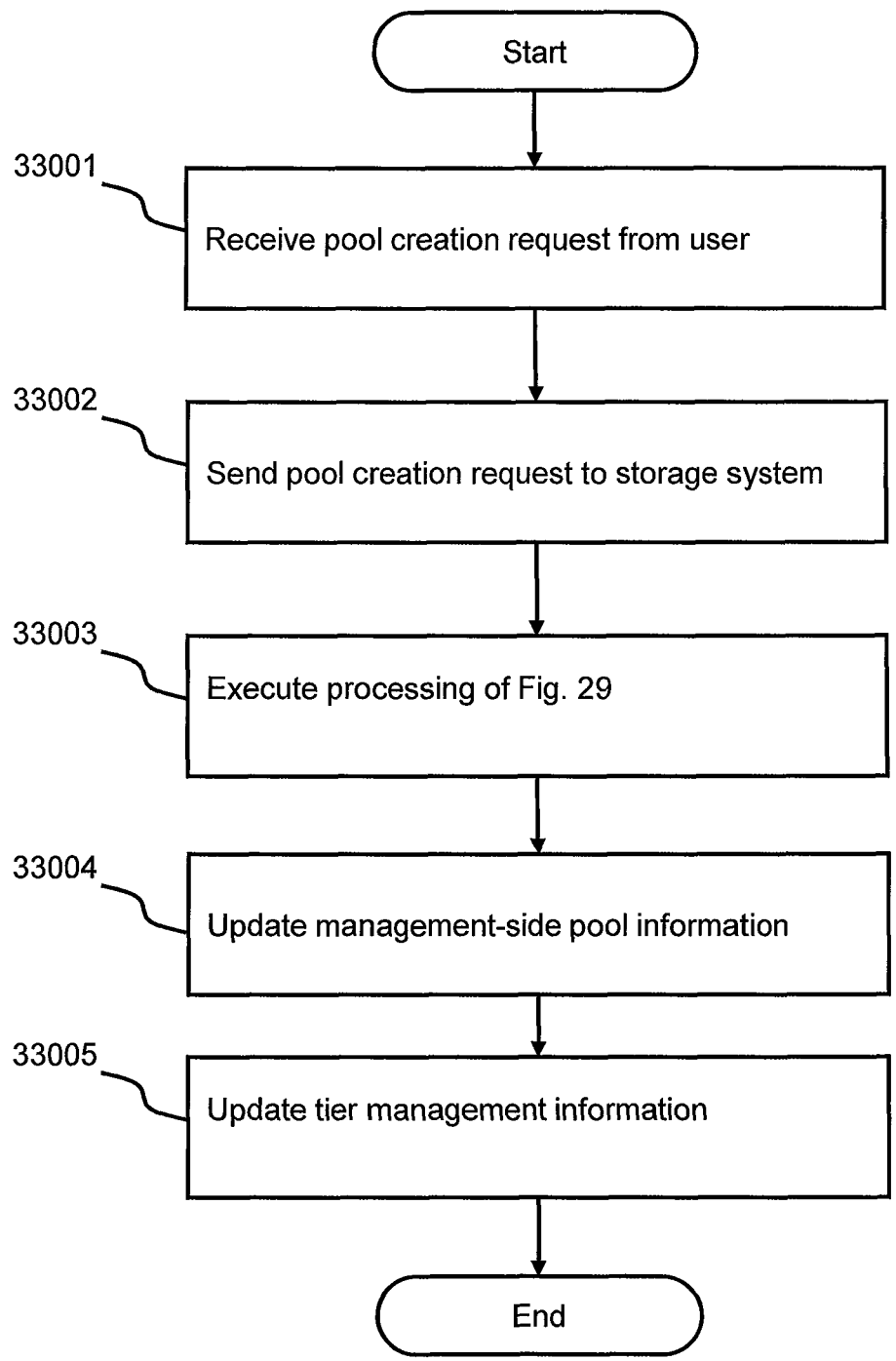
FIG. 33 is a flowchart of an example of a process for configuring tier information related to the first example.

FIG. 33 is a flowchart of an example of a process for configuring tier information related to the first example. The processing shown in this drawing is a user-specified flowchart.

The system management program 12010, upon receiving from the user storage pool creation input comprising either part or all of the information of (Parameter 1) through (Parameter 4) given as examples below (Step 33001), updates the management-side pool information 12040A and the tier management information 12120 based on the information associated with the relevant input.

(Parameter 1) Storage pool identifier
(Parameter 2) Internal LU ID (one or more are specified)
(Parameter 3) Tier identifier denoting the tier of each internal LU (one or more are specified in accordance with Parameter 2)
(Parameter 4) Tier range for each tier identifier Next, the system management program 12010 sends a storage pool definition request comprising the information of Parameter 1 and Parameter 2 to the storage system 1000 (Step 33002).

In accordance with this, the configuration control program 4030 of the storage system 1000 executes storage pool creation/upgrading processing (refer to FIG. 29) (Step 33003).

Next, the system management program 12010 adds the created storage pool information to the management-side pool information 12040A (Step 33004), upgrades the tier management information 12120 based on the created storage pool information and the information of Parameter 3 and Parameter 4 (Step 33005), and ends the processing.

<5.4 Display of Storage System Management Information Comprising Cell Mode>.

Next, the displaying of the management information of the management server 1200 will be explained together with a process for computing display content. The displaying of the respective management information is carried out on the basis of the following information of the management server 1200.

(*) Management-side SDEV information 12050
(*) Management-side PG configuration information 12060
(*) Management-side internal LU configuration information 12070
(*) Management-side LU path information 12080
(*) Management-side cell mode information 12090
(*) Management-side pool information 12040A
(*) Management-side VL conversion information 12040B
(*) AP performance requirement information 12100
(*) Segment allocation trend information 12110
(*) Tier management information 12120

In the following explanation, the above-mentioned information, which is managed by the management server 1200, may be collectively called system management information. This system management information does not necessarily include all of the above-mentioned information. For example, this is because the present invention can also be operated without using the AP performance requirement information 12100 and the segment allocation trend information 12110, and because there may be cases in which the cell mode is configured without taking the host LU and application into account, in which case not all of the above-mentioned information is needed in the example.

Figure 41:
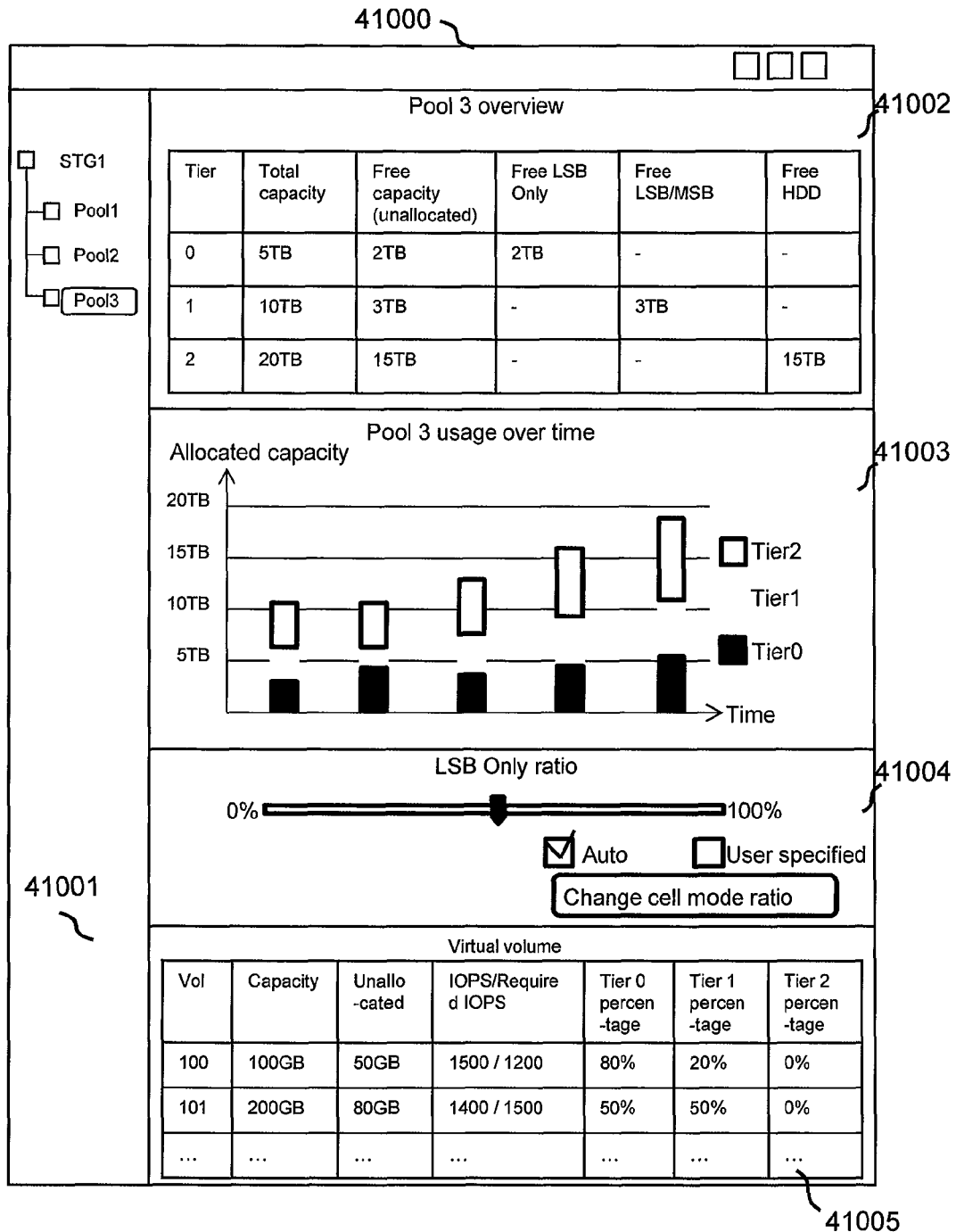
FIG. 41 is a diagram showing an example of a GUI, which shows detailed information related to a storage pool related to the first example.

FIG. 41 is a diagram showing an example of a GUI, which shows detailed information related to a storage pool related to the first example. The drawing is an example of a screen for displaying information related to a storage pool 1080 of the storage system 1000 using input/output device.

A display screen 41000 comprises any one or all of five panes, namely, a first pane 41001, a second pane 41002, a third pane 41003, a fourth pane 41004, and a fifth pane 41005, information such as that shown below is displayed in the respective panes, and the panes support input from the input/output device.

(First Pane 41001) The first pane 41001 displays a display object, which signifies a storage system 1000 managed by the management server 1200, a storage pool of the storage system 1000, and a component (for example, a tier) related to the storage pool. The display object in FIG. 41 is indicated by an icon and/or a character string, but may also be another image or sound. In addition, the first pane 41001 displays the superordinate relationships, coordinate relationships, or subordinate relationships between the display objects. In the following explanation, a display object specified using the first pane may be called a first pane-specified display object.

(Second Pane 41002) The second pane 41002 displays storage pool 1080 management information corresponding to the first pane-specified display object. In FIG. 41, a tier identifier, a tier capacity, a tier free capacity, a free capacity of the tier free capacity accounted for by LSB Only mode, a free capacity of the tier free capacity accounted for by LSB/MSB mode, and a free capacity of the tier free capacity accounted for by HDD mode are displayed as the management information of the storage pool 1080, but the present invention is not limited to this. The tier free capacity is the actual capacity of a segment(s) not allocated to the virtual internal LU from among the total capacity of the internal LU(s) allocated to the tier.

As shown in the drawing, the in-pool free capacity for each cell mode is also displayed in the second pane. The second pane also displays the corresponding relationship between each tier and the cell mode.

(Third Pane 41003) The third pane 41003 displays segment allocated capacities of the storage pool 1080 corresponding to the first pane-specified display object at fixed times using a graph for each storage pool tier. In FIG. 41, all tier information is displayed in one pane, but, for example, in a case where the input/output device comprises a pointing device (for example, a mouse, a touchpad, a touch screen, or a pen tablet), the configuration may be such that when a certain tier is selected in the management information of the second pane 41002, the third pane 41003 displays only the information of the selected tier. Furthermore, the third pane 41003 does not always have to display the information using a graph, and, for example, may display the capacity of each tier at each unit of time using a table format.

(Fourth Pane 41004) The fourth pane 41004 displays either the LSB Only or the LSB/MSB cell mode ratio for the storage pool 1080 corresponding to the specified display object in a case where the component SDEV is a FMD 1030. The fourth pane 41004 also displays checkboxes for selecting whether this cell mode ratio is to be configured manually by the user or automatically by the management system. In FIG. 41, a checkbox labeled "user specified" is the checkbox, which makes it possible for the user to configure the cell mode ratio manually. Placing a check in this checkbox makes it possible to move a slider in the fourth pane 41004 of FIG. 41, enabling the user to issue a cell mode ratio change instruction by clicking a change cell mode ratio button. In a case where a checkbox labeled "Auto" in FIG. 41 has been checked, the management system carries out cell mode-conscious storage area tier management, which will be explained further below using <5.6>.

These checks are not limited to checkboxes, and, for example, checks can be placed in radio buttons and other icons. Also the changing of the cell mode ratio is not limited to a slider, and, for example, a LSB Only ratio may be inputted to a textbox using a direct value. A cell mode change request may also be sent using the movement of the slider alone without pressing the change cell mode ratio button.

(Fifth Pane 41005) The fifth pane 41005 displays management information for a virtual internal LU created from the relevant storage pool 1080 for the storage pool 1080 corresponding to the first pane-specified display object. In the screen display of FIG. 41, the following contents are displayed as the management information for the virtual internal LU defined in the storage pool 1080.

(*) Virtual internal LU identifier
(*) Virtual internal LU capacity
(*) Virtual internal LU free capacity (of the virtual internal LU capacity, the capacity of a segment (s) not actually allocated to the virtual internal LU)
(*) Actual IOPS of virtual internal LU, value of IOPS required by application running on relevant LU, and the ratio thereof
(*) Percentage of LSB Only cell mode segments allocated to virtual internal LU
(*) Percentage of LSB/MSB cell mode segments allocated to virtual internal LU
(*) Percentage of HDD cell mode segments allocated to virtual internal LU However, not all of the above-mentioned information needs to be displayed, and, alternatively, additional information may be displayed. A case in which the ratio of actual IOPS to the requested IOPS is well over 1 is not a problem since performance equal to or greater than required is being achieved, but in a case in which this ratio is near to 1 or smaller than 1, the required performance is either not being met or is in danger of not being met, and as such, for example, it is possible to make a determination to try to enhance performance by increasing the LSB Only cell mode.

The examples of FIG. 41 or FIGS. 42 and 43 and FIG. 46 through FIG. 50, which will be explained further below, assume a GUI, but console output using a command line interface (CLI) is also possible.

Figure 42:
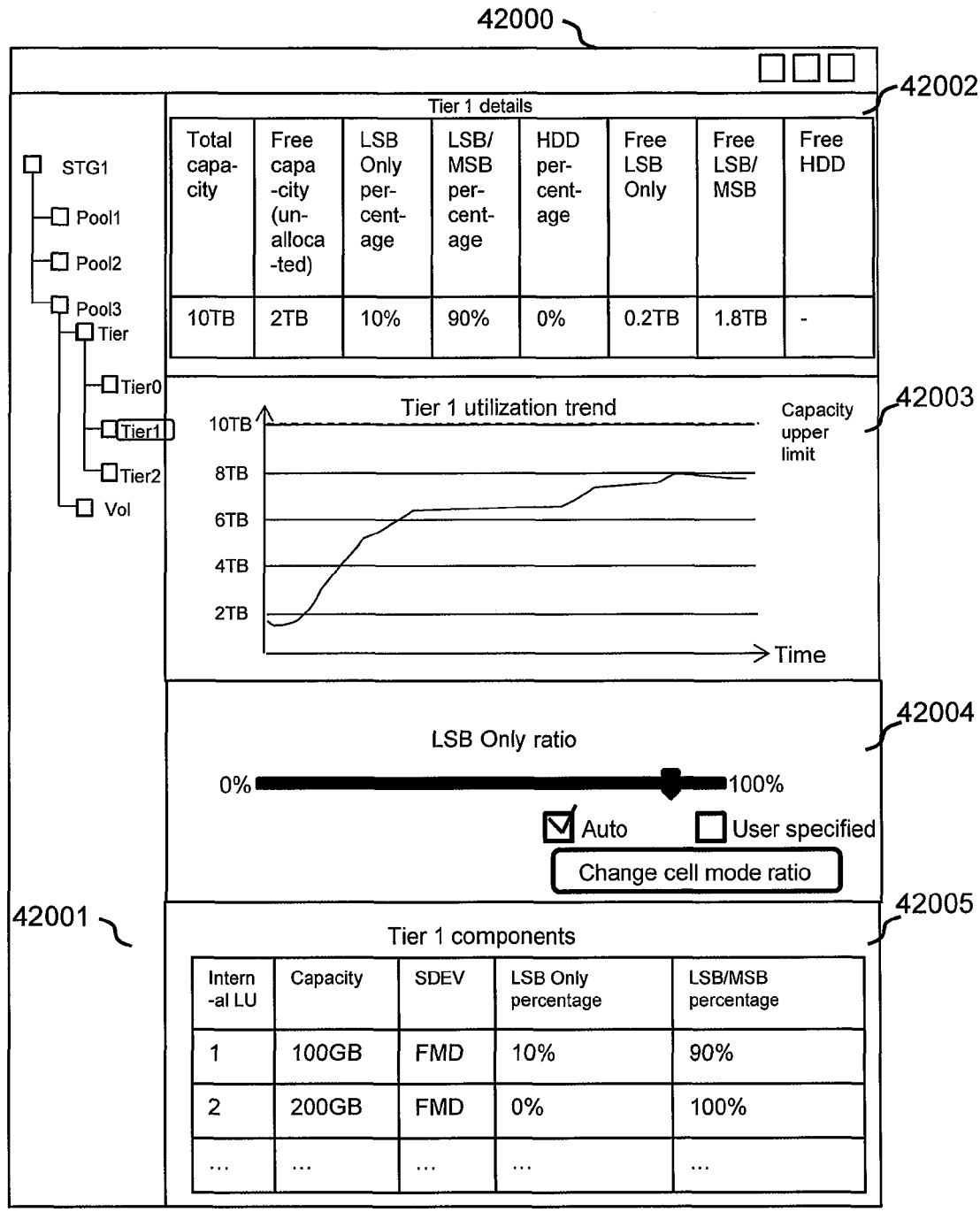
FIG. 42 is a diagram showing an example of a GUI, which shows detailed information related to a tier related to the first example.

FIG. 42 is a diagram showing an example of a GUI, which shows detailed information related to a tier related to the first example. This drawing is an example of a screen via which the management server 1200 displays tier information related to a storage pool 1080 of the storage system 1000 using the input/output device. The virtual internal LU will be expressed as "Vol" in the subsequent drawings.

A display screen 42000 comprises any one or all of five panes, namely, a first pane 42001, a second pane 42002, a third pane 42003, a fourth pane 42004, and a fifth pane 42005, information such as that shown below is displayed in the respective panes, and the panes support input from the input/output device.

(First Pane 42001) Similar to the first pane 41001 of FIG. 41, the first pane 42001 displays a display object signifying a storage system 1000 managed by the management server 1200, a storage pool of the storage system 1000, and a component (for example, a tier) related to the storage pool. In FIG. 42, a tier is displayed as being subordinate to the pool.

(Second Pane 42002) The second pane 42002 displays the management information of a tier corresponding to the first pane-specified display object. In FIG. 42, the following information is displayed as the tier management information.

(*) Total capacity
(*) Free capacity (Of the total capacity of the internal LU allocated to the tier, the capacity of a segment (s) not actually allocated to the virtual internal LU)
(*) Percentage of segment-allocated capacity accounted for by LSB Only mode
(*) Percentage of segment-allocated capacity accounted for by LSB/MSB mode
(*) Percentage of segment-allocated capacity accounted for by HDD mode
(*) LSB Only-mode free capacity of tier free capacity
(*) LSB/MSB-mode free capacity of tier free capacity
(*) HDD-mode free capacity of tier free capacity However, not all of the above-mentioned information needs to be displayed, and, alternatively, additional information may be displayed.

(Third Pane 42003) The third pane 42003 displays the segment-allocated capacity of a tier corresponding to the first pane-specified display object using a time-series graph. Furthermore, the third pane 42003 does not always have to display the information using a graph, and, for example, may display the allocated segment capacity at each unit of time using a table format.

(Fourth Pane 42004) The first pane-specified display object is a tier of the storage pool 1080, and the fourth pane 42004 displays the ratio of either the LSB Only cell mode or the LSB/MSB cell mode in a case where the SDEV comprising the tier is the FMD 1030. The fourth pane 42004 also displays checkboxes for selecting whether this cell mode ratio is to be configured manually by the user or automatically by the storage management system. The functions of the checkboxes are the same as those of the fourth pane 41004 of FIG. 41, and the checkboxes are used for controlling a cell mode change in units of tiers from the relevant GUI.

(Fifth Pane 42005) The fifth pane 42005 displays information regarding an internal LU comprising the tier corresponding to the first pane-specified display object. As the information regarding the internal LU comprising the tier in FIG. 42, an internal LU identifier, an internal LU capacity, a SDEV type, a LSB Only mode percentage in a case where the SDEV is the FMD, and a LSB/MSB mode percentage in a case where the SDEV is the FMD are displayed as the management information. However, not all of the above-mentioned information needs to be displayed, and, alternatively, additional information may be displayed. Furthermore, the element comprising the tier need not be limited to the internal LU, and, for example, a Parity Group or the SDEV itself may be used. In accordance with this, the items mentioned above with respect to these elements are displayed as the management information.

Figure 43:
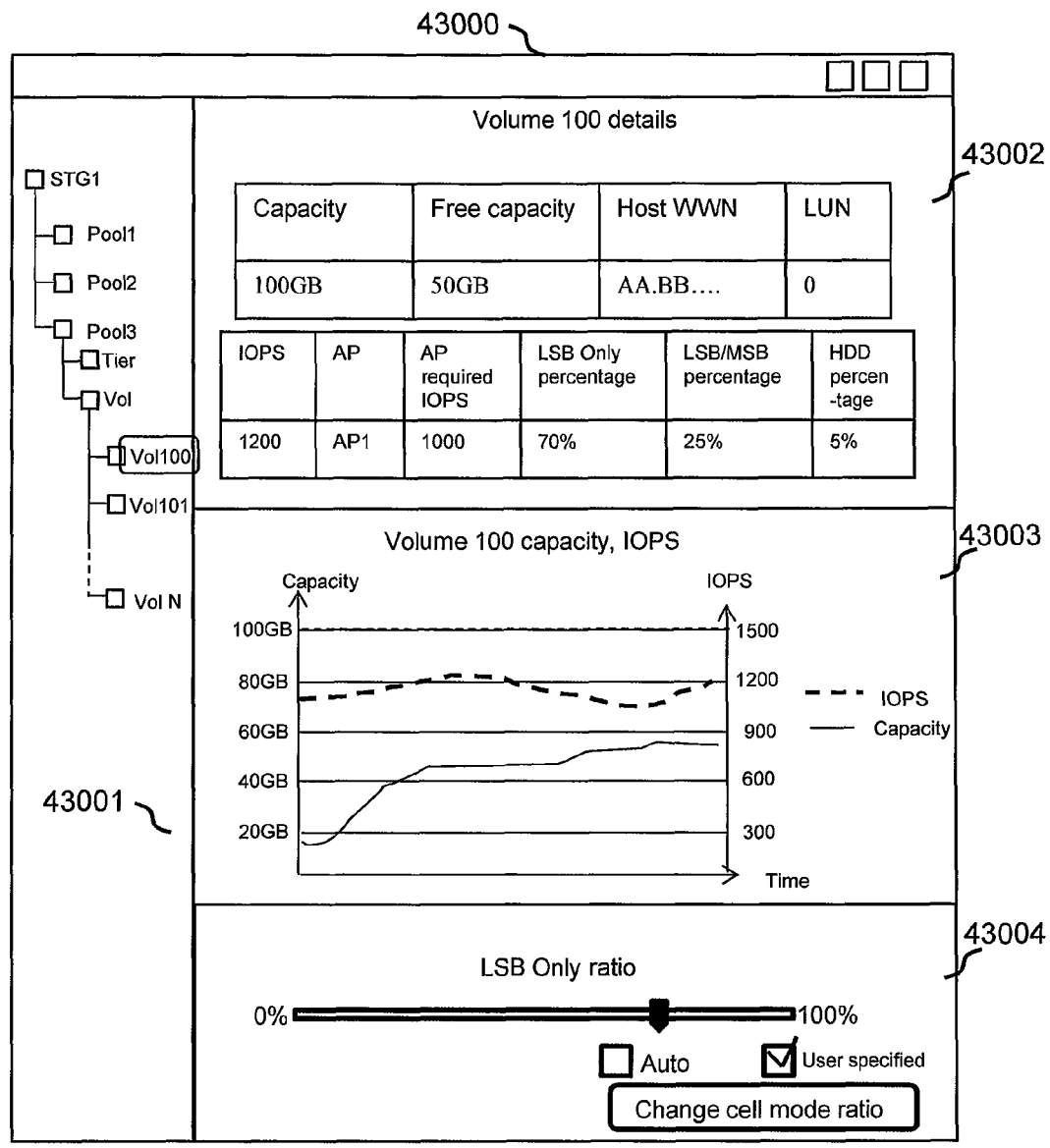
FIG. 43 is a diagram showing an example of a GUI, which shows detailed information related to a virtual internal LU related to the first example.

FIG. 43 is a diagram showing an example of a GUI, which shows detailed information related to a virtual internal LU related to the first example. This drawing is an example of a screen via which the management server 1200 displays the management information of a virtual internal LU created from a storage pool 1080 of the storage system 1000.

A display screen 43000 comprises any one or all of four panes, namely, a first pane 43001, a second pane 43002, a third pane 43003, and a fourth pane 43004, information such as that shown below is displayed in the respective panes, and the panes support input from the input/output device.

(First Pane 43001) Similar to the first pane 41001 of FIG. 41, the first pane 43001 displays a display object signifying a storage system 1000 managed by the management server 1200, a storage pool of the storage system 1000, and a component (for example, a tier) related to the storage pool. In FIG. 43, a virtual internal LU is displayed as being subordinate to the pool. The number of virtual internal LUs may exceed several tens of thousands. Not all of these virtual internal LUs need to be displayed at once in the first pane 43001 at this time; the first pane 43001 may display the display objects in units of either hundreds or thousands. The virtual internal LU display objects may be displayed one at a time as subordinate elements in accordance with clicking on this aggregate of display objects.

(Second Pane 43002) The second pane 43002 displays management information for a virtual internal LU corresponding to the first pane-specified display object. In FIG. 43, the following information is displayed as the virtual internal LU management information.

(*) Virtual capacity
(*) Free capacity (capacity for which segment not allocated to virtual internal LU)
(*) Host WWN
(*) LUN
(*) Access measurement value such as storage system-measured LOPS and the like
(*) Application running on virtual internal LU
(*) IOPS required by relevant application
(*) Percentage of segment-allocated capacity accounted for by LSB Only mode
(*) Percentage of segment-allocated capacity accounted for by LSB/MSB mode
(*) Percentage of segment-allocated capacity accounted for by HDD mode However, not all of the above-mentioned information needs to be displayed, and, alternatively, additional information may be displayed. This is a case, for example, in which the host WWN, the application running on the relevant virtual internal LU, and the IOPS required by the relevant application are not displayed by the management server 1200.

(Third Pane 43003) The third pane 43003 displays the segment-allocated capacity and the IOPS of the virtual internal LU corresponding to the first pane-specified display object using a time-series graph. Furthermore, the third pane 43003 does not always have to display the information using a graph, and, for example, may display the allocated segment capacity at each unit of time using a table format. A percentage of virtual capacity may be displayed in the pane instead of the percentage of allocated capacity.

(Fourth Pane 43004) The fourth pane 43004 is for controlling the cell mode of a segment allocated to a virtual internal LU using the virtual internal LU corresponding to the first pane-specified display object as the target. The functions are the same as those of the fourth pane 41004 of FIG. 41.

Figure 46:
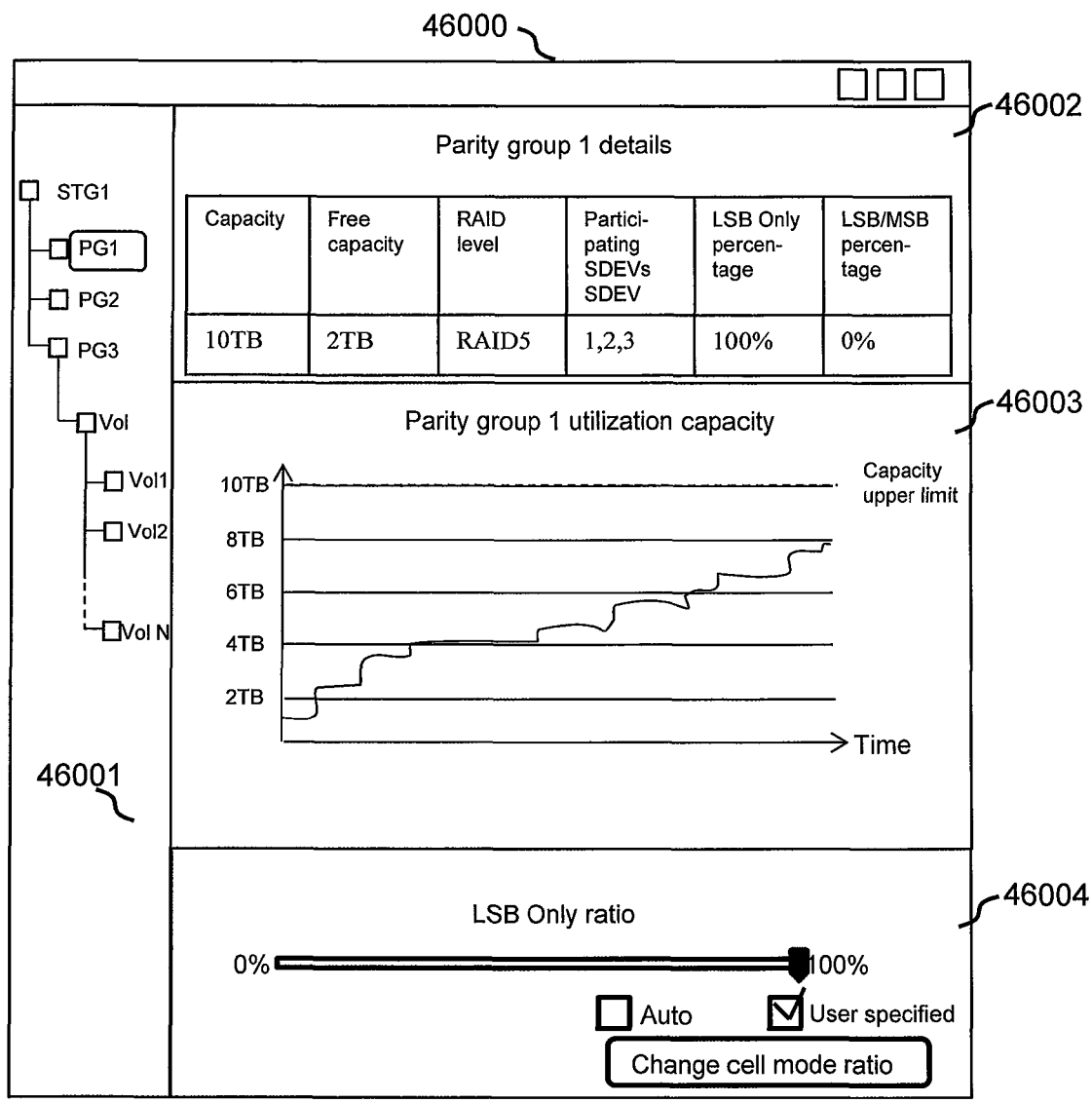
FIG. 46 is a diagram showing an example of a GUI, which shows detailed information related to a parity group related to the first example.

FIG. 46 is a diagram showing an example of a GUI, which shows detailed information related to a parity group related to the first example. This drawing is an example of a screen via which the management server 1200 displays the management information of the parity group 1060 of the storage system 1000 using the input/output device.

A display screen 46000 comprises either any one or all of four panes, namely, a first pane 46001, a second pane 46002, a third pane 46003, and a fourth pane 46004, information such as that shown below is displayed in the respective panes, and the panes support input from the input/output device.

(First Pane 46001) The first pane 46001 displays a display object, which signifies a storage system 1000 managed by the management server 1200, a parity group of the storage system 1000, and a component (for example, a SDEV or internal LU) related to the parity group. In FIG. 46, the first pane 46001 displays an internal LU as being subordinate to the parity group. The number of virtual internal LUs may exceed several tens of thousands. Not all of these virtual internal LUs need to be displayed all at once in the first pane 46001 at this time; the first pane 46001 may display the display objects in units of either hundreds or thousands. The virtual internal LU display objects may be displayed one at a time as subordinate elements in accordance with clicking on this aggregate of display objects.

(Second Pane 46002) The second pane 46002 displays detailed information of the parity group corresponding to the first pane-specified display object. In FIG. 46, the second pane 46002 displays a total capacity, an unused capacity (the capacity not used in internal LU creation), a RAID level, the ID of the SDEV used to create the parity group, the LSB Only mode percentage, and the LSB/MSB mode percentage as the parity group management information, but the present invention is not limited to this.

(Third Pane 46003) The third pane 46003 displays the used capacity of the parity group corresponding to the first pane-specified display object using a time-series graph. Furthermore, the third pane 46003 does not always have to display the information using a graph, and, for example, may display the allocated segment capacity at each unit of time using a table format.

(Fourth Pane 46004) The fourth pane 46004 is for controlling the cell mode using the parity group corresponding to the first pane-specified display object as the target. The functions are the same as those of the fourth pane 41004 of FIG. 41.

The preceding are displays related to the parity group, but as in FIG. 43, any one or more of the application-required IOPS, the LSB Only percentage, and the LSB/MSB percentage may be displayed.

Figure 47:
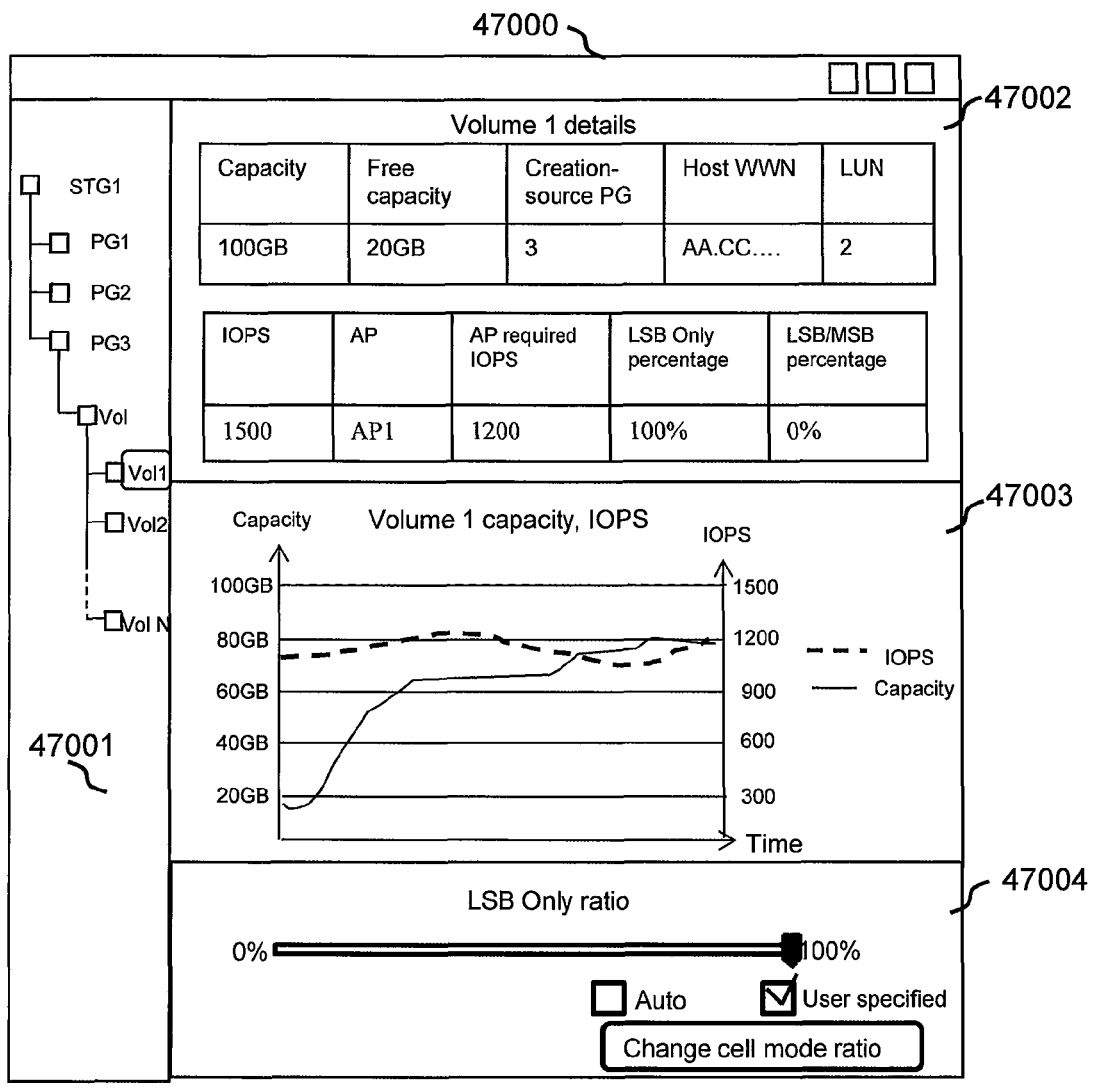
FIG. 47 is a diagram showing an example of a GUI, which shows detailed information related to an internal LU related to the first example.

FIG. 47 is a diagram showing an example of a GUI, which shows detailed information related to an internal LU related to the first example. The drawing is an example of a screen via which the management server 1200 displays the management information of the internal LU 1070 of the storage system 1000 using the input/output device. The "Vol" in this drawing is the internal LU. However, this display may be applied to either an internal LU included in the storage pool, or in a case in which an internal LU is provided to the host without going through a virtual internal LU.

A display screen 47000 comprises either any one or all of four panes, namely, a first pane 47001, a second pane 47002, a third pane 47003, and a fourth pane 47004, information such as that shown below is displayed in the respective panes, and the panes support input from the input/output device.

(First Pane 47001) The same as the first pane 46001 of FIG. 46, the first pane 47001 displays a display object, which signifies a storage system 1000 managed by the management server 1200, an internal LU of the storage system 1000, and a component related to the internal LU.

(Second Pane 47002) The second pane 47002 displays detailed information of the internal LU corresponding to the first pane-specified display object. In FIG. 47, the second pane 47002 displays a total capacity, an unused capacity, an internal LU creation-source parity group, a host WWN, a LUN, an IOPS, an application running on the relevant virtual internal LU, the LOPS required by the relevant application, a LSB Only mode percentage, and a LSB/MSB mode percentage as the internal LU management information. However, not all of the above-mentioned information needs to be displayed, and, alternatively, additional information may be displayed.

(Third Pane 47003) The third pane 47003 displays the used capacity and IOPS with respect to the internal LU corresponding to the first pane-specified display object using a time-series graph. Furthermore, the third pane 47003 does not always have to display the information using a graph, and, for example, may display the allocated segment capacity at each unit of time using a table format.

(Fourth Pane 47004) The fourth pane 47004 is for controlling the cell mode in units of internal LUs with respect to the internal LU corresponding to the first pane-specified display object as the target. The functions are the same as those of the fourth pane 41004 of FIG. 41.

Figure 48:
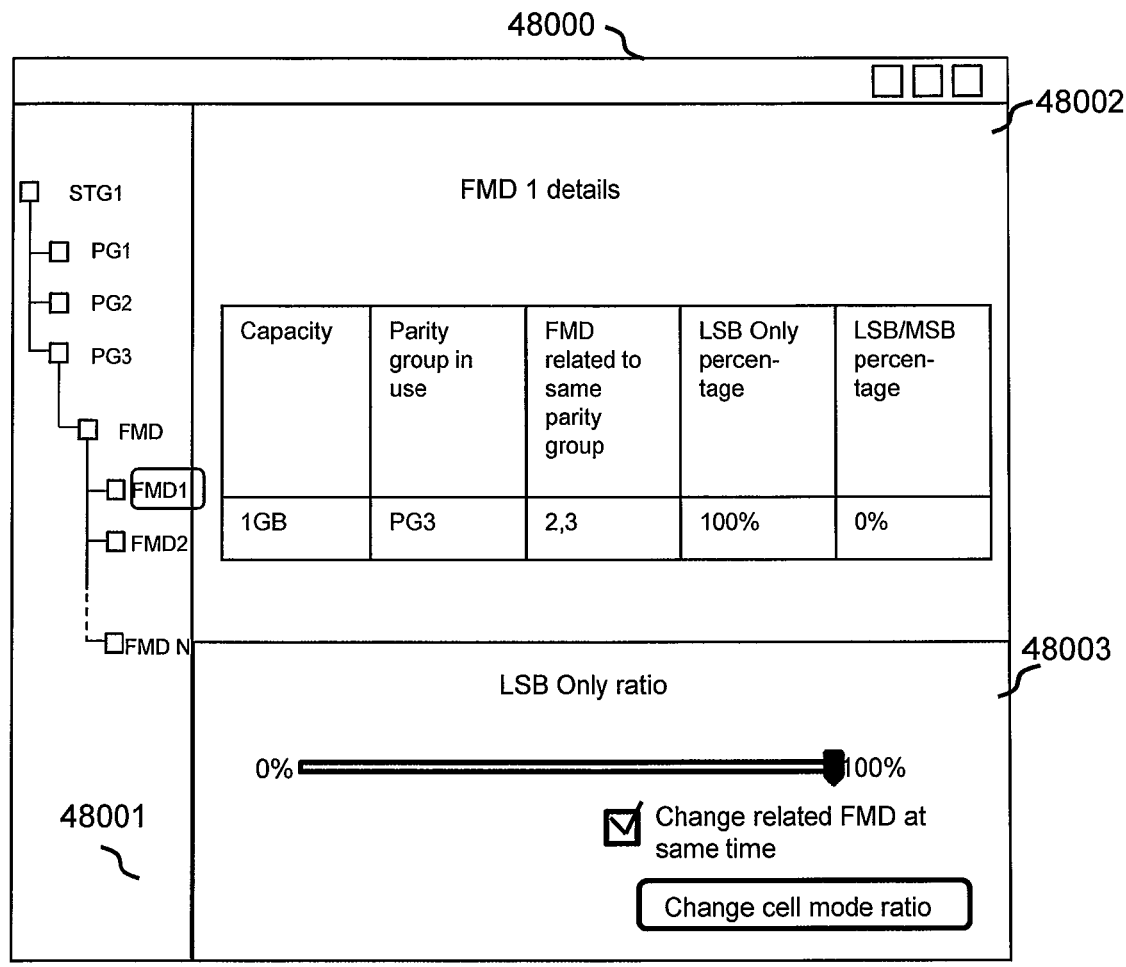
FIG. 48 is a diagram showing an example of a GUI, which shows detailed information related to a FMD related to the first example.

FIG. 48 is a diagram showing an example of a GUI, which shows detailed information related to a FMD related to the first example. The drawing is an example of a screen via which the management server 1200 displays the management information of the FMD 1030 of the storage system 1000 using the input/output device.

A display screen 48000 comprises either any one or all of three panes, namely, a first pane 48001, a second pane 48002, and a third pane 48003, information such as that shown below is displayed in the respective panes, and the panes support input from the input/output device.

(First Pane 48001) The same as the first pane 46001 of FIG. 46, the first pane 48001 displays a display object, which signifies a storage system 1000 managed by the management server 1200, a FMD 1030 of the storage system 1000, and a component related to the FMD 1030. In FIG. 48, the first pane 48001 displays the FMD 1030 as being subordinate to the parity group.

(Second Pane 48002) The second pane 48002 displays detailed information of the FMD corresponding to the first pane-specified display object. In FIG. 48, the second pane 48002 displays a total capacity, an identifier of the parity group in use, an identifier of another FMD being used in the parity group in use, a LSB Only mode percentage, and a LSB/MSB mode percentage as the FMD 1030 management information. However, not all of this information needs to be displayed, and, alternatively, additional information may be displayed.

(Third Pane 48003) The third pane 48003 is for controlling the cell mode in units of FMDs with respect to the FMD corresponding to the display object specified from the input/output device using the first pane 48001. The functions are the same as those of the fourth pane 41004 of FIG. 41, but the third pane 48003 includes a checkbox, which enables the cell mode to be changed simultaneously for another FMD 1030 belonging to the same parity group.

The preceding has been an explanation of the screen displays of this example. The screen display does not have to use panes, and the first pane need not be displayed in a case where the components (as described hereinabove, the SDEV, the parity group, the internal LU, the storage pool, and the virtual internal LU) inside the storage system for which management information should be displayed are able to receive input from the administrator. As for the cell mode-related setup, input may be received in accordance with a ratio as described hereinabove, but even simpler, the target component cell mode itself may be selected by the administrator and the result of this selection may be received as the input. In accordance with this, the management server processing is the same as a case in with the cell mode ratio is received as either 0% or 100%.

<5.5 Storage Area Tier Management in Units of Segments>.

The management of storage area tiers in units of segments will be explained.

Figure 34:
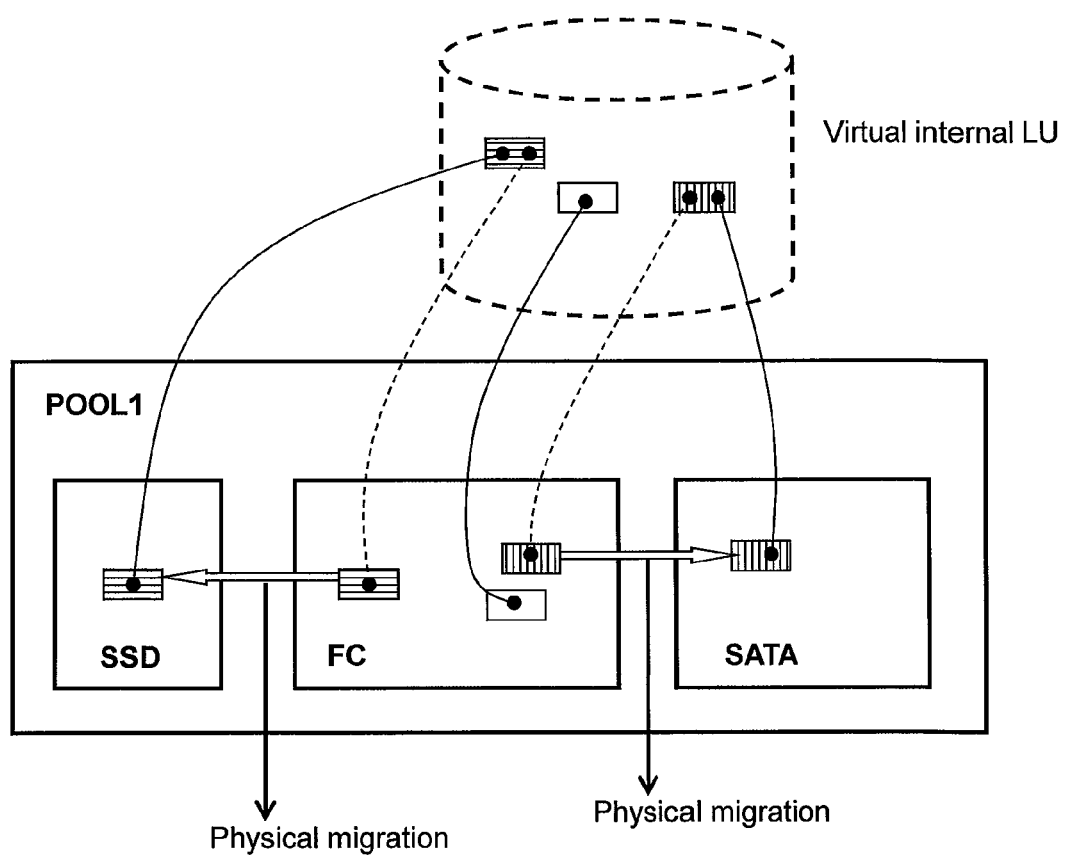
FIG. 34 is a diagram showing an overview of segment-unit tier management related to the first example.

FIG. 34 is a diagram showing an overview of segment-unit tier management related to the first example.

The storage pool POOL 1 has three tiers. In the drawing, the three tiers in the storage pool POOL 1 are a SSD tier, a FC tier, and a SATA tier, and the characteristic features thereof are that the SSD tier is the fastest, the FC tier is the next fastest, and the SATA tier is the slowest.

A segment is allocated from each tier of the storage pool POOL 1 to a virtual internal LU as a real storage area. The storage system, and, as needed, the management server references the access measurement value of each chunk in each of a certain fixed time period, and allocates a segment, which is suitable to the utilization status of the virtual internal LU by reallocating a chunk with a large measurement value to a segment of the high-performance Tier and reallocating a chunk with a not-so-large measurement value to a segment of a low-performance Tier. This is called segment-unit storage area tier management.

Figure 35:
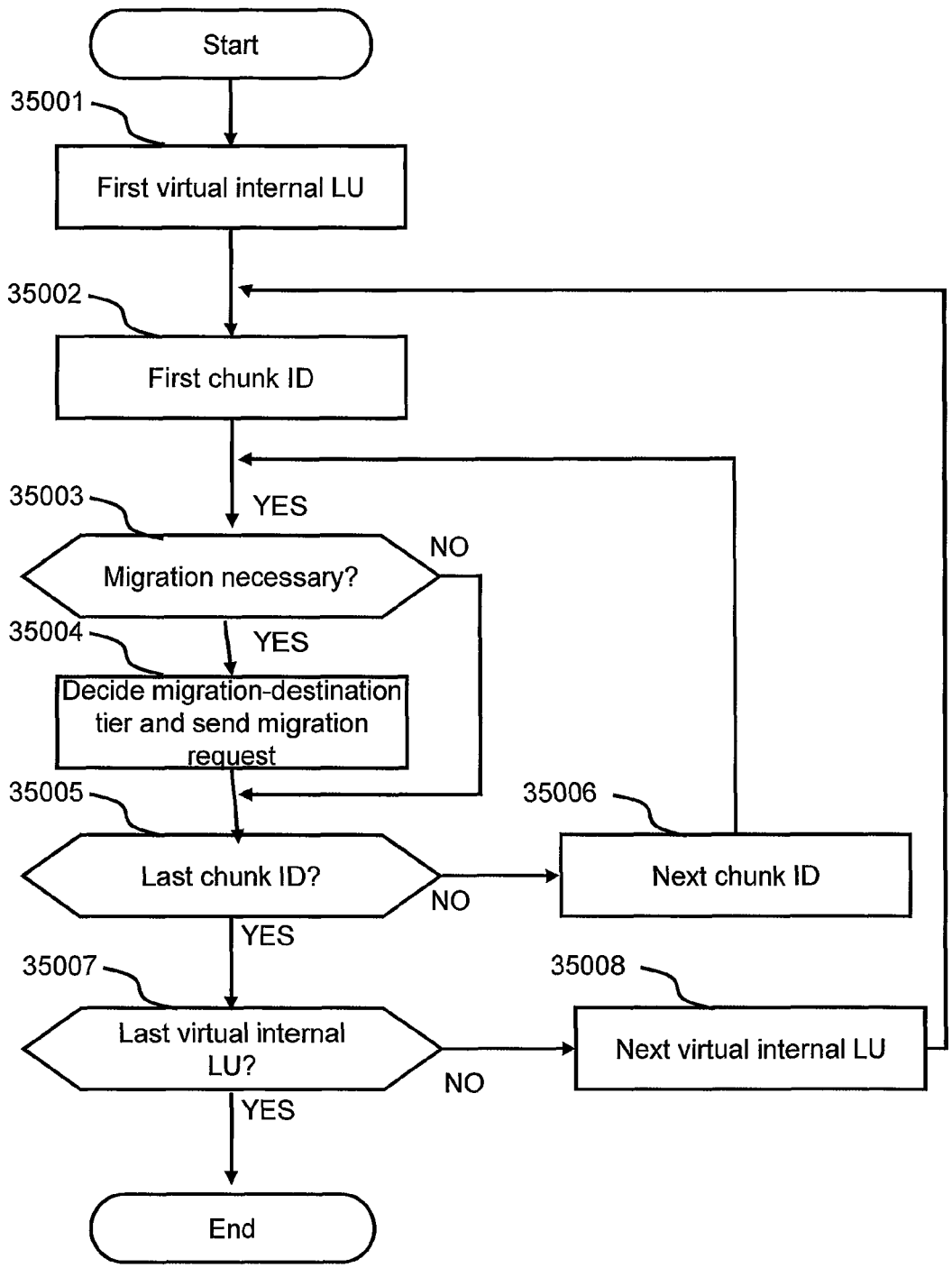
FIG. 35 is a flowchart of an example of a process related to the first example for determining a target to be migrated in units of segments.

FIG. 35 is a flowchart of an example of a process related to the first example for determining a target to be migrated in units of segments.

The system management program 12010 selects a virtual internal LU with the lowest LU identifier in the management-target storage system 1000 (Step 35001), and selects a chunk with the lowest chunk ID in the virtual internal LU (Step 35002).

Next, the system management program 12010 uses the management-side VL conversion information 12040B to determine whether or not the segment allocated to the chunk in the process of being selected is appropriate (in other words, whether or not the chunk should be migrated to a different segment) (Step 35003). Specifically, this step determines the segment, which is allocated to the chunk in the process of being selected, and checks whether or not the chunk access measurement value is included in the tier range conditions (stored in the tier management information 12120) of the determined segment. When the result is that the tier range condition has been met (NO in Step 35003), the system management program 12010 advances the processing to Step 35005.

Alternatively, in a case where the tier range condition is not met and a data migration is required (YES in Step 35003), the system management program 12010 checks for a tier range including the access measurement value of the relevant chunk, and sends a data migration request to the storage system 1000 so that the data will be migrated to this tier (Step 35004). The migration-destination segment specified in the data migration request is identified by using the management-side VL conversion information 12040B, the management-side cell mode information 12090, and the management-side PG configuration information 12060 (RAID level and so forth) to retrieve a segment, which has a cell mode (SDEV information) that satisfies the tier range, and, in addition, is unallocated. The ID of the relevant chunk is specified in the data migration request.

In accordance with this, the configuration control program 4030 executes a data migration process (FIG. 19) and returns a response to the system management program 12010. The system management program 12010, upon the return of the response, updates the tier information and the SDEV information in the tier management information 12120.

Next, the system management program 12010 checks whether or not a check has been carried out with respect to all the chunk IDs of a single virtual internal LU (Step 35005). When the result is that all of the chunk IDs have not been checked (NO in Step 35005), the system management program 12010 selects the next number chunk ID (Step 35006), and moves the processing to Step 35003.

Alternatively, in a case where all the chunk IDs have been checked (YES in Step 35005), the system management program 12010 checks to make sure that a check has been carried out with respect to all the virtual internal LUs in a single storage system 1000 (Step 35007). When the result is that all the virtual internal LUs have not been checked (NO in Step 35007), the system management program 12010 selects the next virtual internal LU (Step 35008) and moves the processing to Step 35002.

Alternatively, in a case where all the virtual internal LUs have been checked (YES in Step 35007), the system management program 12010 ends the processing.

In a case where the ID of the migration-destination segment is unable to be specified directly in the data migration request, the migration-destination segment may be specified indirectly using another specification method. A condition for retrieving the migration-destination segment may be included in the relevant request and sent to this storage system 1000. In accordance with this, the storage controller retrieves the migration-destination segment on the basis of the relevant condition. The system management program 12010 may collectively send data migration requests to multiple chunks.

<5.6. Segment-Unit Storage Area Tier Management (Takes Cell Mode Change into Account)>.

Tier management, which takes into account the cell mode in an operation that uses the virtual internal LU, will be explained.

Figure 36:
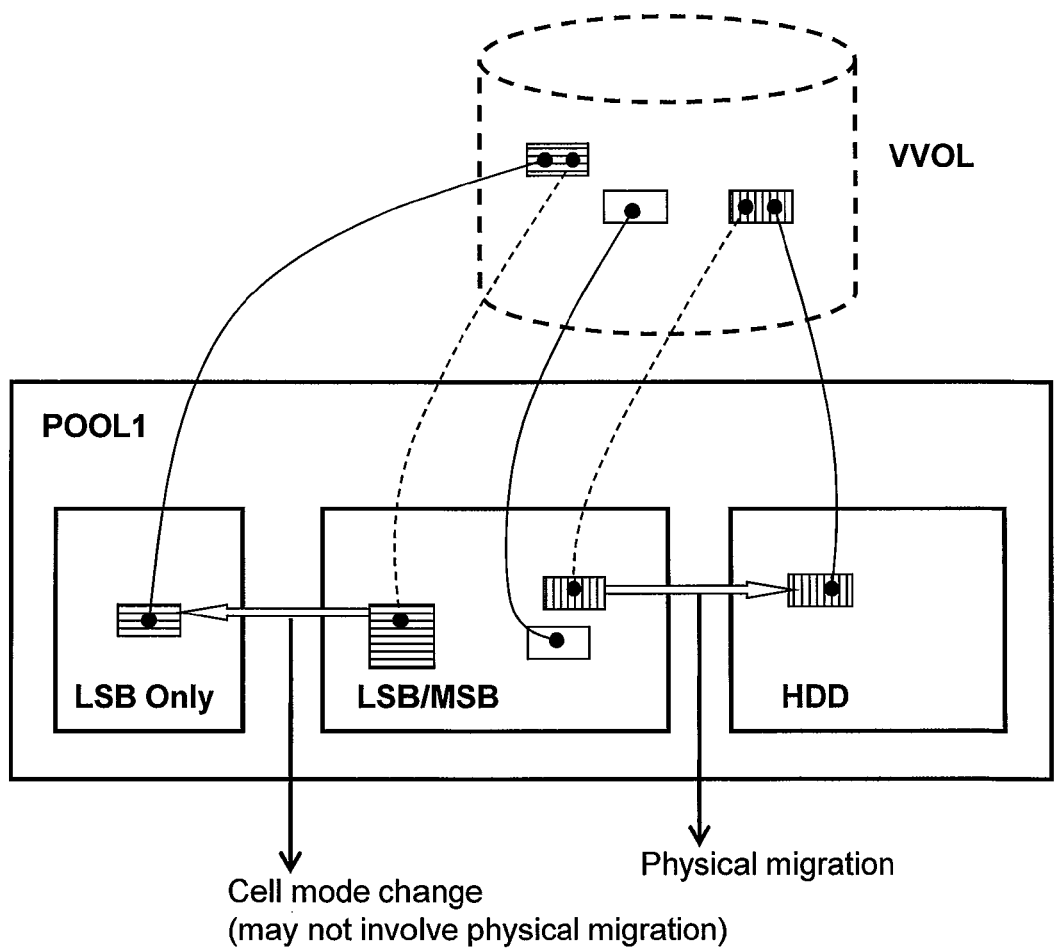
FIG. 36 is a diagram showing an overview of segment-unit tier management, which takes into account a cell mode related to the first example.

FIG. 36 is a diagram showing an overview of segment-unit tier management, which takes the cell mode into account, related to the first example.

In a case where the cell mode can be changed, not only is a conventional data copy between tiers possible, but it is also possible to change tiers in accordance with changing the cell mode (changing LSB Only and LSB/MSB) of the segment itself. Consequently, in a case where tier management is carried out taking a cell mode change into account, a data copy is not necessarily generated. However, since the capacity capable of being used in accordance with a cell mode change and the number of cell rewrites will increase and decrease, and tier management is carried out by being conscious not only of a conventional tier range (performance information), but also of the capacity and the number of cell rewrites.

Figure 37:
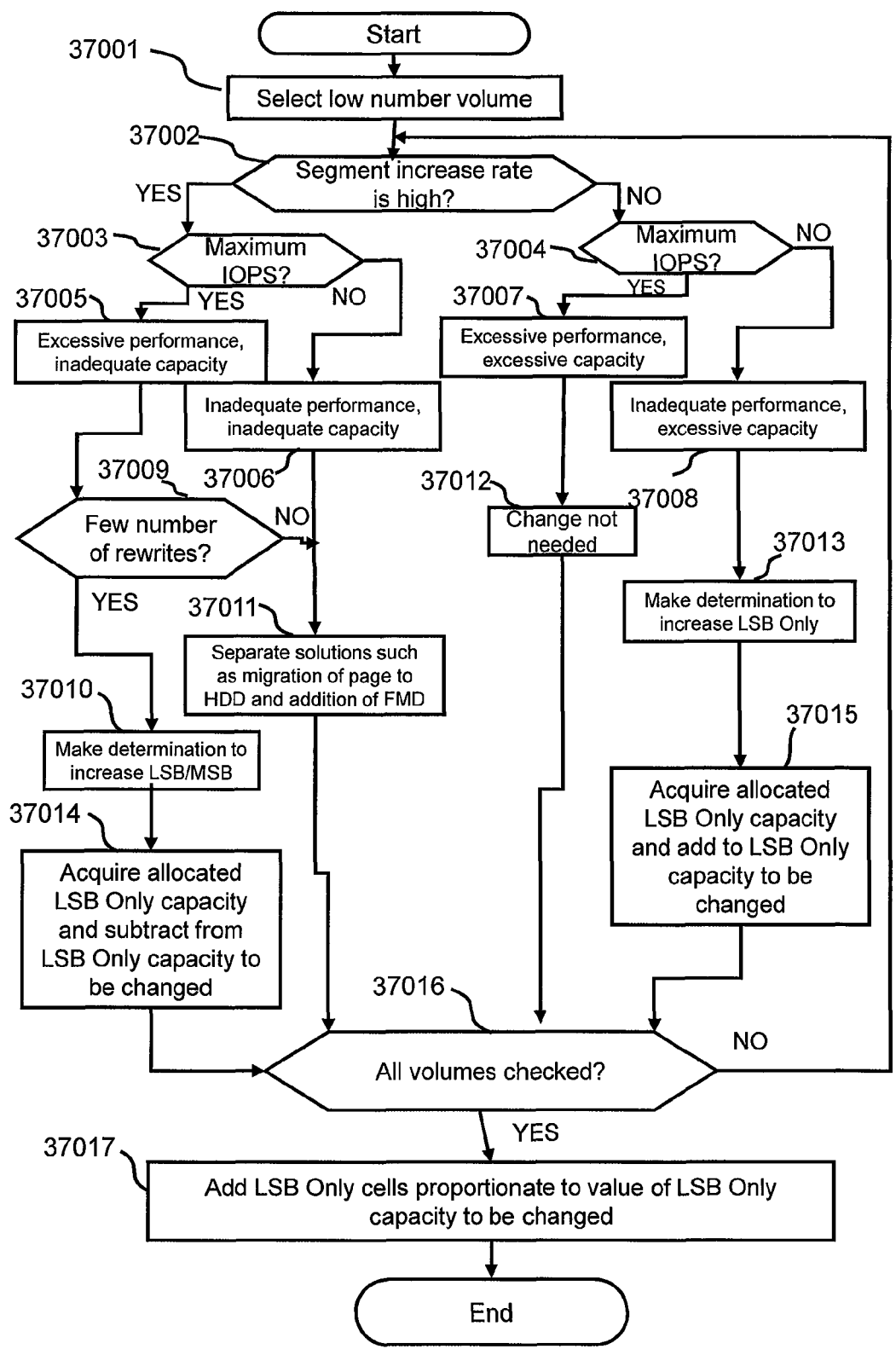
FIG. 37 is a flowchart of an example of a cell mode change amount determination process related to the first example.
Figure 38:
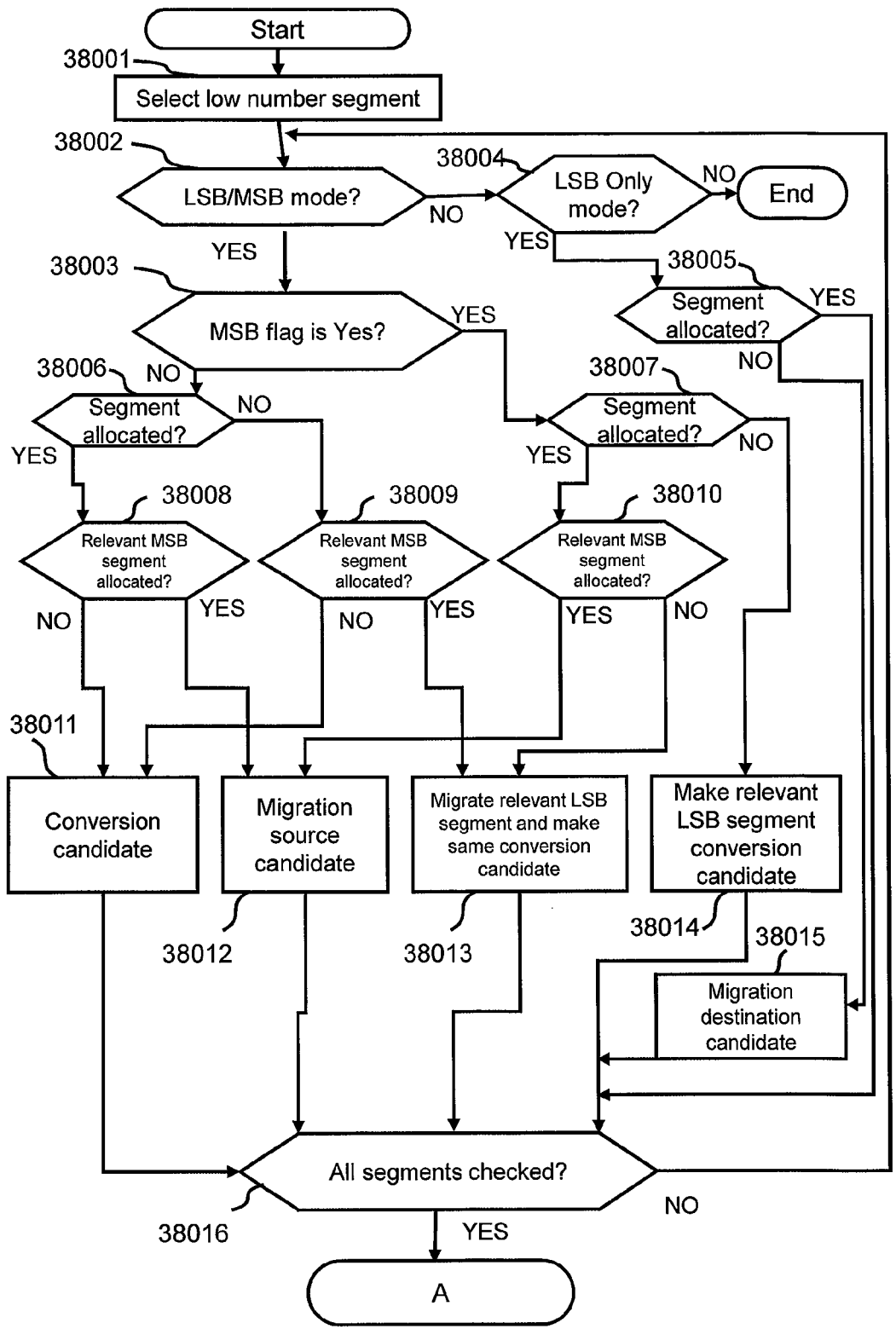
FIG. 38 is a first flowchart of an example of a cell changing process related to the first example for changing a cell capable of using both LSB/MSB to a cell capable of using only LSB.
Figure 39:
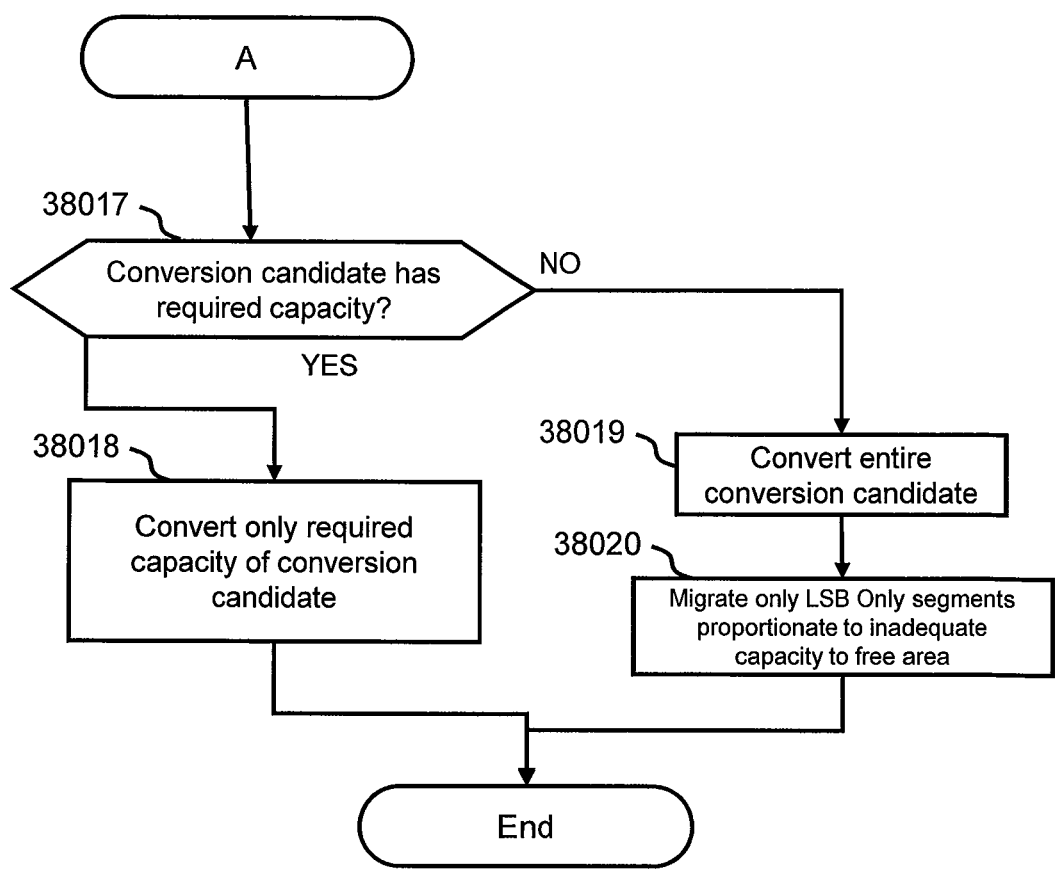
FIG. 39 is a second flowchart of an example of a cell changing process related to the first example for changing a cell capable of using both LSB/MSB to a cell capable of using only LSB.
Figure 40:
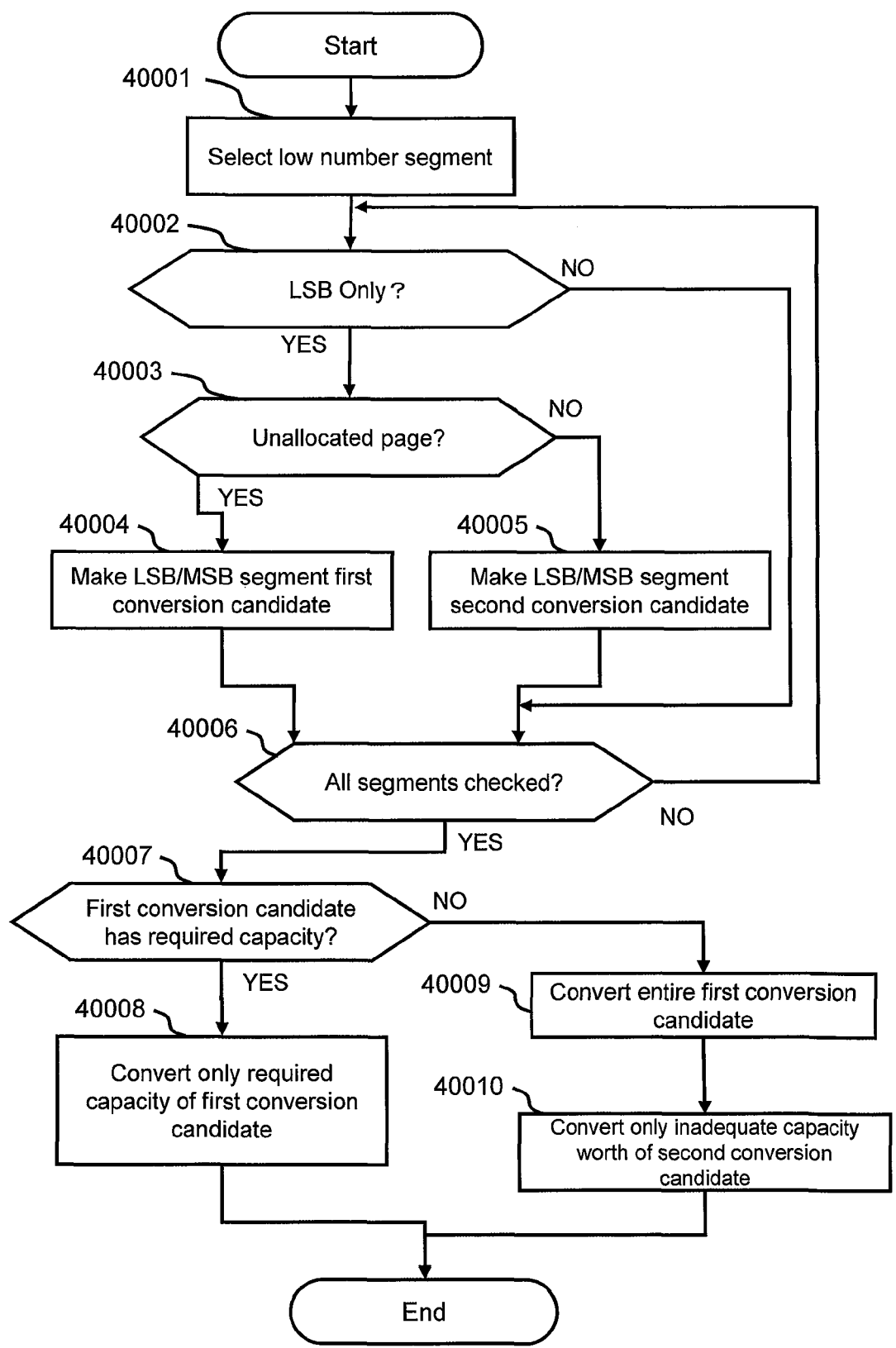
FIG. 40 is a flowchart of an example of a cell changing process related to the first example for changing a cell capable of using only LSB to a cell capable of using both LSB/MSB.

FIG. 37 is a flowchart of an example of a cell mode change amount determination process related to the first example. FIGS. 38 and 39 are flowcharts of an example of a process for changing a cell mode related to the first example from the LSB/MSB mode to the LSB Only mode. FIG. 40 is a flowchart of an example of a process for changing a cell mode related to the first example from the LSB Only mode to the LSB/MSB mode. In general, according to the processing of FIG. 37, a determination is made as to the quantity of segments for which the cell mode of the corresponding FMD 1030 should be changed. In a case where the result of this determination is that LSB Only-mode segments should be increased, the segments to be changed to the LSB Only mode are specifically determined in accordance with FIGS. 38 and 39, and a determination is made that a data migration should be carried out in accordance therewith. In a case where the result of this determination is that LSB/MSB-mode segments should be increased, the segments to be changed to the LSB/MSB mode are specifically determined in accordance with FIG. 40, and a determination is made that a data migration should be carried out in accordance therewith.

In these flowcharts, tier range information is not used as the performance requirement, and instead, the performance requirements required by the application are used, but the present invention is not particularly limited to this. Tier range information may be used, and other requirements may be used.

The respective processes denoted by these FIGS. 37 through 40 are executed regularly (or repeatedly) by the system management program 12010. The execution period may be configured by the user, or may be decided automatically by the system management program 12010.

<5.6.1 Cell Mode Change Determination>.

FIG. 37 will be explained below. In the following processing flow, by determining a suitable cell mode in units of virtual internal LUs and consolidating the results, a determination is made regarding the quantity of segments serving as a storage pool for which the cell mode of the corresponding FMD 1030 should be changed. However, the determination may be made using a unit, which is smaller than a virtual internal LU, and the determination may be made using a unit, which is larger than a virtual internal LU.

The system management program 12010 selects a virtual internal LU with the lowest LU identifier with respect to a certain storage pool in the management-target storage system 1000 (Step 37001).

Next, the system management program 12010 determines the level of increase in segment usage by checking the segment capacity utilization trend information 12110, checking the rate of increase of segment allocation to the virtual internal LU, and checking whether or not any tier will become depleted after a fixed period of time as a result of the allocation of segments to this virtual internal LU (Step 37002). This fixed period of time may be the period during which the relevant processing is being carried out, or another criterion may be used. Also, rather than determining whether or not depletion will occur, a determination may be made that the segment usage increase is high in a case where this usage exceeds a certain fixed rate of increase.

In a case where it has been determined that the segment usage increase is high (YES in Step 37002), the system management program 12010 advances the processing to Step 37003, and in a case it has been determined that the segment usage increase is not high (NO in Step 37002), the system management program 12010 advances the processing to Step 37004.

In Step 37003, the system management program 12010 uses the segment capacity utilization trend information 12110 to check the average IOPS of the virtual internal LU, and to check whether or not this IOPS satisfies the performance requirement of the AP performance requirement information 12100.

When the result is that the IOPS satisfies the performance requirement (YES in Step 37003), the average IOPS for the relevant virtual internal LU is larger than the required value, the rate of capacity increase is high, and there is the danger that the tier will become depleted in the future, and as such, the system management program 12010 determines that there is excessive performance and inadequate capacity (Step 37005), and advances the processing to Step 37009.

Alternatively, in a case where the IOPS do not satisfy the performance requirement (NO in Step 37003), the average IOPS for the relevant virtual internal LU is smaller than the required value, the rate of capacity increase is high, and there is the danger that the tier will become depleted in the future, and as such, the system management program 12010 determines that there is inadequate performance and inadequate capacity (Step 37006), and advances the processing to Step 37011.

In Step 37009, in order to determine whether or not the cell mode can be changed for the relevant virtual internal LU, the system management program 12010 uses the management-side cell mode information 12090 and the management-side VL conversion information 12040B to compare the number of cell rewrites of the cell corresponding to the segment allocated to the virtual internal LU to a prescribed threshold (Step 37009). The prescribed threshold is considered to be the upper limit in the catalog specification at MSB rewrite, but may also be another value. The catalog specification at this time may be the value used as the MLC. However, the prescribed threshold may also be another (for example, the SLC) catalog specification value. The prescribed threshold may also be an upper-limit value configured by the user.

In a case where the number of cell rewrites does not exceed an upper limit (YES in Step 37009), system management program 12010 determines that the LSB/MSB-mode cells should be increased with respect to the relevant virtual internal LU (Step 37010). Then this program acquires the total capacity of the LSB Only cell mode segments from among the segments allocated to the relevant virtual internal LU, subtracts this total capacity from the LSB Only capacity to be changed (named CAP_LSBOnly) (Step 37014), and advances the processing to Step 37016.

Alternatively, in a case where the number of cell rewrites exceeds the upper limit (NO in Step 37009), the system management program 12010 advances the processing to Step 37011.

In Step 37011, the system management program 12010 determines that a cell mode change alone will not be able to solve the problem of the relevant volume (inadequate performance, inadequate capacity) and issues a warning to the user with respect to the relevant virtual internal LU. The system management program 12010 may display the warning to the user, as well as separate solutions, such as solving for the inadequate capacity by migrating a temporary page to the HDD without changing the cell mode, and solving for the inadequate performance and inadequate capacity by adding a FMD. Thereafter, the system management program 12010 advances the processing to Step 37016.

Meanwhile, in Step 37004, the system management program 12010 uses the segment capacity utilization trend information 12110 to check the average IOPS of a virtual internal LU, and checks whether or not this IOPS satisfies the performance requirement of the AP performance requirement information 12100.

When the result is that the IOPS satisfies the performance requirement (YES in Step 37004), the average IOPS for the relevant virtual internal LU is larger than the required value, the rate of capacity increase is low, and there is no danger that the tier will become depleted in the future, and as such, the system management program 12010 determines that there is excessive performance and, in addition, excessive capacity (Step 37007), determines that there is no particular need for a cell mode change with respect to the relevant virtual internal LU (Step 37012), and advances the processing to Step 37016.

Alternatively, in a case where the IOPS does not satisfy the performance requirement (NO in Step 37004), the average IOPS for the relevant virtual internal LU is smaller than the required value, the rate of capacity increase is low, and there is no danger that the tier will become depleted in the future, and as such, the system management program 12010 determines that there is inadequate performance and, in addition, excessive capacity (Step 37008), and determines that the LSB Only area should be increased with respect to the relevant virtual internal LU (Step 37013).

Next, the system management program 12010 acquires the total capacity of the LSB Only cell mode segments of the segments allocated to the relevant virtual internal LU, adds this total capacity to the LSB Only capacity (CAP_LSBOnly) to be changed (Step 37015), and advances the processing to Step 37016.

In Step 37016, the system management program 12010 checks whether or not checks have been carried out for all the virtual internal LUs belonging to the storage pool. When the result is that checks have not been carried out for all of the virtual internal LUs (NO in Step 37016), the system management program 12010 executes the processing from Step 37002 with respect to the next number virtual internal LU. Alternatively, when checks have been carried out for all of the virtual internal LUs (YES in Step 37016), the system management program 12010 determines that only the LSB Only mode cells having the value of the LSB Only capacity to be changed (CAP_LSBOnly) will be increased (Step 37017), and ends the processing. In a case where the CAP_LSBOnly is a negative value, the system management program 12010 determines the LSB/MSB-mode cells will be increased in proportion to this capacity.

The preceding is an explanation of the cell mode change amount determination process. In a case where the application is low load, and neither a read nor write request of equal to or greater than the required performance is sent, a determination is made that the performance is inadequate for the virtual internal LU. As a countermeasure for this, a load status, such as the application load, a backlog status, or awaiting-to-send status of the relevant request, is measured, and in a case where it is determined to be the above-mentioned low load, the low load-determined target may be removed as a target of this processing. Also, either an average response time or a maximum response time may be used instead of the IOPS. Another method may be used to avoid making a determination that performance is inadequate when the application itself is low load.

<5.6.2. Change-target Cell Retrieval/Conversion Process>.

FIGS. 38, 39 and 40 are flowcharts of an example of a change-target cell retrieval and conversion process executed in a case where the cell mode change amount has been determined. FIGS. 38 and 39 are flowcharts of an example of the processing subsequent to a determination having been made in the processing of FIG. 37 to increase the LSB Only-mode cells. In a case where the cell mode is changed from the LSB/MSB mode to the LSB Only mode, the data stored in the MSB is lost, and as such, a data migration must be carried out in a case where data is stored in the MSB. Consequently, in the processing shown in FIGS. 38 and 39, the cell mode is changed from the LSB/MSB mode to the LSB Only mode after determining whether the change may be carried out without performing a migration at cell mode change time, whether to carry out a migration, and in the case of a migration, where the data is to be migrated from and to. This process will be explained in detail below.

As shown in FIG. 38, the system management program 12010 uses the management-side pool information 12040A to select a segment with the lowest number from the corresponding storage pool (Step 38001).

Next, the system management program 12010 uses the management-side cell mode information 12090 to check the cell mode of the corresponding segment (Step 38002), and in a case where the cell mode is LSB/MSB (YES in Step 38002), advances the processing to Step 38003, and, alternatively, in a case where the cell mode is other than LSB/MSB (NO in Step 38002), advances the processing to Step 38004.

In Step 38003, the system management program 12010 uses the management-side pool information 12040A to determine whether the corresponding segment comprises the MSB of the FMD 1030. In a case where the segment comprises MSB (that is, it is a MSB segment) (YES), the system management program 12010 proceeds to Step 38007, and, alternatively, in a case where the segment comprises LSB (that is, it is a LSB segment) (NO), the system management program 12010 proceeds to Step 38006.

In Step 38006, the system management program 12010 uses the management-side pool information 12040A to check the allocation status of the relevant segment. When the segment is allocated (YES in Step 38006), the system management program 12010 uses the management-side pool information 12040A to check the allocation status of the MSB segment corresponding to the relevant LSB segment (Step 38008).

When the result is that the segment is not allocated (NO in Step 38008), the system management program 12010 uses the management-side cell mode information 12090, stores the number of cell rewrites of the relevant segment, makes the relevant segment a candidate for a LSB Only conversion (Step 38011), and advances the processing to Step 38016. Alternatively, in a case where the segment is allocated (YES in Step 38008), the system management program 12010 uses the management-side cell mode information 12090, stores the number of cell rewrites of the relevant segment, makes the relevant segment a migration-source candidate when there are few LSB Only conversion candidates (Step 38012), and advances the processing to Step 38016.

Alternatively, in a case where the relevant LSB segment is not allocated (NO in Step 38006), the system management program 12010 uses the management-side pool information 12040A to check the allocation status of the MSB segment corresponding to the relevant LSB segment (Step 38009).

When the result is that the checked MSB segment is not allocated (NO in Step 38009), the system management program 12010 uses the management-side cell mode information 12090, stores the number of cell rewrites of the relevant segment, makes the relevant segment a LSB Only conversion candidate (Step 38011), and advances the processing to Step 38016. Alternatively, in a case where the checked MSB segment is allocated (YES in Step 38009), the system management program 12010 uses the management-side cell mode information 12090, stores the number of cell rewrites of the relevant segment, sends a data migration request to the storage system 1000 such that the content of the MSB are subjected to data migration when the segment itself is LSB, and upon completion of the data migration process (FIG. 19) by the configuration control program 4030, makes the LSB-side page an LSB Only candidate (Step 38013), and advances the processing to Step 38016. The data migration request at this time specifies the segment selected in either Step 38001 or Step 38016 as the migration-source. However, the ID of the chunk to which the migration-source segment is allocated may be checked, and the relevant chunk ID may be specified in the data migration request. Furthermore, for example, the migration-destination segment at this time may be an unallocated LSB segment.

Alternatively, in a case where the segment selected in either Step 38001 or Step 38016 is a MSB segment (Step 38003), the system management program 12010 uses the management-side pool information 12040A to check the allocation status of the relevant segment (Step 38007). When the result is that the segment is allocated (YES in Step 38007), the system management program 12010 uses the management-side pool information 12040A to check the allocation status of the LSB segment corresponding to the relevant MSB segment (Step 38010).

When the result is that the segment is allocated (YES in Step 38010), the system management program 12010 uses the management-side cell mode information 12090, stores the number of cell rewrites of the relevant segment, makes the relevant segment a migration-source candidate when there are few LSB Only conversion candidates (Step 38012), and advances the processing to Step 38016. Alternatively, in a case where the segment is not allocated (NO in Step 38010), the system management program 12010 processes Step 30813, which has already been explained, and advances the processing to Step 38016.

Alternatively, in a case where the segment selected in either Step 38001 or Step 38016 is an MSB segment but is not allocated (NO in Step 38007), the system management program 12010 stores the number of cell rewrites of the LSB segment corresponding to the relevant MSB segment, makes this segment an LSB Only candidate (Step 38014), and advances the processing to Step 38016.

In the meantime, in Step 38004, the system management program 12010 uses the management-side cell mode information 12090 to check the cell mode of the relevant segment, and in a case where the cell mode is HDD instead of LSB Only (NO in Step 38004), ends the processing, and, alternatively, in a case where the cell mode is the LSB Only mode (YES in Step 38004), advances the processing to Step 38005.

In Step 38005, the system management program 12010 uses the management-side pool information 12040A to check the allocation status of the relevant segment. When the result is that the segment is allocated (YES in Step 38005), the system management program 12010 advances the processing to Step 38016.

Alternatively, when the segment is not allocated (NO in Step 38005), the system management program 12010 uses the management-side cell mode information 12090, stores the number of cell rewrites of the relevant segment, makes the relevant segment a migration-destination candidate when there are few LSB Only conversion candidates (Step 38015), and advances the processing to Step 38016.

In Step 38016, the system management program 12010 checks whether or not checks of all the segments belonging to one storage pool have ended. When these checks have ended, the system management program 12010 advances the processing to Step 38017 shown in FIG. 39, and, alternatively, when these checks have not ended, selects the segment of the next segment ID and moves the processing to Step 38002.

In Step 38017, the system management program 12010 checks whether the total capacity of the LSB Only conversion candidates checked using the processing up to Step 38016 satisfies the LSB Only capacity to be changed, which was checked using the cell increase determination process (FIG. 37) (Step 38017).

When the result is that the capacity is satisfied (YES in Step 38017), the system management program 12010 selects only the capacity required from a segment having a large number of cell rewrites from among the LSB Only conversion candidates, issues an instruction to the configuration control program 4030 to change the cell mode to the LSB Only mode, updates the management-side pool information 12040A, the management-side VL conversion information 12040B, and the management-side cell mode information 12090 (Step 38018), and ends the processing. Preferentially changing a segment with a large number of cell rewrites to the LSB Only mode is done because the degree of threshold voltage deterioration is small for the LSB Only mode, and data read errors do not readily occur. However, a different segment may be given preference.

Alternatively, when the capacity is not satisfied (NO in Step 38017), the system management program 12010 issues an instruction to the configuration control program 4030 to change the cell mode of all the conversion candidates to the LSB Only mode, and updates the management-side pool information 12040A, the management-side VL conversion information 12040B, and the management-side cell mode information 12090 (Step 38019).

Next, the system management program 12010 sends the storage system 1000 a data migration request to perform a data migration from the MSB segment of the migration-source candidate having a large number of rewrites (selected in Step 38012) to the LSB segment of the migration-destination candidate (selected in Step 38015) in proportion to the deficient amount of capacity in Step 38019, updates the management-side pool information 12040A, the management-side VL conversion information 12040B, and the management-side cell mode information 12090 (Step 38020), and ends the processing. The data migration request at this time specifies the migration-source candidate segment and the migration-destination candidate segment. However, the ID of the chunk to which the migration-source segment is allocated may be checked, and the relevant chunk ID may be specified in the data migration request.

In tier management processing that takes into account the cell mode, a cell mode change is executed in units of segments of a virtual internal LU, but the present invention is not limited to this. Even in a case where the cell mode is changed from the LSB/MSB mode to the LSB Only mode using units of internal LUs, units of parity groups, units of FMDs, or units of FM cells in storage area management, which is not tier management, either the start-end addresses [I], the start-end addresses [G] and the start-end addresses [D], or the internal LU identifier, the parity group identifier, the FMD identifier, and the FM cell identifier may be configured as the respective units of input.

FIG. 40 is a flowchart of an example of processing subsequent to making the determination in the processing of FIG. 37 that the LSB/MSB mode cells should be increased. In a case where the cell mode is changed from the LSB Only mode to the LSB/MSB mode, data does not decrease, making a data migration unnecessary.

The system management program 12010 uses the management-side pool information 12040A to select the segment with the lowest number from the relevant storage pool (Step 40001). Next, the system management program 12010 uses the management-side cell mode information 12090 to check the cell mode of the relevant segment (Step 40002).

When the result is that the cell mode is other than LSB Only (NO in Step 40002), the system management program 12010 advances the processing to Step 40006. Alternatively, when the result is that the cell mode in the LSB Only mode (YES in Step 40002), the system management program 12010 uses the management-side pool information 12040A to check the allocation status of the relevant segment (Step 40003).

When the result is that the relevant segment is not allocated (YES in Step 40003), the system management program 12010 uses the management-side cell mode information 12090, stores the number of cell rewrites of the relevant segment, makes the relevant segment a first LSB/MSB conversion candidate (Step 40004), and advances the processing to Step 40006.

Alternatively, in a case where the relevant segment is allocated (NO in Step 40003), the system management program 12010 uses the management-side cell mode information 12090, stores the number of cell rewrites of the relevant segment, makes the relevant segment a second LSB/MSB conversion candidate (Step 40005), and advances the processing to Step 40006.

In Step 40006, the system management program 12010 checks whether or not checks of all the segments belonging to one storage pool have ended. In a case where these checks have not ended (NO in Step 40006), the system management program 12010 selects the segment of the next segment ID and moves the processing to Step 40002.

Alternatively, in a case where these checks have ended (YES in Step 40006), the system management program 12010 checks whether the total capacity of the LSB/MSB conversion candidates checked up to Step 40006 satisfies the LSB/MSB capacity to be changed, which was checked in the cell increase determination process (FIG. 37) (Step 40007).

When the result is that the capacity is satisfied (YES in Step 40007), the system management program 12010 selects only the capacity required from a segment having a small number of cell rewrites from among the first LSB/MSB conversion candidates, issues an instruction to the configuration control program 4030 to change the cell mode to the LSB/MSB mode, updates the management-side pool information 12040A, the management-side VL conversion information 12040B, and the management-side cell mode information 12090 (Step 40008), and ends the processing.

Alternatively, when the capacity is not satisfied (NO in Step 40007), the system management program 12010 issues an instruction to the configuration control program 4030 to change the cell mode of all the first conversion candidates to the LSB/MSB mode, and updates the management-side pool information 12040A, the management-side VL conversion information 12040B, and the management-side cell mode information 12090 (Step 40009).

Next, the system management program 12010 issues an instruction to the configuration control program 4030 to change the cell mode from the second LSB/MSB conversion candidate having a small number of rewrites to the LSB/MSB mode in proportion to the deficient amount of capacity in Step 40009, updates the management-side pool information 12040A, the management-side VL conversion information, and the management-side cell mode information 12090 (Step 40010), and ends the processing.

In tier management processing that takes into account the cell mode, a cell mode change is executed in units of segments of a virtual internal LU, but the present invention is not limited to this. Even in a case where the cell mode is changed from the LSB/MSB mode to the LSB Only mode using units of internal LUs, units of parity groups, units of FMDs, or units of FM cells in storage area management, which is not tier management, either the start-end addresses [I], the start-end addresses [G] and the start-end addresses [D], or the internal LU identifier, the parity group identifier, the FMD identifier, or the FM cell identifier may be configured as the respective units of input.

According to the first example, it is possible to provide a storage system, which is able to flexibly change the number of bits stored in a memory cell subsequent to the storage system being installed. This storage system can also be managed flexibly.

A first example has been explained hereinabove, but this is an example for explaining the present invention and does not purport to limit the scope of the present invention solely to this example. The present invention can also be put into practice in a variety of other modes. For example, the storage controller 1010 can also adopt another configuration. For example, instead of the configuration described hereinabove, the storage controller 1010 can comprise multiple first control parts (for example, control circuit boards) for controlling communications with a higher-level device, multiple second control parts (for example, control circuit boards) for controlling communications with a FMD 1030, a cache memory capable of storing data exchanged between a higher-level device and the FMD 1030, a control memory capable of storing data for controlling the storage system 1000, and a coupling part (for example, a crossbar switch or other such switch) for coupling the respective first control parts, the respective second control parts, the cache memory and the control memory. In accordance with this, either one or both of the first control parts and the second control parts can cooperate to carry out the processing of the above-described storage controller 1010. The control memory may be eliminated, in which case a storage area for storing the information stored by the control memory may be disposed in the cache memory.

Also, the FMD controller 2010 may manage the FMD cell mode instead of the storage controller 1010.

Rather than the values of the memory cell being two bits, i.e. the LSB and the MSB, the cell mode corresponding to the FMD may support three or more bits in accordance with performing cell programming and cell erases values of three or more bits in a single memory cell. For example, in the case of three bits, it becomes possible to specify the three cell modes of one-bit Only, two-bits changeable, and three-bits changeable.

Example 2

A second example will be explained below by referring to the drawings. In the explanation of the second example, the differences with the first example will be explained.

In the second example, the application I/O performance requirement of the first example is not the basic information for controlling the cell mode; the cell mode is controlled on the basis of the access measurement value. In contrast to the first example, the second example provides a new I/O histogram display screen (FIG. 50), and changes the cell mode change determination process shown in FIG. 37 to a process shown in FIG. 44.

Figure 50:
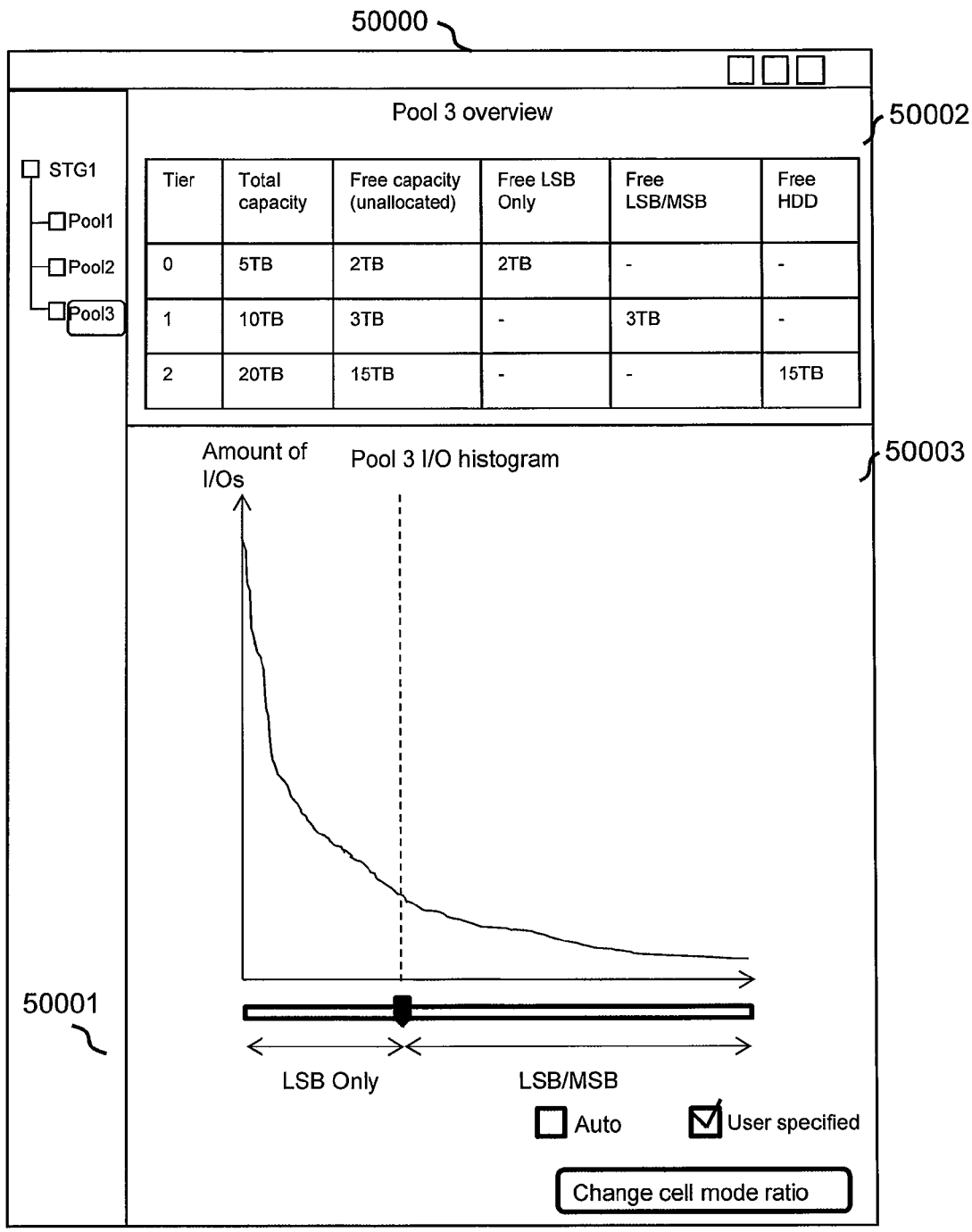
FIG. 50 is a diagram showing an example of a GUI, which displays an I/O histogram related to the second example.

FIG. 50 is a diagram showing an example of a GUI, which displays an I/O histogram related to the second example.

A display screen 50000 comprises a first pane 50001, a second pane 50002, and a third pane 50003, information such as that shown below is displayed in the respective panes, and the panes support input from the input/output device. The panes displayed in the display screen 50000 are not limited thereto, and, for example, may also comprise the fourth pane 41004 and the fifth pane 41005 shown in FIG. 41.

(First Pane 50001) The first pane 50001 is configured the same as the first pane 41001 of FIG. 41.

(Second Pane 50002) The second pane 50002 is configured the same as the second pane 41002 of FIG. 41.

(Third Pane 50003) The third pane 50003 displays an I/O histogram of a segment included in the storage pool 1080 corresponding to the display object specified from the input/output device using the first pane 50001. The I/O histogram represents the access measurement value of each segment along the vertical axis of the graph, and arranges the segments from the left in order from the highest access measurement value. Therefore, needless to say, to achieve this display the system management program 12010 creates the histogram using the sorted contents in the access measurement value column of the management-side VL conversion information 12040B. The third pane 50003 has a slider for controlling the cell mode, and in a case where a check has been placed in the user-specified checkbox, an instruction for changing the cell mode ratio can be implemented by sliding the slider left or right. That is, by sliding the slider in the third pane 50003 to the right, it is possible to configure more segments with high access measurement values in the LSB Only mode. In this screen, when the change cell mode ratio button is pressed after changing the slider, the system management program 12010 receives the cell mode ratio as input. The method for receiving a check from the user is not limited to a checkbox, and, for example, a check can be placed in a radio button or another icon.

It is desirable that the horizontal axis of the histogram and the slider rail object be arranged parallelly. In addition, the length of the rail object on the right and left of the slider may be proportionate to the number (or capacity) of segments, which are LSB Only mode, and the number (or capacity) of segments, which are LSB/MSB mode prior to a cell mode change. In addition, the rail may be arranged in the screen such that the number (or capacity) of segments denoted by the unit length of the horizontal axis of the histogram is the same as the number (or capacity) of segments denoted by the unit length of the rail. As an example of this, in a case where one dot signifies one segment, one dot of the rail also displays one segment worth of cell mode change. This is the same in a case where one centimeter worth of dots is 100 segments, or one gigabyte of segments. In addition, so as to be able to simulate a post-change cell mode ratio, the length of the left side of the rail denoting the LSB Only mode and the length of the right side of the rail denoting the LSB/MSB mode may change while the slider is being operated. In a case where the slider has been moved one centimeter to the LSB Only mode side, this, for example, makes the left side of the rail one centimeter shorter, and the right side of the rail two centimeters longer (two centimeters worth of LSB/MSB mode segments are generated from one centimeter worth of LSB Only mode).

An unallocated segment configured from the FMD 1030 may also be the target of this histogram display. In accordance with this, the access measurement value of the unallocated segment may be displayed as the equivalent of zero. A segment configured from the HDD may also be a target of this histogram display.

However, the changing of the cell mode ratio is not limited to the slider, and, for example, a LSB Only ratio may be inputted to a textbox using a direct value, and the vertical dotted line in FIG. 50 may be moved as though it were a slider. The configuration may also be such that a cell mode change request is sent by merely moving the slider without pressing the change cell mode ratio button. The present invention is not limited to the GUI; an access measurement value may be displayed using CLI, and the cell mode ratio may be inputted by a user, who is using the management server 1200.

<Cell Mode Change Determination Process, which Takes Access Measurement Value into Account>.

Figure 44:
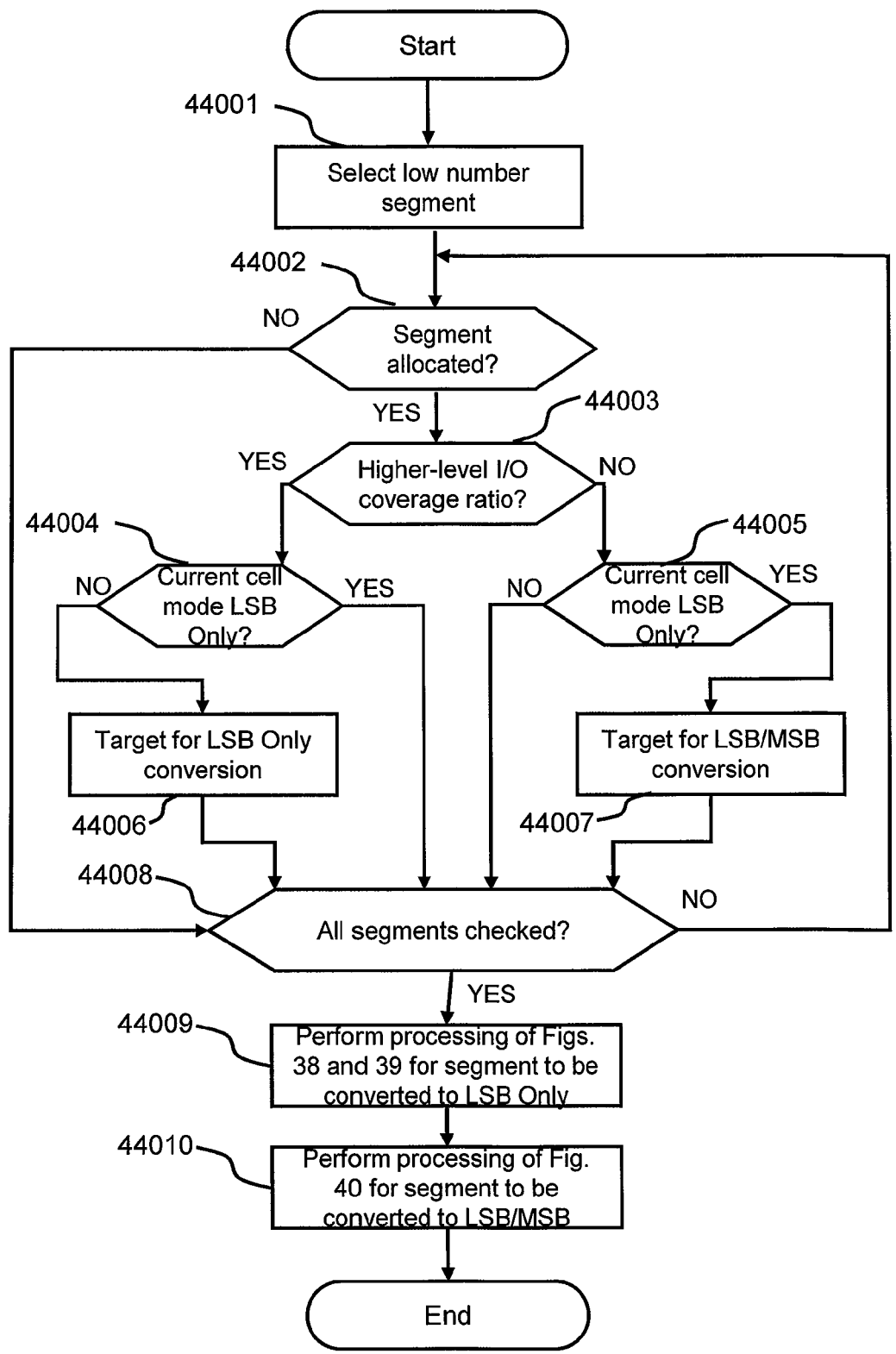
FIG. 44 is a flowchart of an example of a cell mode changing process, which takes into account I/O coverage related to a second example.

FIG. 44 is a flowchart of an example of a cell mode change process, which takes into account the access measurement value, related to the second example. In this drawing, the explanation is premised on the fact that the user has specified the ratio of the LSB Only mode using the slider in the GUI of FIG. 50.

The system management program 12010 uses the management-side pool information 12040A and the management-side cell mode information 12090 to select a segment, the cell mode of which is either LSB Only or LSB/MSB, and, in addition, which has the lowest segment number, from the relevant storage pool (Step 44001).

Next, the system management program 12010 uses the management-side pool information 12040A to check whether or not the relevant segment is allocated (Step 44002). In a case where the relevant segment is not allocated (NO in Step 44002), the system management program 12010 advances the processing to Step 44008.

Alternatively, in a case where the relevant segment is allocated (YES in Step 44002), the system management program 12010 uses the access measurement value of the management-side VL conversion information 12040B to check whether or not the relevant segment is a higher-level segment than the user-specified cell mode ratio (Step 44003). This process computes a threshold obtained by multiplying the cell mode ratio by the total number of segments comprising the LSB of the FMD 1030 in the storage pool, calculates what number the relevant segment is by counting from the segment with the highest value in a case where the segments are sorted by access measurement value, and determines that the segment is higher level when this value is less than the above-mentioned threshold.

In the case of a higher-level segment (YES in Step 44003), the system management program 12010 uses the management-side cell mode information 12090 to check whether or not the current cell mode is LSB Only (Step 44004). When the result is that the cell mode is LSB Only (YES in Step 44004), the system management program 12010 advances the processing to Step 44008, and, alternatively, when the result is that the cell mode is not LSB Only (NO in Step 44004), targets the relevant segment to be changed to the LSB Only mode (Step 44006), and advances the processing to Step 44008.

Alternatively, in a case where the relevant segment is not a higher-level segment (NO in Step 44003), the system management program 12010 uses the management-side cell mode information 12090 to check whether or not the current cell mode is LSB Only (Step 44005). When the result is that the current cell mode is LSB Only (YES in Step 44005), the system management program 12010 targets the relevant segment to be changed to the LSB/MSB mode (Step 44007), and advances the processing to Step 44008, and, alternatively, in a case where the current cell mode is not LSB Only (NO in Step 44005), advances the processing to Step 44008.

In Step 44008, the system management program 12010 checks whether or not checks of all the segments to determine whether or not the cell mode is LSB Only or LSB/MSB have ended. When all the checks have not ended (NO in Step 44008), the system management program 12010 next selects the segment with the lowest number and moves the processing to Step 44002.

Alternatively, when all the checks have ended (YES in Step 44008), the system management program 12010 changes the cell mode of all the segments, which are targeted from among the segments for which the check has ended to have the cell mode changed to LSB Only, by executing the processing of FIGS. 38 and 39 (Step 44009). Next, the system management program 12010 changes the cell mode of all the segments, which are targeted from among the segments for which the check has ended to have the cell mode changed to LSB/MSB, by executing the processing of FIG. 40 (Step 44010), and ends the processing.

According to the second example, it is possible to realize control of the cell mode based on the amount of I/Os from the host computer 1100.

The second example has been explained hereinabove, but this is an example for explaining the present invention and does not purport to limit the scope of the present invention solely to this example. For example, the management server 1200 may receive as input the I/O coverage ratio of LSB Only-mode segments instead of the cell mode ratio in FIG. 50. The I/O coverage ratio is a value, which is calculated as a percentage of the total number of accesses of an allocated segment for which the cell mode is the LSB Only mode using the total of the access measurement values of all allocated segments corresponding to the storage pool as a parameter. The access measurement value of the segment is obtained by searching the management-side VL conversion information 12040B using the segment ID. In a case where the cell mode of each segment is changed on the basis of this input, the processing of the system management program 12010 is as follows.

(Step 1) The system management program 12010 calculates the total value (a first total value) of the access measurement values of all the allocated segments included in the storage pool.

(Step 2) The system management program 12010 sorts the allocated segments included in the storage pool on the basis of the access measurement values.

(Step 3) The system management program 12010 configures a second total value variable to 0.

(Step 4) The system management program 12010 fetches a segment from the top of a list of sorted segments (that is, the allocated segment with the highest access measurement value).

(Step 5) The system management program 12010 adds the access measurement value of the fetched segment to the second total value variable.

(Step 6) The system management program 12010, in a case where the second total value variable is smaller than a value obtained by multiplying the first total value by the I/O coverage ratio, fetches the next segment from the sorted segment list and moves the processing to Step 5. In a case where the second total value variable is not smaller than this value, the system management program 12010 advances the processing to Step 7.

(Step 7) The system management program 12010 changes the cell mode to the LSB/MSB mode by executing the processing flow of FIG. 40 with respect to a segment remaining in the sorted list. Since a new MSB segment is created while executing the processing of FIG. 40, a data migration request, which makes the segment remaining in the sorted list the migration source and makes the created MSB segment the migration destination, may be sent as needed.

(Step 8) The system management program 12010 changes the cell mode of the relevant segment to the LSB Only mode by processing the steps of FIGS. 38 and 39 with respect to an allocated segment not left in the sorted list.

The preceding is cell mode control in accordance with the I/O coverage ratio, and there is no problem with a small number of segments being removed from the segments targeted in Step 1 at this time. That is, "all of the allocated segments included in the storage pool" may also be "substantially all of the allocated segments included in the storage pool".

Example 3

A third example will be explained below by referring to the drawings. In the explanation of the third example, the differences with the first example and the second example will be explained.

The third example shows a method for checking capacity billing resulting from changing the cell mode.

Figure 45:
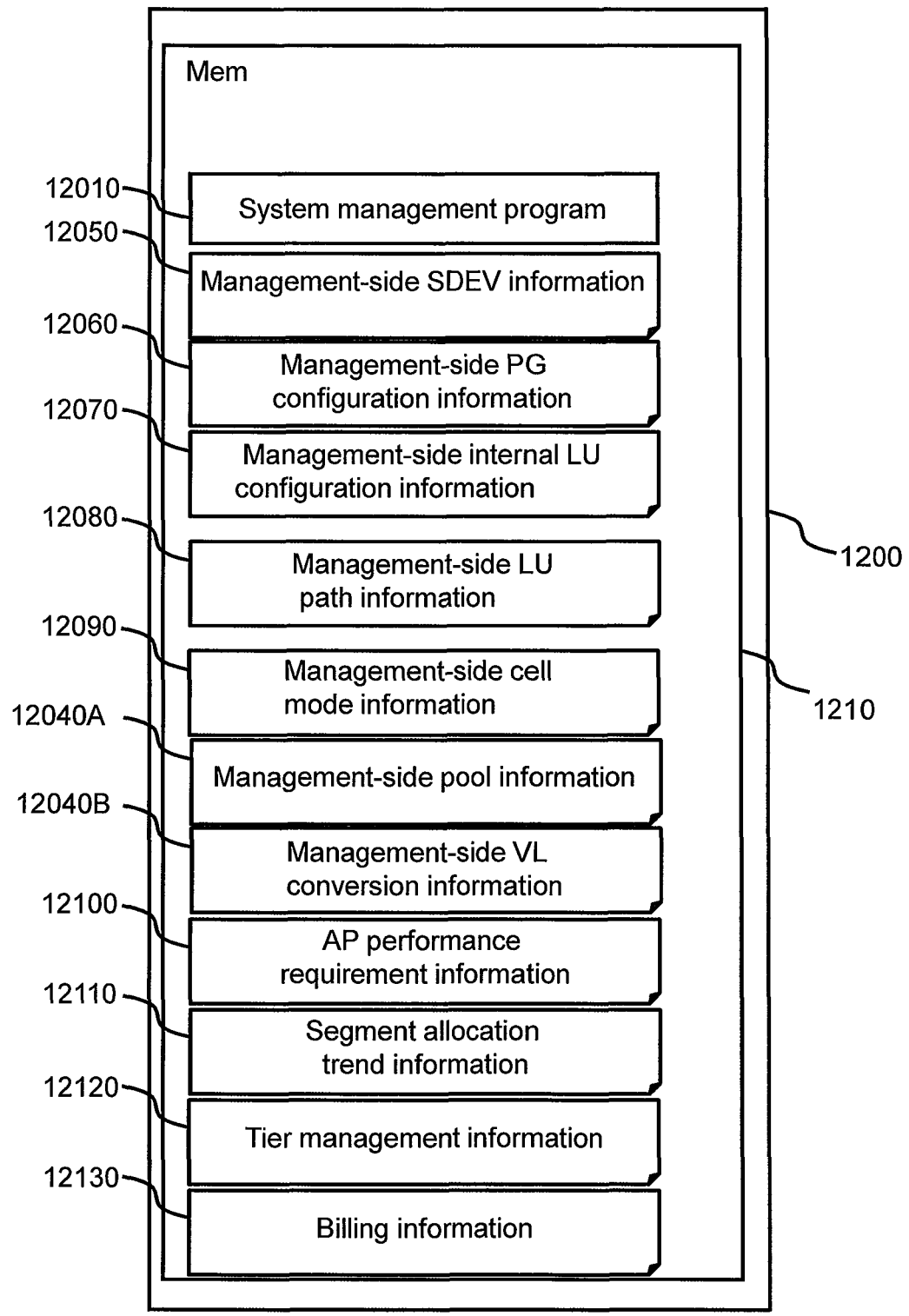
FIG. 45 is a diagram showing an example of the configuration of a management server related to a third example.

FIG. 45 is a diagram showing an example of the configuration of a management server related to the third example. The management server 1200 related to the third example also stores billing information 12130 in the management server related to the first example.

FIG. 54 is a diagram showing an example of the billing information related to the third example.

The billing information 12130 stores information on the user, who is using the storage system 1000, and the capacity capable of being used in accordance with the amount of money the user has paid. The billing information 12130, for example, includes the following information.

(MK 1) A user identifier (MK 2) A usable capacity: In a case where the usable capacity is unlimited, a "–" is entered. A symbol other than the "–" may also be used.

This information is configured in accordance with the amount billed to the user by the storage administrator when the storage system is initially used.

Figure 49:
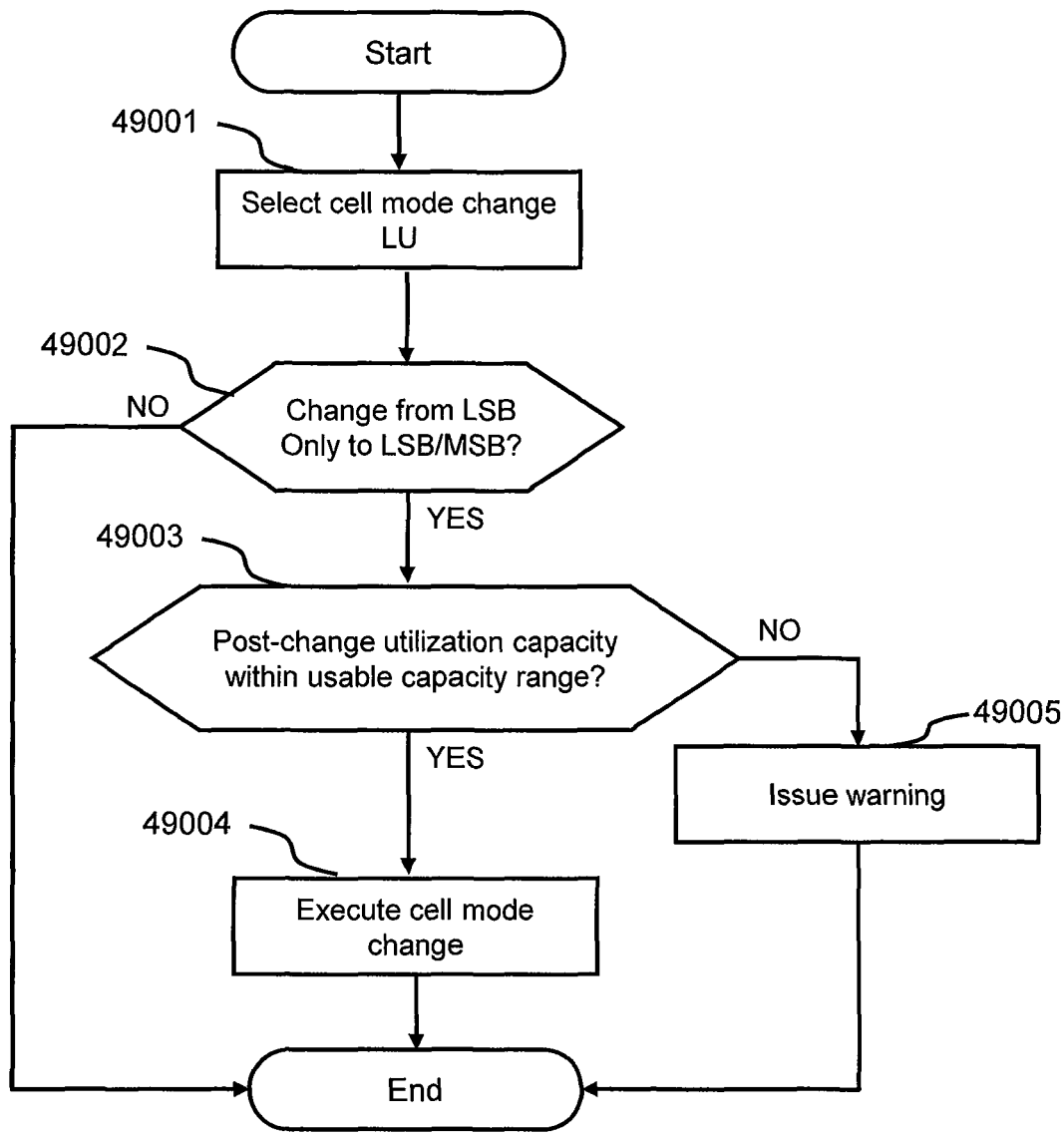
FIG. 49 is a flowchart of an example of a capacity billing check process related to the third example.

FIG. 49 is a flowchart of an example of a capacity billing checking process related to the third example. This drawing shows the processing when changing the cell mode of an internal LU, but the present invention is not particularly limited to this, and the processing shown in this drawing can also be applied to a cell mode change of an arbitrary unit (a virtual internal LU, a storage pool, a tier, a parity group, or an FMD).

The system management program 12010 selects an identifier of a specified LU (LU for which the cell mode is to be changed) and specified-user information (information on the logged in user) (Step 49001).

Next, the system management program 12010 checks whether or not the change is from the LSB Only mode to the LSB/MSB mode (Step 49002). When the result is that the change is not from the LSB Only mode to the LSB/MSB mode (NO in Step 49002), the system management program 12010 ends the processing.

Alternatively, in a case where the change is from the LSB Only mode to the LSB/MSB mode (YES in Step 49002), the system management program 12010 uses the billing information 12130 to check whether or not the post-cell mode change LU capacity falls within the scope of the usable capacity for the user, who issued the cell mode change request (Step 49003).

When the result is that the post-cell mode change capacity is within the scope of the usable capacity (YES in Step 49003), the system management program 12010 executes the cell mode change process (Step 49004) and ends the processing, and, alternatively, when the post-cell mode change capacity is not within the scope of the usable capacity (NO in Step 49003), warns the user that the post-cell mode change capacity exceeds the capacity capable of being used in accordance with the billing information (Step 49005), and ends the processing. The warning may be displayed on a screen using a GUI or a CUI, or may be issued using a sound.

According to the third example, it is possible to realize an appropriate capacity billing check at the time of a cell mode change.

The third example has been explained hereinabove, but this is an example for explaining the present invention, and does not purport to limit the scope of the present invention solely to this example.

Example 4

Figure 66:
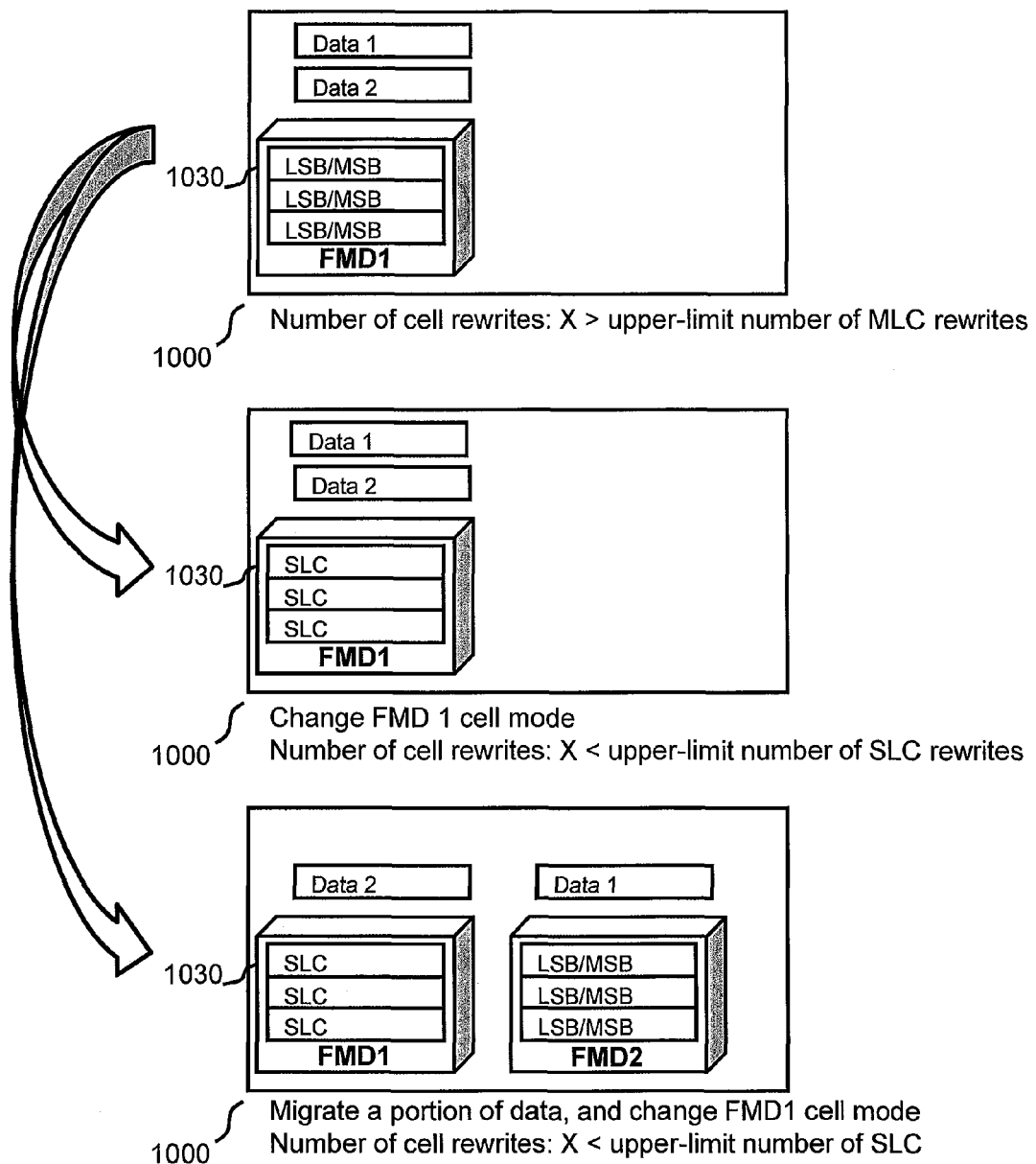
FIG. 66 is a diagram showing a fourth example.

A fourth example will be explained below by referring to FIG. 66.

In the first through the third examples, a storage system and a management server for which a capacity and other characteristics can be changed by changing the cell mode was explained. There are cases in which the initial state of this cell mode is configured to the LSB Only mode or the SLC mode by placing priority on a characteristic other than durability with respect to speed and data loss, but there are also cases in which this initial cell mode state is configured to the LSB/MSB mode by placing priority on the storage capacity. In the case of the LSB/MSB mode, the upper limit for the number of cell rewrites is lower than for the other cell modes, and as such, the free storage areas inside the FMD 1030 disappear faster than in the other cell modes, resulting in a situation in which the FMD 1030 must be blocked. For this reason, as shown in FIG. 66, the cell mode may be changed to the LSB Only mode or the SLC mode by changing the cell mode of the FMD 1030. Since the upper limit for the number of cell rewrites is higher in these modes, it is possible to continue to use a FMD 1030 for which there was concern that this FMD 1030 would continue to be blocked. However, the amount of data capable of being stored in the FMD 1030 decreases in accordance with the cell mode change, and as such, a portion of the data may by migrated to another FMD 1030. When viewed from the aspect of costs, the ability of continue using the FMD 1030 even though the amount of stored data is halved provides better cost performance than not being able to use the FMD 1030 at all because it is blocked.

The management server 1200 user may realize the above processing in accordance with changing the cell mode while referring to a management server 1200 screen display, or the system management program 12010 may carry out the processing. The cell mode change explained in this example may be carried out using a unit other than the FMD 1030, and does not deny the setting up or changing of a cell mode for a different purpose.

A number of examples have been explained hereinabove, but it goes without saying that the present invention is not limited to these examples, and can be changed in a variety of ways without departing from the gist thereof.

For example, in each of the examples described hereinabove, the configuration may be such that either a part or all of the processing executed by the management server 1200 may be executed by the storage controller 1010 of the storage system 1000, a part of the processing executed by the storage controller 1010 of the storage system 1000 may be executed by the FMD controller 2010 of the FMD 1030, and, in accordance with this, the necessary information and program processing may be provided in the execution-side device.

The description above is of a computer system, which comprises a storage system comprising a storage controller and one or more nonvolatile memory devices, and a management system coupled to the storage system, and it was explained that the nonvolatile memory device comprises multiple memory cells, and each memory cell comprises semiconductor characteristics, which make it possible to store N-bits (where N is an integer of equal to or larger than 1) worth of data, and the storage controller: stores storage configuration information showing either a capacity or an address space of the nonvolatile memory device; stores cell mode information showing a cell mode for stipulating the number of bits to be stored in the memory cells; receives a cell mode change request from the management system; and either increases or decreases an amount of data to be stored in the nonvolatile memory device subsequent to the request, by changing the cell mode information in accordance with the request and changing either the capacity or the address space of the storage configuration information.

In this description, an explanation is given in which the memory cell may be a flash memory cell for which a characteristic relating to data stored in the memory cell changes when the number of bits to be stored changes.

In this description, an explanation is given in which the storing of data in a memory cell may be carried out by using cell programming to change a threshold voltage, which is a voltage applied to a control gate when a prescribed amount of electrical current begins to flow between a source gate and a drain gate, in a first cell mode, a range between a minimum value and a maximum value of the threshold voltage may divided into sub-ranges of $2^N$ and all the divided ranges may be used to store N-bits worth of data in one memory cell, and in a second cell mode, a first divided range including the minimum value and a second divided range not including the maximum value, may be used to store one-bit worth of data in one memory cell.

In this description, an explanation is given in which the storing of data in a memory cell may be carried out by using cell programming to change a threshold voltage applied to a control gate when a prescribed amount of electrical current begins to flow between a source gate and a drain gate, in a first cell mode, a range between a minimum value and a maximum value of the threshold voltage may be divided into sub-ranges of $2^N$ and all the divided ranges may be used to store N-bits worth of data in one memory cell, and in a second cell mode, the range may be divided into first and second divided ranges, and the first and second divided ranges may be used to store one-bit worth of data in one memory cell.

In this description, an explanation is given in which the characteristic may be such that either a read or a write time with respect to the nonvolatile memory device becomes longer as the number of bits to be stored is increased, or a period during which data is able to be stored in the nonvolatile memory device becomes shorter as the number of bits to be stored is increased.

In this description, an explanation is given in which in a case where a cell mode is switched from the second cell mode to a second cell mode, the storage controller may carry out mode switching while inhibiting saving of data represented in the first divided range and the second divided range.

In this description, an explanation is given in which the management system may display the cell mode information.

In this description, an explanation is given in which the storage controller may define a parity group using the nonvolatile memory device, and the cell mode may be able to be changed for each parity group.

In this description, an explanation is given in which the storage system may comprise a HDD, and the storage controller: may manage the nonvolatile memory device and the HDD as a storage device; may use the storage device to define a storage pool, and may manage an address space of the storage device by partitioning the address space into multiple segments; may use the storage pool to provide a virtual logical unit to a computer; may manage an address space of a virtual volume by partitioning the address space into multiple chunks, and may either allocate or reallocate the segment to the chunk; and the cell mode may be able to be changed for each of the segments.

In this description, an explanation is given in which, in sending the cell mode change request, the management system: may receive an input of an I/O performance requirement; may identify a segment for which the cell mode is to be changed based on an access measurement value related to the segment and measured by the storage controller, and on the I/O performance requirement; and may either directly or indirectly specify the identified segment and send the cell mode change request.

In this description, an explanation is given in which, in sending the cell mode change request, the management server: may receive an input denoting an I/O coverage ratio, which is a target value of a percentage of a measured value of accesses processed by a segment, which is in a first cell mode; may identify a segment for which the cell mode is to be changed based on an access measurement value related to the segment and measured by the storage controller, and on the I/O coverage ratio; and may either directly or indirectly specify the identified segment and send the cell mode change request.

In this description, an explanation is given in which, in sending the cell mode change request, the management system: may receive an input denoting a ratio of a segment, which is in a first cell mode; may identify a segment for which the cell mode is to be changed based on an access measurement value related to the segment and measured by the storage controller, and on the ratio of the segment; and may either directly or indirectly specify the identified segment and send the cell mode change request.

In this description, an explanation is given in which the management system may display a cell mode corresponding to a component included in the storage system, and the component may be a nonvolatile memory device, a parity group comprising the nonvolatile memory device, an internal logical unit either directly or indirectly comprising the nonvolatile memory device, a storage pool either directly or indirectly comprising the nonvolatile memory device, a tier either directly or indirectly comprising the nonvolatile memory device, or a virtual internal logical unit either directly or indirectly comprising the nonvolatile memory device. This component may exist by being physically included in an apparatus other than these, or may exist by being defined in a storage controller.

In this description, an explanation was given in which the capacity of the component is displayed in association with the capacity of a segment which is included in the component and for which the cell mode is configured for each of one or more cell modes.

From a different perspective, this description is a management system for managing a storage system which comprises multiple memory cells, and it was explained that the management system may comprise one or more storage resources for storing configuration information on the storage system, and a cell mode, which is a value related to the number of bits stored in the memory cells, and one or more processors for converting the cell mode based on the configuration information, and display the converted cell mode.

In this description, an explanation is given regarding a prescribed cell mode from among multiple cell modes, which stores a large number of bits, but suffers from high data loss due to cell degradation, in which the management system may change to a cell mode other than the prescribed cell mode with respect to a memory cell, which exceeds an upper-limit value of number of cell rewrites related to the prescribed cell mode.

In this description, an explanation is given regarding a prescribed cell mode, from among multiple cell modes, which possesses characteristics for a large bit storage capacity and a long read or write time, in which the management system may realize storage tier management of a storage pool by carrying out a mode change with another cell mode.

REFERENCE SIGNS LIST

1000 Storage system
1010 Controller
1020 Cache memory
1030 FMD (flash memory device)
1100 Host
1200 Management server

The invention claimed is:

1. A system comprising:
a plurality of storage devices, each of the plurality of storage devices includes a device controller and a plurality of non-volatile semiconductor memory chips, each of the plurality of non-volatile semiconductor memory chips includes a plurality of memory cells, each of the plurality of memory cells store N bits of data, wherein N is a natural number and a value of N is a variable based on a cell mode, wherein a capacity of the storage device is changed based on the cell mode; and
a controller configured to:
manage a plurality of storage segments which are enabled to store data in a pool provided by the plurality of storage devices,
provide a virtual logical unit and
allocate a storage segment from the pool to the virtual logical unit in response to receiving a write command to the virtual logical unit, and
wherein when the cell mode of at least one of the plurality of storage devices is changed,
wherein the controller changes the number of the plurality of storage segments in the pool based on the capacity of the storage device which is changed based on the cell mode of at least one of the plurality of storage devices, and
the device controller of one of the plurality of storage devices stores N bits of data into one of the plurality of cells based on the cell mode.

2. The system according to claim 1, wherein a capacity of the pool is based on the number of the plurality of storage segments.

3. The system according to claim 1, wherein the cell mode includes a SLC (Single Level Cell) mode and a MLC (Multi Level Cell) mode.

4. The system according to claim 1, wherein the plurality of storage device is controlled as a RAID.

5. A system comprising:
a plurality of storage devices, each of the plurality of storage devices includes a device controller and a plurality of non-volatile semiconductor memory chips, each of the plurality of non-volatile semiconductor memory chips includes a plurality of memory cells, each of the plurality of memory cells store N bits of data, wherein N is a natural number and a value of N is a variable based on a cell mode, wherein a capacity of the storage device is changed based on the cell mode; and
a controller configured to:
manage a plurality of storage segments which are enabled to store data in a pool provided by the plurality of storage devices,
provide a virtual logical unit and
allocate a storage segment from the pool to the virtual logical unit in response to receiving a write command to the virtual logical unit, and
wherein the controller is configured to change the cell mode of at least one of the plurality of storage devices, and
change the number of the plurality of storage segments in the pool based on the capacity of the storage device which is changed based on the cell mode of at least one of the plurality of storage devices, and
wherein the device controller of one of the plurality of storage devices stores N bits of data into one of the plurality of cells according to a request from the storage controller which includes information corresponding to the cell mode.

6. The system according to claim 5, wherein a capacity of the pool is based on the number of the plurality of storage segments.

7. The system according to claim 5, wherein the cell mode includes a SLC (Single Level Cell) mode and a MLC (Multi Level Cell) mode.

8. The system according to claim 5, wherein the plurality of storage device is controlled as a RAID.

9. A system comprising:
a plurality of storage devices, each of the plurality of storage devices includes a device controller and a plurality of non-volatile semiconductor memory chips, each of the plurality of non-volatile semiconductor memory chips includes a plurality of memory cells, each of the plurality of memory cells store N bits of data, wherein N is a natural number and a value of N is variable based on a cell mode, wherein a capacity of the storage device is changed based on the cell mode; and a controller configured to:

manage a plurality of storage segments which are enabled to store data in a pool provided by the plurality of storage devices, provide a virtual logical unit and allocate a storage segment from the pool to the virtual logical unit in response to receiving a write command to the virtual logical unit, and wherein when the cell mode of at least one of the plurality of storage devices is changed, wherein the controller changes the number of the plurality of storage segments in the pool based on the capacity of the storage device which is changed based on the cell mode of at least one of the plurality of storage devices, and wherein N bits of data is stored into one of the plurality of cells based on the cell mode.

10. The system according to claim 9, wherein a capacity of the pool is based on the number of the plurality of storage segments.

11. The system according to claim 9, wherein the cell mode includes a SLC (Single Level Cell) mode and a MLC (Multi Level Cell) mode.

12. The system according to claim 9, wherein the plurality of storage device is controlled as a RAID.

13. A system comprising:

a plurality of storage devices, each of the plurality of storage devices includes a plurality of non-volatile semiconductor memory chips, each of the plurality of non-volatile semiconductor memory chips includes a plurality of memory cells, each of the plurality of memory cells store N bits of data, wherein N is a natural number and a value of N is variable based on a cell mode, wherein a capacity of the storage device is changed based on the cell mode; and a controller configured to:

manage a plurality of storage segments which are enable to store data in a pool provided by the plurality of storage devices, provide a virtual logical unit and allocate a storage segment of the plurality of storage segments from the pool to the virtual logical unit in response to receiving a write command to the virtual logical unit, and wherein the controller is configured to change the cell mode of at least one of the plurality of storage devices and change the number of the plurality of storage segments in the pool based on the capacity of the storage device which is changed based on the cell mode of at least one of the plurality of storage devices, and wherein N bits of data is stored into one of the plurality of cells according to a request from the storage controller in one of the plurality of storage devices.

14. The system according to claim 13, wherein a capacity of the pool is based on the number of the plurality of storage segments.

15. The system according to claim 13, wherein the cell mode includes a SLC (Single Level Cell) mode and a MLC (Multi Level Cell) mode.

16. The system according to claim 13, wherein the plurality of storage device is controlled as a RAID.

* * * * *